US012702976B2

(12) United States Patent
Fisher et al.

(10) Patent No.: US 12,702,976 B2
(45) Date of Patent: Aug. 11, 2026

(54) FLOW CELLS AND METHODS FOR MAKING THE SAME

(71) Applicant: ILLUMINA, INC., San Diego, CA (US)

(72) Inventors: Jeffrey S. Fisher, San Diego, CA (US); Anthony Flannery, San Diego, CA (US); Sahngki Hong, San Diego, CA (US); Brinda Kodira Cariappa, San Diego, CA (US); Lewis J. Kraft, San Diego, CA (US); Brian D. Mather, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 1111 days.

(21) Appl. No.: 17/739,976

(22) Filed: May 9, 2022

(65) Prior Publication Data

US 2023/0137978 A1 May 4, 2023

Related U.S. Application Data

(60) Provisional application No. 63/272,928, filed on Oct. 28, 2021.

(51) Int. Cl.

*G03F 7/038* (2006.01)
*B01L 3/00* (2006.01)
(Continued)

(52) U.S. Cl.

CPC ...... *B01L 3/502707* (2013.01); *G03F 7/0002* (2013.01); *G03F 7/038* (2013.01); *G03F 7/039* (2013.01); *B01L 2200/12* (2013.01)

(58) Field of Classification Search

CPC ........... B01L 3/502707; B01L 2200/12; G03F 7/0002; G03F 7/038; G03F 7/039

See application file for complete search history.

(56) References Cited

U.S. PATENT DOCUMENTS 5,594,098 A * 1/1997 Rahman .................. C08G 8/08 528/142
8,501,406 B1 8/2013 Gray et al.
(Continued)

FOREIGN PATENT DOCUMENTS

WO 2017201198 A1 11/2017
WO WO-2020005503 A1 * 1/2020 .......... G03F 7/0002
(Continued)

*Primary Examiner* — Mark F. Huff
*Assistant Examiner* — Christine Curiac
(74) *Attorney, Agent, or Firm* — Dierker & Kavanaugh, P.C.

(57) ABSTRACT

A metal film is formed over a resin layer including a plurality of multi-depth depressions (MDP) separated by interstitial regions, each MDP including a deep portion and an adjacent shallow portion. A sacrificial layer is formed over the metal film. The sacrificial layer and metal film are sequentially dry etched to expose a resin layer surface at the shallow portion and interstitial regions. Resin layer portions are removed i) at the shallow portion to form a depression region having a surface directly adjacent to a surface at the deep portion and ii) at the interstitial regions to form new interstitial regions surrounding the deep portion and the depression region. First functionalized layer is deposited over the metal film, depression region, and new interstitial regions. The metal film is removed from the deep portion. Second functionalized layer is deposited over the surface at the deep portion. New interstitial regions are polished.

9 Claims, 23 Drawing Sheets

Specification includes a Sequence Listing.

(51) Int. Cl.
*G03F 7/00* (2006.01)
*G03F 7/039* (2006.01)

(56) References Cited

U.S. PATENT DOCUMENTS

| | | | | |
|---|---|---|---|---|
| 9,982,294 | B2 | 5/2018 | Fabani et al. | |
| 10,329,610 | B2 | 6/2019 | Nashtaali et al. | |
| 2015/0111256 | A1 | 4/2015 | Church et al. | |
| 2018/0371535 | A1 | 12/2018 | Park et al. | |
| 2023/0139821 | A1* | 5/2023 | Fisher | G03F 7/039 430/323 |

FOREIGN PATENT DOCUMENTS

| | | | |
|---|---|---|---|
| WO | 2021127357 | A2 | 6/2021 |
| WO | 2022072274 | A1 | 4/2022 |
| WO | 2022072275 | A1 | 4/2022 |

* cited by examiner 10
12
14, 14'
14 or 14'
16, 16'
17, 17'
17
18, 18'
18
20
20'
21
22
24
26
27
27'
28
29, I
29, E1
29, E2
29'
30
32
34, 36
38, 40
48'
50'
64'
66'

22
62
48
50
$T_1$
$T_2$
$T_3$
14', 18'
60"
60'
51, 60
66
62'
24
56'
51, 56
51', 56'
51", 56"
56', 51'
29, P
29, I
64

22
24
26
29, E1
29, E2
29, I
24, 25'
52', 53'
14, 14', 18, 18'
51, 56', 60'
48'
50'
52'
64'
66'

FLOW CELLS AND METHODS FOR MAKING THE SAME

CROSS REFERENCE TO RELATED APPLICATION

This application claims the benefit of U.S. Provisional Application Ser. No. 63/272,928, filed Oct. 28, 2021, the contents of which is incorporated by reference herein in its entirety.

REFERENCE TO SEQUENCE LISTING

The Sequence Listing submitted herewith via EFS-Web is hereby incorporated by reference in its entirety. The name of the file is ILI225B_IP-2182-US2_Sequence_Listing_ST25.txt, the size of the file is 3,381 bytes, and the date of creation of the file is May 3, 2022.

BACKGROUND

Some available platforms for sequencing nucleic acids utilize a sequencing-by-synthesis approach. With this approach, a nascent strand is synthesized, and the addition of each monomer (e.g., nucleotide) to the growing strand is detected optically and/or electronically. Because a template strand directs synthesis of the nascent strand, one can infer the sequence of the template DNA from the series of nucleotide monomers that were added to the growing strand during the synthesis. In some examples, sequential paired-end sequencing may be used, where forward strands are sequenced and removed, and then reverse strands are constructed and sequenced. In other examples, simultaneous paired-end sequencing may be used, where forward strands and reverse strands are sequenced at the same time.

SUMMARY

For simultaneous paired-end sequencing, different primer sets are attached to different regions within each depression and/or on each protrusion of a flow cell surface. These primer sets are attached through polymeric hydrogel(s). Several example methods are described herein to place the primers sets in the desired regions such that, during optical imaging, the signals from one region do not deleteriously affect the signals from another region. In particular, the methods reduce or eliminate the occurrence of one region and primer set surrounding another region and primer set in a padlock like conformation or configuration. It has been found that by reducing the padlock like conformation, signal resolution from each of the regions is improved.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 7A through FIG. 7D and FIG. 7G are schematic views that together with FIG. 4A through FIG. 4D depict an example of a method to generate a flow cell surface;

FIG. 7A through FIG. 7D and FIG. 7H through FIG. 7L are schematic views that together with FIG. 4A through FIG. 4D depict an example of a method to generate a flow cell surface;

FIG. 12A through FIG. 12G are schematic views that together with FIG. 10A through FIG. 10D depict an example of a method to generate a flow cell surface;

FIG. 12A through FIG. 12D and FIG. 12H through FIG. 12J are schematic views that together with FIG. 10A through FIG. 10D depict an example of a method to generate a flow cell surface;

DETAILED DESCRIPTION

Examples of the flow cells disclosed herein may be used for sequencing, examples of which include simultaneous paired-end nucleic acid sequencing.

For simultaneous paired-end sequencing, different primer sets are attached to different regions within each depression and/or on each protrusion of the flow cell. In these examples, the primer sets may be controlled so that the cleaving (linearization) chemistry is orthogonal in the different regions. In these examples, orthogonal cleaving chemistry may be realized through identical cleavage sites that are attached to different primers in the different sets, or through different cleavage sites that are attached to different primers in the different sets. This enables a cluster of forward strands to be generated in one region and a cluster of reverse strands to be generated in another region. In an example, the regions are directly adjacent to one another. In another example, any space between the regions is small enough that clustering can span the two regions. In any of these examples, the forward and reverse strands are spatially separate, which separates the fluorescence signals from both reads while allowing for simultaneous base calling of each read.

Figure 1A:
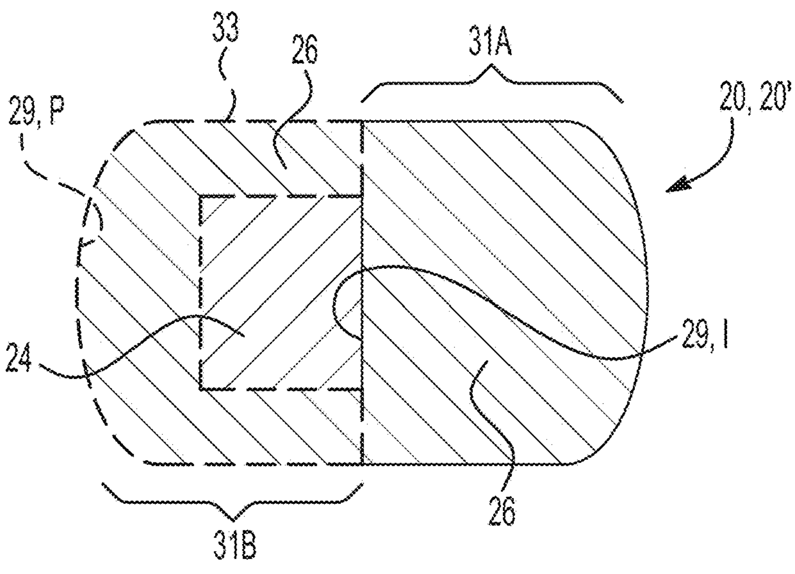
FIG. 1A shows a top view of an example depression with a padlock conformation.
Figure 1B:
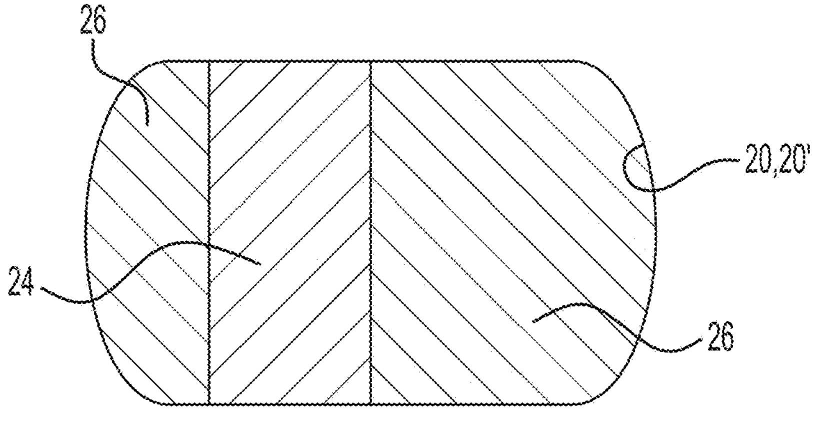
FIG. 1B and FIG. 1C show top views of example depressions without a padlock like conformation.
Figure 1C:
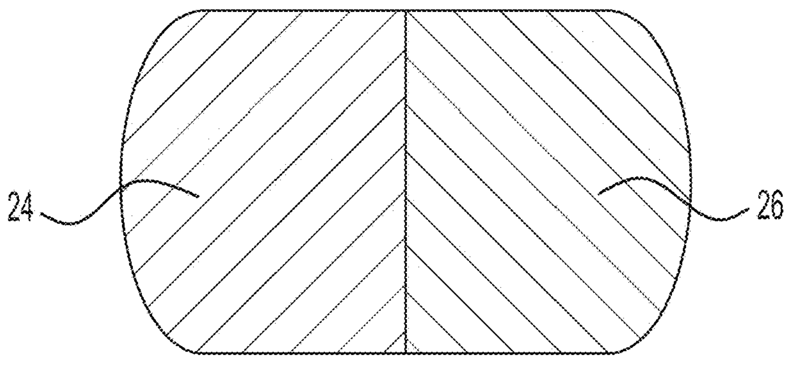

It has been found that some methods used to produce the spatially separate regions where the primer sets (and ultimately the forward and reverse strands) are attached generate a padlock like conformation where, from a top view, one region is surrounded by the other region within the depression. An example of this padlock like conformation is shown in FIG. 1A, which depicts the top view of one depression 20, 20'. As shown in FIG. 1A, the depression 20, 20' of the flow cell includes adjacent functionalized layers 24, 26, which define the regions where the different primer sets (not shown) are respectively attached. In this example, the functionalized layer 26 is formed in part 31A of the depression 20, 20', and it is desirable for the other functionalized layer 24 to be formed in the adjacent part 31B of the depression 20, 20'. However, as a result of the method used, the functionalized layer 26 is applied along sidewall(s) 29 of the depression 20, 20' in the adjacent part 31B. In the depression 20 (having a single depth), the sidewall 29 is a perimeter P of the depression 20. In the multi-depth depression 20', the sidewalls 29 include the perimeter P and an internal wall I that separates the multiple depths (reference numerals 48 and 50, see, e.g., FIG. 2C and FIG. 4A). In either depression 20, 20', the functionalized layer 26 may align the perimeter 29, P, and surround the functionalized layer 24, generating the padlock like conformation 33. Additionally, in the multi-depth depression 20', the functionalized layer 26 may also align portions of the internal wall 29, I. Forward or reverse strands will form during amplification on the functionalized layer 26 in the padlock like conformation 33, and during sequencing, the signals from these strands may contaminate the signals from the strands formed on the functionalized layer 24. In some of the examples disclosed herein, the methods reduce the padlock like conformation 33 (e.g., as shown in FIG. 1B) because at least a portion of the functionalized layer 26 that is present in the part 31B of the depression 20, 20' is reduced. In other examples disclosed herein, the methods eliminate the padlock like conformation 33 (e.g., as shown in FIG. 1C) because the functionalized layer 26 is no longer present in the part 31B of the depression 20, 20'.

Definitions

It is to be understood that terms used herein will take on their ordinary meaning in the relevant art unless specified otherwise. Several terms used herein and their meanings are set forth below.

The singular forms "a", "an", and "the" include plural referents unless the context clearly dictates otherwise.

The terms comprising, including, containing and various forms of these terms are synonymous with each other and are meant to be equally broad.

The terms top, bottom, lower, upper, on, etc. are used herein to describe the flow cell and/or the various components of the flow cell. It is to be understood that these directional terms are not meant to imply a specific orientation, but are used to designate relative orientation between components. The use of directional terms should not be interpreted to limit the examples disclosed herein to any specific orientation(s).

The terms first, second, etc. also are not meant to imply a specific orientation or order, but rather are used to distinguish one component from another.

It is to be understood that the ranges provided herein include the stated range and any value or sub-range within the stated range, as if such values or sub-ranges were explicitly recited. For example, a range of about 400 nm to about 1 μm (1000 nm), should be interpreted to include not only the explicitly recited limits of about 400 nm to about 1 μm, but also to include individual values, such as about 708 nm, about 945.5 nm, etc., and sub-ranges, such as from about 425 nm to about 825 nm, from about 550 nm to about 940 nm, etc. Furthermore, when "about" and/or "substantially" are/is utilized to describe a value, they are meant to encompass minor variations (up to +/−10%) from the stated value.

An "acrylamide monomer" is a monomer with the structure

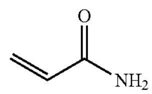

or a monomer including an acrylamide group. Examples of the monomer including an acrylamide group include azido acetamido pentyl acrylamide:

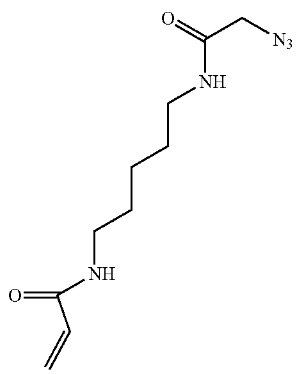 [SMILES: C=CC(=O)NCCCCCNC(=O)CN=[N+]=[N-]]

and N-isopropylacrylamide:

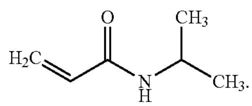

Other acrylamide monomers may be used.

The term "activation," as used herein, refers to a process that generates reactive groups at the surface of a base support or an outermost layer of a multi-layered structure. Activation may be accomplished using silanization or plasma ashing. While the figures do not depict a separate silanized layer or hydroxyl (—OH groups) from plasma ashing, it is to be understood that activation generates a silanized layer or —OH groups at the surface of the activated support or layer to covalently attach the functionalized layers to the underlying support or layer.

An aldehyde, as used herein, is an organic compound containing a functional group with the structure —CHO, which includes a carbonyl center (i.e., a carbon double-bonded to oxygen) with the carbon atom also bonded to hydrogen and an R group, such as an alkyl or other side chain. The general structure of an aldehyde is:

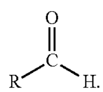

As used herein, "alkyl" refers to a straight or branched hydrocarbon chain that is fully saturated (i.e., contains no double or triple bonds). The alkyl group may have 1 to 20 carbon atoms. Example alkyl groups include methyl, ethyl, propyl, isopropyl, butyl, isobutyl, tertiary butyl, pentyl, hexyl, and the like. As an example, the designation "C1-4 alkyl" indicates that there are one to four carbon atoms in the alkyl chain, i.e., the alkyl chain is selected from the group consisting of methyl, ethyl, propyl, iso-propyl, n-butyl, isobutyl, sec-butyl, and t-butyl.

As used herein, "alkenyl" refers to a straight or branched hydrocarbon chain containing one or more double bonds. The alkenyl group may have 2 to 20 carbon atoms. Example alkenyl groups include ethenyl, propenyl, butenyl, pentenyl, hexenyl, and the like.

As used herein, "alkyne" or "alkynyl" refers to a straight or branched hydrocarbon chain containing one or more triple bonds. The alkynyl group may have 2 to 20 carbon atoms.

As used herein, "aryl" refers to an aromatic ring or ring system (i.e., two or more fused rings that share two adjacent carbon atoms) containing only carbon in the ring backbone. When the aryl is a ring system, every ring in the system is aromatic. The aryl group may have 6 to 18 carbon atoms. Examples of aryl groups include phenyl, naphthyl, azulenyl, and anthracenyl.

An "amine" or "amino" functional group refers to an $—NR_aR_b$ group, where $R_a$ and $R_b$ are each independently selected from hydrogen (e.g.,

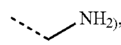

C1-6 (or C1-C6) alkyl, C2-6 alkenyl, C2-6 alkynyl, C3-7 carbocycle, C6-10 aryl, 5-10 membered heteroaryl, and 5-10 membered heterocyclyl, as defined herein.

As used herein, the term "attached" refers to the state of two things being joined, fastened, adhered, connected or bound to each other, either directly or indirectly. For example, a nucleic acid can be attached to a functionalized polymer by a covalent or non-covalent bond. A covalent bond is characterized by the sharing of pairs of electrons between atoms. A non-covalent bond is a physical bond that does not involve the sharing of pairs of electrons and can include, for example, hydrogen bonds, ionic bonds, van der Waals forces, hydrophilic interactions and hydrophobic interactions.

An "azide" or "azido" functional group refers to $—N_3$.

As used herein, a "bonding region" refers to an area of a patterned structure that is to be bonded to another material, which may be, as examples, a spacer layer, a lid, another patterned structure, etc., or combinations thereof (e.g., a spacer layer and a lid, or a spacer layer and another patterned structure). The bond that is formed at the bonding region may be a chemical bond (as described herein), or a mechanical bond (e.g., using a fastener, etc.).

As used herein, "carbocycle" means a non-aromatic cyclic ring or ring system containing only carbon atoms in the ring system backbone. When the carbocycle is a ring system, two or more rings may be joined together in a fused, bridged or spiro-connected fashion. Carbocycles may have any degree of saturation, provided that at least one ring in a ring system is not aromatic. Thus, carbocycles include cycloalkyls, cycloalkenyls, and cycloalkynyls. The carbocycle group may have 3 to 20 carbon atoms. Examples of carbocycle rings include cyclopropyl, cyclobutyl, cyclopentyl, cyclohexyl, cyclohexenyl, 2,3-dihydro-indene, bicyclo [2.2.2]octanyl, adamantyl, and spiro[4.4]nonanyl.

As used herein, the term "carboxylic acid" or "carboxyl" as used herein refers to —COOH.

As used herein, "cycloalkylene" means a fully saturated carbocycle ring or ring system that is attached to the rest of the molecule via two points of attachment.

As used herein, "cycloalkenyl" or "cycloalkene" means a carbocycle ring or ring system having at least one double bond, wherein no ring in the ring system is aromatic. Examples include cyclohexenyl or cyclohexene and norbornenyl or norbornene. Also as used herein, "heterocycloalkenyl" or "heterocycloalkene" means a carbocycle ring or ring system with at least one heteroatom in ring backbone, having at least one double bond, wherein no ring in the ring system is aromatic.

As used herein, "cycloalkynyl" or "cycloalkyne" means a carbocycle ring or ring system having at least one triple bond, wherein no ring in the ring system is aromatic. An example is cyclooctyne. Another example is bicyclononyne. Also as used herein, "heterocycloalkynyl" or "heterocycloalkyne" means a carbocycle ring or ring system with at least one heteroatom in ring backbone, having at least one triple bond, wherein no ring in the ring system is aromatic.

As used herein, the terms "deep portion" and "shallow portion" refer to three-dimensional (3D) spaces within a multi-depth depression or the multi-depth trench. In the multi-depth depression or trench, the deep portion has a greater depth than the shallow portion, as measured, e.g., from an opening of the multi-depth depression or trench. In some examples of the method disclosed herein, the material that defines the multi-depth depression is processed, and the configurations of the deep and/or shallow portions may change as a result of this processing. In these instances, the terms deep portion and shallow portion may be used to orient the areas of the original multi-depth depression that are being processed, but may no longer be the respective three-dimensional (3D) spaces within the multi-depth depression. As one example, a resin layer that defines a multi-depth depression may be etched to create a multi-step protrusion having surfaces at different heights that correspond with the location, respectively, of the original shallow and deep portions.

The term "depositing," as used herein, refers to any suitable application technique, which may be manual or automated, and, in some instances, results in modification of the surface properties. Generally, depositing may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, flow through coating, aerosol printing, screen printing, microcontact printing, inkjet printing, or the like.

As used herein, the term "depression" refers to a discrete concave feature in a base support or a layer of a multi-layer stack having a surface opening that is at least partially surrounded by interstitial region(s) of the base support or a layer of a multi-layer stack. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc. As examples, the depression can be a well or two interconnected wells. The depression may also have more complex architectures, such as ridges, step features, etc. An example of a depression having a step feature is referred to herein as a multi-depth depression, where the step feature defines the shallow portion.

The term "each," when used in reference to a collection of items, is intended to identify an individual item in the collection, but does not necessarily refer to every item in the collection. Exceptions can occur if explicit disclosure or context clearly dictates otherwise.

The term "epoxy" (also referred to as a glycidyl or oxirane group) as used herein refers to

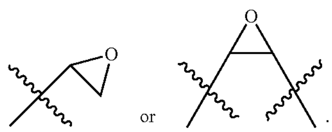

or

.

As used herein, the term "flow cell" is intended to mean a vessel having a flow channel where a reaction can be carried out, an inlet for delivering reagent(s) to the flow channel, and an outlet for removing reagent(s) from the flow channel. In some examples, the flow cell accommodates the detection of the reaction that occurs in the flow cell. For example, the flow cell can include one or more transparent surfaces allowing for the optical detection of arrays, optically labeled molecules, or the like.

As used herein, a "flow channel" or "channel" may be an area defined between two bonded components, which can selectively receive a liquid sample. In some examples, the flow channel may be defined between two patterned structures, and thus may be in fluid communication with surface chemistry of the patterned structures. In other examples, the flow channel may be defined between a patterned structure and a lid, and thus may be in fluid communication with surface chemistry of the patterned structures.

As used herein, a "functionalized layer" refers to a gel material that is applied over at least a portion of a flow cell substrate. The gel material includes functional group(s) that can attach to primer(s). The functionalized layer may be positioned within a portion of a depression defined in the substrate. The functionalized layer may alternatively be positioned on a portion of a protrusion defined in the substrate. The term "functionalized layer" also refers to the gel material that is applied over all or a portion of the substrate, and that is exposed to further processing to define the functionalized layer in the portion of the depression, or the functionalized layer protrusion on the substantially flat substrate surface.

As used herein, "heteroaryl" refers to an aromatic ring or ring system (i.e., two or more fused rings that share two adjacent atoms) that contain(s) one or more heteroatoms, that is, an element other than carbon, including but not limited to, nitrogen, oxygen and sulfur, in the ring backbone. When the heteroaryl is a ring system, every ring in the system is aromatic. The heteroaryl group may have 5-18 ring members.

As used herein, "heterocycle" means a non-aromatic cyclic ring or ring system containing at least one heteroatom in the ring backbone. Heterocycles may be joined together in a fused, bridged or spiro-connected fashion. Heterocycles may have any degree of saturation provided that at least one ring in the ring system is not aromatic. In the ring system, the heteroatom(s) may be present in either a non-aromatic or aromatic ring. The heterocycle group may have 3 to 20 ring members (i.e., the number of atoms making up the ring backbone, including carbon atoms and heteroatoms). In some examples, the heteroatom(s) are O, N, or S.

The term "hydrazine" or "hydrazinyl" as used herein refers to a $—NHNH_2$ group.

As used herein, the term "hydrazone" or "hydrazonyl" as used herein refers to

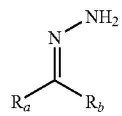

a group in which $R_a$ and $R_b$ are each independently selected from hydrogen, C1-6 alkyl, C2-6 alkenyl, C2-6 alkynyl, C3-7 carbocycle, C6-10 aryl, 5-10 membered heteroaryl, and 5-10 membered heterocycle, as defined herein.

As used herein, "hydroxy" or "hydroxyl" refers to an —OH group.

As used herein, the term "interstitial region" refers to an area, e.g., of a base support or a layer of a multi-layer stack that separates depressions (concave regions). For example, an interstitial region can separate one depression of an array from another depression of the array. The two depressions that are separated from each other can be discrete, i.e., lacking physical contact with each other. In many examples, the interstitial region is continuous, whereas the depressions are discrete, for example, as is the case for a plurality of depressions defined in an otherwise continuous surface. In other examples, the interstitial regions and the features are discrete, for example, as is the case for a plurality of depressions in the shape of trenches, which are separated by respective interstitial regions. The separation provided by an interstitial region can be partial or full separation. Interstitial regions may have a surface material that differs from the surface material of the depressions. For example, depressions can have a polymer and primer set(s) therein, and the interstitial regions can be free of polymer and primer set(s).

As used herein, a "negative photoresist" refers to a light sensitive material in which a portion that is exposed to light of particular wavelength(s) becomes insoluble to a developer. In these examples, the insoluble negative photoresist has less than 5% solubility in the developer. With the negative photoresist, the light exposure changes the chemical structure so that the exposed portions of the material becomes less soluble (than non-exposed portions) in the developer. While not soluble in the developer, the insoluble negative photoresist may be at least 99% soluble in a remover that is different from the developer. The remover may be a solvent or solvent mixture used, e.g., in a lift-off process.

In contrast to the insoluble negative photoresist, any portion of the negative photoresist that is not exposed to light is at least 95% soluble in the developer. This portion may be referred to as a "soluble negative photoresist". In some examples, the soluble negative photoresist is at least 98%, e.g., 99%, 99.5%, 100%, soluble in the developer.

"Nitrile oxide," as used herein, means a "$R_aC{\equiv}N^+O^-$" group in which $R_a$ is defined herein. Examples of preparing nitrile oxide include in situ generation from aldoximes by treatment with chloramide-T or through action of base on imidoyl chlorides [RC(Cl)═NOH] or from the reaction between hydroxylamine and an aldehyde.

"Nitrone," as used herein, means a

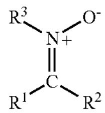

group in which $R^1$, $R^2$, and $R^3$ may be any of the $R_a$ and $R_b$ groups defined herein, except that $R^3$ is not hydrogen (H).

As used herein, a "nucleotide" includes a nitrogen containing heterocyclic base, a sugar, and one or more phosphate groups. Nucleotides are monomeric units of a nucleic acid sequence. In RNA, the sugar is a ribose, and in DNA, the sugar is a deoxyribose, i.e. a sugar lacking a hydroxyl group that is present at the 2' position in ribose. The nitrogen containing heterocyclic base (i.e., nucleobase) can be a purine base or a pyrimidine base. Purine bases include adenine (A) and guanine (G), and modified derivatives or analogs thereof. Pyrimidine bases include cytosine (C), thymine (T), and uracil (U), and modified derivatives or analogs thereof. The C-1 atom of deoxyribose is bonded to N-1 of a pyrimidine or N-9 of a purine. A nucleic acid analog may have any of the phosphate backbone, the sugar, or the nucleobase altered. Examples of nucleic acid analogs include, for example, universal bases or phosphate-sugar backbone analogs, such as peptide nucleic acid (PNA).

Figures 2A, 2B, 2C, 2D, 2E:
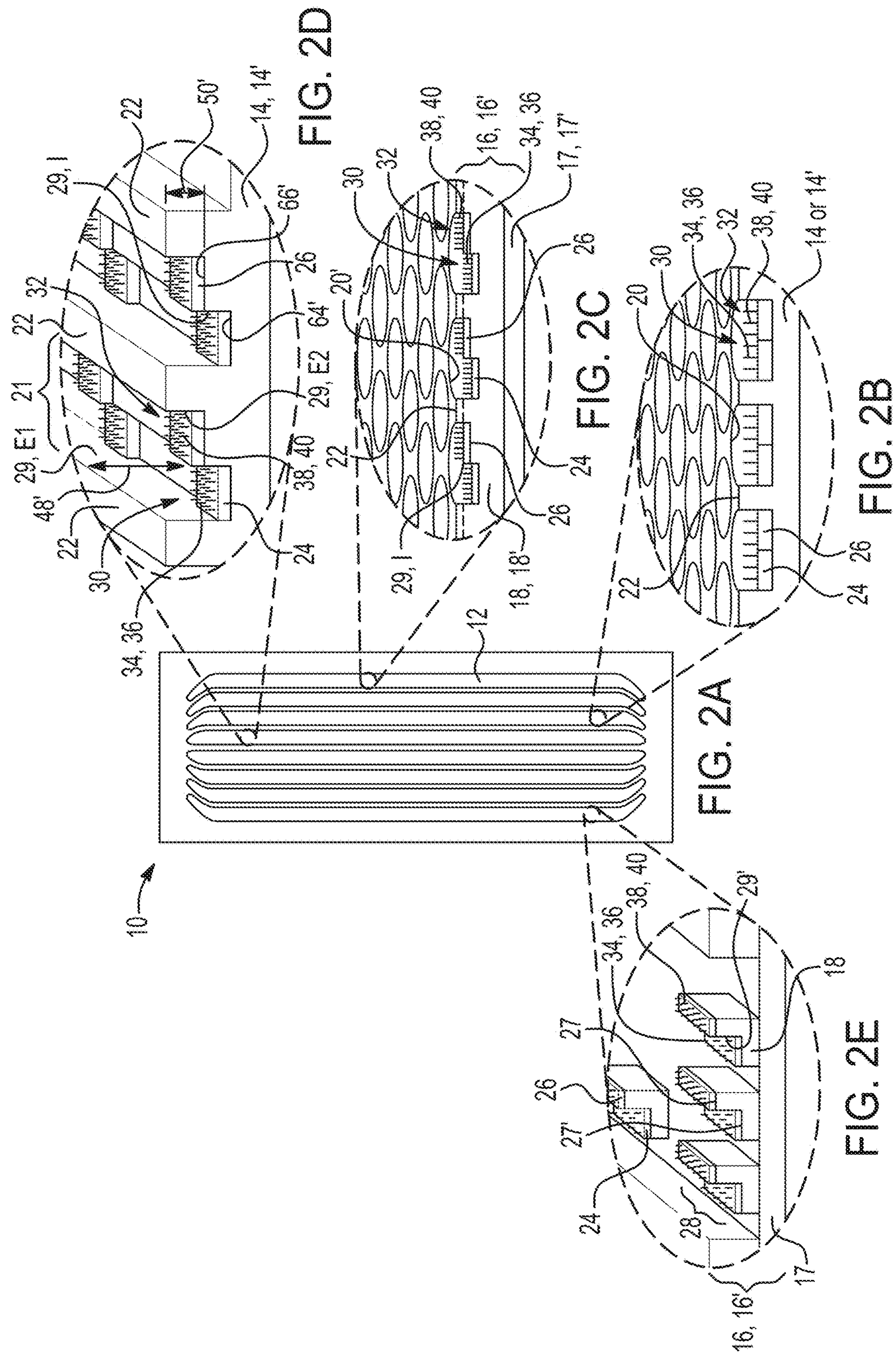
FIG. 2A is a top view of an example flow cell.
FIG. 2B through FIG. 2E are enlarged, and partially cutaway views of different examples of a flow channel of the flow cell.

In some examples, the term "over" may mean that one component or material is positioned directly on another component or material. When one is directly on another, the two are in contact with each other. In FIG. 2C, the resin layer 18, 18' may be applied over the base support 17, 17' so that it is directly on and in contact with the base support 17, 17'.

In other examples, the term "over" may mean that one component or material is positioned indirectly on another component or material. By indirectly on, it is meant that a gap or an additional component or material may be positioned between the two components or materials. In FIG. 2E, the functionalized layers 24, 26 are positioned over the base support 17, 17' such that the two are in indirect contact. The resin layer 18, 18' is positioned therebetween.

A "patterned structure" refers to a single layer base support that includes, or a multi-layer stack with a layer that includes surface chemistry in a pattern, e.g., in depressions or otherwise positioned on the support or layer surface. The surface chemistry may include a functionalized layer and primers (e.g., used for library template capture and amplification). In some examples, the single layer base support or the layer of the multi-layer stack has been exposed to patterning techniques (e.g., etching, lithography, etc.) in order to generate the pattern for the surface chemistry. However, the term "patterned structure" is not intended to imply that such patterning techniques have to be used to generate the pattern. The patterned structure may be generated via any of the methods disclosed herein.

As used herein, the term "polyhedral oligomeric silsesquioxane" refers to a chemical composition that is a hybrid intermediate (e.g., $RSiO_{1.5}$) between that of silica ($SiO_2$) and silicone ($R_2SiO$). An example of polyhedral oligomeric silsesquioxane may be that described in Kehagias et al., Microelectronic Engineering 86 (2009), pp. 776-778, which is incorporated by reference in its entirety. In an example, the composition is an organosilicon compound with the chemical formula $[RSiO_{3/2}]_n$, where the R groups can be the same or different. Example R groups for polyhedral oligomeric silsesquioxane include epoxy, azide/azido, a thiol, a poly(ethylene glycol), a norbornene, a tetrazine, acrylates, and/or methacrylates, or further, for example, alkyl, aryl, alkoxy, and/or haloalkyl groups.

As used herein, a "positive photoresist" refers to a light sensitive material in which a portion that is exposed to light of particular wavelength(s) becomes soluble to a developer. In these examples, any portion of the positive photoresist exposed to light is at least 95% soluble in the developer. This portion may be referred to herein as a "soluble positive photoresist". In some examples, the portion of the positive photoresist exposed to light (i.e., the soluble photoresist), is at least 98%, e.g., 99%, 99.5%, 100%, soluble in the developer. With the positive photoresist, the light exposure changes the chemical structure so that the exposed portions of the material become more soluble (than non-exposed portions) in the developer.

In contrast to the soluble positive photoresist, any portion of the positive photoresist not exposed to light is insoluble (less than 5% soluble) in the developer. This portion may be referred to as an "insoluble positive photoresist". While not soluble in the developer, the insoluble positive photoresist may be at least 99% soluble in a remover that is different from the developer. In some examples, the insoluble positive photoresist is at least 98%, e.g., 99%, 99.5%, 100%, soluble in the remover. The remover may be a solvent or solvent mixture used in a lift-off process.

As used herein, the "primer" is defined as a single stranded nucleic acid sequence (e.g., single strand DNA). Some primers, referred to herein as amplification primers, serve as a starting point for template amplification and cluster generation. Other primers, referred to herein as sequencing primers, serve as a starting point for DNA synthesis. The 5' terminus of the primer may be modified to allow a coupling reaction with a functional group of a polymer. The primer length can be any number of bases long and can include a variety of non-natural nucleotides. In an example, the sequencing primer is a short strand, ranging from 10 to 60 bases, or from 20 to 40 bases.

A "spacer layer," as used herein refers to a material that bonds two components together. In some examples, the spacer layer can be a radiation absorbing material that aids in bonding, or can be put into contact with a radiation absorbing material that aids in bonding.

The term "substrate" refers to the single layer base support or a multi-layer structure upon which surface chemistry is introduced. In the examples of the method that utilize a metal film for patterning, the single layer base support or the layers of the multi-layer structure are capable of transmitting ultraviolet light that is used to pattern a photoresist and that is used in nucleic acid sequencing. In the examples of the method that utilize varying thicknesses of a resin layer for patterning, the resin layer (which may be a single layer base support or one layer of the multi-layer structure) is capable of transmitting ultraviolet light at thinner portions and absorbing ultraviolet light at thicker portions. When the resin layer is used in a multi-layer structure, the other layer(s) of the multi-layer structure are capable of transmitting the ultraviolet light that is used to pattern the photoresist and that is used in nucleic acid sequencing.

The term "tantalum pentoxide" refers to the inorganic compound with the formula $Ta_2O_5$. This compound is transparent, having a transmittance ranging from about 0.25 (25%) to 1 (100%), to wavelengths ranging from about 0.35 μm (350 nm) to at least 1.8 μm (1800 nm). A "tantalum pentoxide base support" or "tantalum pentoxide layer" may comprise, consist essentially of, or consist of $Ta_2O_5$. In examples where it is desirable for the tantalum pentoxide base support or the tantalum pentoxide layer to transmit electromagnetic energy having any of these wavelengths, the base support or layer may consist of $Ta_2O_5$ or may comprise or consist essentially of $Ta_2O_5$ and other components that will not interfere with the desired transmittance of the base support or layer.

A "thiol" functional group refers to —SH.

As used herein, the terms "tetrazine" and "tetrazinyl" refer to six-membered heteroaryl group comprising four nitrogen atoms. Tetrazine can be optionally substituted.

"Tetrazole," as used herein, refer to five-membered heterocyclic group including four nitrogen atoms. Tetrazole can be optionally substituted.

The term "transparent" refers to a material, e.g., in the form of a base support or layer, that is capable of transmitting a particular wavelength or range of wavelengths. For example, the material may be transparent to wavelength(s) that are used to chemically change a positive or negative photoresist. Transparency may be quantified using transmittance, i.e., the ratio of light energy falling on a body to that transmitted through the body. The transmittance of a transparent base support or a transparent layer will depend upon the thickness of the base support or layer, the wavelength of light, and the dosage of the light to which it is exposed. In the examples disclosed herein, the transmittance of the transparent base support or the transparent layer may range from 0.25 (25%) to 1 (100%). The material of the base support or layer may be a pure material, a material with some impurities, or a mixture of materials, as long as the resulting base support or layer is capable of the desired transmittance. Additionally, depending upon the transmittance of the base support or layer, the time for light exposure and/or the output power of the light source may be increased or decreased to deliver a suitable dose of light energy through the transparent base support and/or layer to achieve the desired effect (e.g., generating a soluble or insoluble photoresist).

Flow Cells

An example of the flow cell for simultaneous paired-end sequencing generally includes a patterned structure, which includes a substrate; two functionalized layers over at least two different portions of the substrate; and different primer sets attached to the two functionalized layers.

One example of the flow cell 10 is shown in FIG. 2A from a top view. The flow cell 10 may include two patterned structures bonded together or one patterned structure bonded to a lid. Between the two patterned structures or the one patterned structure and the lid is a flow channel 12. The example shown in FIG. 2A includes eight flow channels 12. While eight flow channels 12 are shown, it is to be understood that any number of flow channels 12 may be included in the flow cell 10 (e.g., a single flow channel 12, four flow channels 12, etc.). Each flow channel 12 may be isolated from another flow channel 12 so that fluid introduced into a flow channel 12 does not flow into adjacent flow channel(s) 12. Some examples of the fluids introduced into the flow channel 12 may introduce reaction components (e.g., DNA sample, polymerases, sequencing primers, nucleotides, etc.), washing solutions, deblocking agents, etc.

Each flow channel 12 is in fluid communication with an inlet and an outlet (not shown). The inlet and outlet of each flow channel 12 may be positioned at opposed ends of the flow cell 10. The inlets and outlets of the respective flow channels 12 may alternatively be positioned anywhere along the length and width of the flow channel 12 that enables desirable fluid flow.

The inlet allows fluids to be introduced into the flow channel 12, and the outlet allows fluid to be extracted from the flow channel 12. Each of the inlets and outlets is fluidly connected to a fluidic control system (including, e.g., reservoirs, pumps, valves, waste containers, and the like) which controls fluid introduction and expulsion.

The flow channel 12 is at least partially defined by a patterned structure. The patterned structure may include a substrate, such as a single layer base support 14 or 14' (as shown in FIG. 2B and FIG. 2D), or a multi-layered structure 16, 16' (as shown in FIG. 2C and FIG. 2E).

In examples of the method that utilize a metal film (see, e.g., FIG. 9A) for patterning, the single layer base support 14 may be any material that is capable of transmitting the light that is used to pattern a photoresist (e.g., ultraviolet light). In these particular examples, suitable materials include siloxanes, glass, modified or functionalized glass, plastics (including acrylics, polystyrene and copolymers of styrene and other materials, polyethylene terephthalate (PET), polycarbonate, cyclic olefin copolymer (COC), some polyamides, silica or silicon oxide ($SiO_2$), fused silica, silica-based materials, silicon nitride ($Si_3N_4$), inorganic glasses, resins, or the like. Examples of resins that can transmit UV light include inorganic oxides, such as tantalum pentoxide (e.g., $Ta_2O_5$) or other tantalum oxide(s) ($TaO_x$), aluminum oxide (e.g., $AlL_2O_3$), silicon oxide (e.g., $SiO_2$), hafnium oxide (e.g., $HfO_2$), indium tin oxide, titanium dioxide, etc., or polymeric resins, such as a polyhedral oligomeric silsesquioxane based resin (e.g., POSS® from Hybrid Plastics), a non-polyhedral oligomeric silsesquioxane epoxy resin, a poly(ethylene glycol) resin, a polyether resin (e.g., ring opened epoxies), an acrylic resin, an acrylate resin, a methacrylate resin, an amorphous fluoropolymer resin (e.g., CYTOP® from Bellex), and combinations thereof. In some examples, the resin used has a UV transmittance (at the predetermined UV dosage being used) that ranges from about 0.5 to about 1, e.g., from about 0.75 to about 1, from about 0.9 to about 0.99. The thickness of the resin that is used in combination with the metal film can be adjusted so that the entire resin exhibits the desired UV transmittance for the UV dosage being used. In some instances, the resin thickness is 150 nm or less.

In examples of the method that utilize the metal film for patterning, the multi-layer structure 16 may include a base support 17 and a resin layer 18 on the base support 17. In this example, any of the materials for the single layer base support 14 may be used as the base support 17, and any of the resins set forth herein for the single layer base support 14 may be used for the resin layer 18.

In the examples of the method that utilize varying resin layer thickness for patterning, the single layer base support 14' may be any resin material whose UV absorbance, when exposed to a particular UV light dosage, can be altered by adjusting its thickness. Any of the previously listed resins may be used so long as thicker portions absorb the UV light and thinner portions transmit a desirable amount of UV light for patterning when the resin is exposed to a predetermined UV light dosage. In one example, a polyhedral oligomeric silsesquioxane based resin having thicker portions of about 500 nm and thinner portions of about 150 nm will respectively and effectively absorb and transmit UV light when exposed to a dosage ranging from about 30 $mJ/cm^2$ to about 60 $mJ/cm^2$. Other thicknesses may be used, and the UV dosage may be adjusted accordingly to achieve the desired absorption in thicker areas and transmittance in thinner areas.

In examples of the method that utilize varying resin layer thickness for patterning, the multi-layer structure 16' may include a base support 17' and a resin layer 18' on the base support 17' (FIG. 2C). In this example, any of the materials set forth herein that are suitable for use as the single layer base support 14 may be used as the base support 17', and any of the resins set forth herein that are suitable for use as the single layer base support 14' may be used for the resin layer 18'. In this example, the thick and thin portions of the resin layer 18' are adjusted to achieve the desired absorption and transmittance.

The correlation between UV dose, UV absorption constant, and resin layer thickness can be expressed as:

$$D_0 = D \times \exp(-kd)$$

where $D_0$ is the required UV dose to pattern resin layer, D is the actual UV dose which has to be applied to the resin, k is the absorption constant, and d is the thickness of thinner portion of resin. Thus, the actual UV dose (D) can be expressed as:

$$D = D_0 / \exp(-kd)$$

In one example, the single layer base support 14' or the resin layer 18' is the negative photoresist NR9-1000P (from Futurrex), $D_0$=19 $mJ/cm^2$ at 0.9 μm of thickness, the UV absorption constant (k) of the photoresist is $3\times10^4$ $cm^{-1}$, the thickness of the thinner portion of photoresist is 150 nm, and D is about 30 $mJ/cm^2$.

In some of the examples set forth herein, the single layer base support 14, 14' or the resin layer 18, 18' is patterned with depressions 20 (shown in FIG. 2B), or multi-depth depressions 20' (shown in FIG. 2C).

Some example materials (e.g., inorganic oxides) can be selectively applied via vapor deposition, aerosol printing, or inkjet printing and the depressions 20 or multi-depth depressions 20' can be formed during this process. Other example materials, e.g., the polymeric resins, may be applied and then patterned to form the depressions 20 or multi-depth depressions 20'. For example, the polymeric resins may be deposited using a suitable technique, such as chemical vapor deposition, dip coating, dunk coating, spin coating, spray coating, puddle dispensing, ultrasonic spray coating, doctor blade coating, aerosol printing, screen printing, microcontact printing, etc. Suitable patterning techniques include photolithography, nanoimprint lithography (NIL), stamping techniques, embossing techniques, molding techniques, microetching techniques, etc.

The single layer base support 14, 14' or the base support 17, 17' may be a circular sheet, a panel, a wafer, a die etc. having a diameter ranging from about 2 mm to about 300 mm, e.g., from about 200 mm to about 300 mm, or may be a rectangular sheet, panel, wafer, die etc. having its largest dimension up to about 10 feet (~3 meters). As one example, a die may have a width ranging from about 0.1 mm to about 10 mm. While example dimensions have been provided, it is to be understood that the single layer base support 14, 14' or the base support 17, 17' may have any suitable dimensions.

In an example, the flow channel 12 has a substantially rectangular configuration (e.g., with slightly bent and curved ends as shown in FIG. 2A). The length and width of the flow channel 12 may be selected so a portion of the single layer base support 14, 14' or the resin layer 18, 18' of the multi-layered structure 16, 16' surrounds the flow channel 12 and is available for attachment to a lid (not shown) or another patterned structure.

The depth of the flow channel 12 can be as small as a monolayer thick when microcontact, aerosol, or inkjet printing is used to deposit a separate material that defines the flow channel 12 walls. For other examples, the depth of the flow channel 12 can be about 1 μm, about 10 μm, about 50 μm, about 100 μm, or more. In an example, the depth may range from about 10 μm to about 100 μm. In another example, the depth may range from about 10 μm to about 30 μm. In still another example, the depth is about 5 μm or less. It is to be understood that the depth of the flow channel 12 may be greater than, less than or between the values specified herein.

FIG. 2B, FIG. 2C, FIG. 2D, and FIG. 2E depict examples of the architecture within the flow channel 12. As shown in FIG. 2B, the architecture includes depressions 20 of the same depth separated by interstitial regions 22. In this example, functionalized layers 24, 26 are formed in each depression 20. As shown in FIG. 2C, the architecture includes multi-depth depressions 20' separated by interstitial regions 22. In this example, functionalized layers 24, 26 are formed in different portions of the multi-depth depressions 20'. As shown in FIG. 2D, the architecture includes multi-depth trenches 21 separated by interstitial regions 22, and isolated areas of the functionalized layers 24, 26 formed on difference surfaces (e.g., 64', 66') of the multi-depth trenches 21. As shown in FIG. 2E, a multi-step protrusion 28 is formed in the resin layer 18 of the multi-layered structure 16. As shown in FIG. 2E, the architecture includes a plurality of the protrusions 28 across a substantially planar surface of the base support 17.

Many different layouts of the depressions 20, 20', and the multi-step protrusion 28 may be envisaged, including regular, repeating, and non-regular patterns. In an example, the depressions 20, 20' and/or the multi-step protrusions 28 are disposed in a hexagonal grid for close packing and improved density. Other layouts may include, for example, rectilinear (rectangular) layouts, triangular layouts, and so forth. In some examples, the layout or pattern can be an x-y format in rows and columns. In some other examples, the layout or pattern can be a repeating arrangement of the depressions 20, 20' and/or the protrusions 28 and the interstitial regions 22. In still other examples, the layout or pattern can be a random arrangement of the depressions 20, 20' and/or the protrusions 28, and the interstitial regions 22. The layout or pattern may be characterized with respect to the density (number) of the depressions 20, 20' and/or the protrusions 28 in a defined area. For example, the depressions 20, 20' and/or the protrusions 28 may be present at a density of approximately 2 million per $mm^2$. The density may be tuned to different densities including, for example, a density of about 100 per $mm^2$, about 1,000 per $mm^2$, about 0.1 million per $mm^2$, about 1 million per $mm^2$, about 2 million per $mm^2$, about 5 million per $mm^2$, about 10 million per $mm^2$, about 50 million per $mm^2$, or more, or less. It is to be further understood that the density can be between one of the lower values and one of the upper values selected from the ranges above, or that other densities (outside of the given ranges) may be used. As examples, a high density array may be characterized as having the depressions 20, 20' and/or the protrusions 28 separated by less than about 100 nm, a medium density array may be characterized as having the depressions 20, 20' and/or the protrusions 28 separated by about 400 nm to about 1 μm, and a low density array may be characterized as having the depressions 20, 20' and/or the protrusions 28 separated by greater than about 1 μm.

The layout or pattern of the depressions 20, 20' and/or the protrusions 28 may also or alternatively be characterized in terms of the average pitch, or the spacing from the center of one depression 20, 20' and/or protrusion 28 to the center of an adjacent depression 20, 20' and/or protrusion 28 (center-to-center spacing) or from the right edge of one depression 20, 20' and/or protrusion 28 to the left edge of an adjacent depression 20, 20' and/or protrusion 28 (edge-to-edge spacing). The pattern can be regular, such that the coefficient of variation around the average pitch is small, or the pattern can be non-regular in which case the coefficient of variation can be relatively large. In either case, the average pitch can be, for example, about 50 nm, about 0.15 μm, about 0.5 μm, about 1 μm, about 5 μm, about 10 μm, about 100 μm, or more or less. The average pitch for a particular pattern of can be between one of the lower values and one of the upper values selected from the ranges herein. In an example, the depressions 20 have a pitch (center-to-center spacing) of about 1.5 μm. While example average pitch values have been provided, it is to be understood that other average pitch values may be used.

The size of each depression 20, 20' may be characterized by its volume, opening area, depth, and/or diameter. For example, the volume can range from about $1\times10^{-3}$ $\mu m^3$ to about 100 $\mu m^3$, e.g., about $1\times10^{-2}$ $\mu m^3$, about 0.1 $\mu m^3$, about 1 $\mu m^3$, about 10 $\mu m^3$, or more, or less. For another example, the opening area can range from about $1\times10^{-3}$ $\mu m^2$ to about 100 $\mu m^2$, e.g., about $1\times10^{-2}$ $\mu m^2$, about 0.1 $\mu m^2$, about 1 $\mu m^2$, at least about 10 $\mu m^2$, or more, or less. For still another example, the depth can range from about 0.1 μm to about 100 μm, e.g., about 0.5 μm, about 1 μm, about 10 μm, or more, or less. For another example, the depth can range from about 0.1 μm to about 100 μm, e.g., about 0.5 μm, about 1 μm, about 10 μm, or more, or less. For yet another example, the diameter or length and width can range from about 0.1 μm to about 100 μm, e.g., about 0.5 μm, about 1 μm, about 10 μm, or more, or less.

In the multi-depth depression 20', it is to be understood that the depth of the deep portion (reference number 48, see FIG. 4A) and the depth of the shallow portion (reference number 50, see FIG. 4A) are each within the ranges provided, with the caveat that the depth of the deep portion 48 is greater than the depth of the shallow portion 50. It is to be understood that the height of the internal wall 29, I (see FIG. 1A and FIG. 4A) will vary depending upon the different depths of the deep and shallow portions 48, 50. In some examples, it is desirable that the height of the internal wall 29, I be substantially equivalent to (e.g., +/−5%) the thickness of the depth of the shallow portion 50. These dimensions may be desirable, e.g., when the layer in which the multi-depth depression 20' is etched back to form a depression 20 (see, e.g., FIG. 10C and FIG. 11A) or a protrusion 28 (see, e.g., FIGS. 7C and 7D).

The size of each protrusion 28 may be characterized by its top surface areas, heights, and/or diameter (if circular in shape) or length and width. The protrusion 28 is a multi-height pad, as shown in FIG. 1E, which includes two top surfaces 27, 27' (FIG. 2E) at different heights with respect to the surface of the base support 17. The top surfaces 27, 27' are separated by a sidewall 29'. In an example, each of the top surfaces 27, 27' has a surface area ranging from about $1\times10^{-3}$ $\mu m^2$ to about 100 $\mu m^2$, e.g., about $1\times10^{-2}$ $\mu m^2$, about 0.1 $\mu m^2$, about 1 $\mu m^2$, at least about 10 $\mu m^2$, or more, or less. For still another example, each of the heights can range from about 0.1 μm to about 100 μm, e.g., about 0.5 μm, about 1 μm, about 10 μm, or more, or less, as long as the two heights are different. For yet another example, the diameter or length and width of protrusion 28 can range from about 0.1 μm to about 100 μm, e.g., about 0.5 μm, about 1 μm, about 10 μm, or more, or less.

In one example, the layout of the multi-depth trenches 21 is such that the length of each trench 21 is parallel to the length of the flow channel 12 in which the trench 21 is formed. Each flow channel 12 includes two or more trenches 21, and with this layout, each multi-depth trench 21 extends the length of the flow channel 12, as represented in FIG. 2D, and thus are parallel to each other. In another example, the layout of the multi-depth trenches 21 is such that the length of each trench 21 is perpendicular to the length of the flow channel 12 in which the trench 21 is formed. In this other example, the two or more trenches 21 would be parallel to one another, but would extend the width of the flow channel 12 (as opposed to the length of the flow channel 12).

Each trench 21 has opposed sidewalls 29, E1 and 29, E2 that define the edges of the trench 21, and each trench 21 is separated from an adjacent trench 21 by an interstitial region 22. The interstitial regions 22 between adjacent trenches 21 may have a width of 150 nm or more. In an example, the width between adjacent trenches 21 may each range from about 150 nm to about 100 μm, e.g., about 0.5 μm, about 2 μm, about 10 μm, or more. In an example, the width of the interstitial regions 22 between adjacent trenches 21 may be about 0.3 μm.

The width of each section of the multi-depth trench 21, e.g., from sidewall 29, E1 to internal wall 29, I and from internal wall 29, I to sidewall 29, E2, may range from about 300 nm to about 500 nm, and thus the total width of the multi-depth trench 21 may range from about 600 nm to about 1000 nm.

The size of each multi-depth trench 21 may be characterized by its volume, opening area, and/or depths. For example, the volume can range from about 0.1 $\mu m^3$ to about 0.4 $\mu m^3$ per unit area of 1 $\mu m^2$. For another example, the opening area for all of the trenches 21 can range from about 40% to about 80% of the total area of the substrate in which the trenches 21 are formed.

Each trench 21 includes a deep portion 48' and a shallow portion 50', and the depth of the trench 21 varies at these portions 48', 50'. The depth at the respective portions 48', 50' can range from about 0.1 μm to about 100 μm, e.g., about 0.5 μm, about 1 μm, about 10 μm, or more, or less, with the caveat that the depth of the deep portion 48' is greater than the depth of the shallow portion 50'. It is to be understood that the height of the sidewall 29, E1 adjacent to the deep portion 48' may be equivalent to the depth of the deep portion 48', and the height of the sidewall 29, E2 adjacent to the shallow portion 50' may be equivalent to the depth from the interstitial region 22 to a surface 66' that defines the bottom of the shallow portion 50'. The height of the internal wall 29, I (see FIG. 2D and FIG. 18A) will vary depending upon the different depths of the deep and shallow portions 48', 50'.

Each of the architectures also includes the functionalized layers 24, 26. In each example, the functionalized layers 24, 26 represent areas that have a primer set attached thereto. Some examples of the primer set 30 (FIGS. 2B, 2C, 2D, and 2E) include two different primers 34, 36. Some examples of the primer set 32 (FIGS. 2B, 2C, 2D, and 2E) include two different primer sets 38, 40. The primer sets 30, 32 are used in simultaneous paired-end sequencing. It is to be understood that primer set 30 may be attached to functionalized layer 24 or functionalized layer 26, so long as the primer set 32 is attached to the other of the functionalized layers 26, 24.

In some of the examples disclosed herein, the functionalized layers 24, 26 are chemically the same, and any of the techniques disclosed herein may be used to immobilize the primer sets 30, 32 to the desired layer 24, 26. In other examples disclosed herein, the functionalized layers 24, 26 are chemically different (e.g., include different functional groups for respective primer set 30, 32 attachment), and any of the techniques disclosed herein may be used to immobilize the primer sets 30, 32 to the respective layers 24, 26. In other examples disclosed herein, the materials applied to form the functionalized layers 24, 26 may have the respective primer sets 30, 32 pre-grafted thereto, and thus the immobilization chemistries of the functionalized layers 24, 26 may be the same or different.

In some examples, the functionalized layers 24, 26 may be any gel material that can swell when liquid is taken up and can contract when liquid is removed, e.g., by drying. In an example, the gel material is a polymeric hydrogel. In an example, the polymeric hydrogel includes an acrylamide copolymer. Some examples of the acrylamide copolymer are represented by the following structure (I):

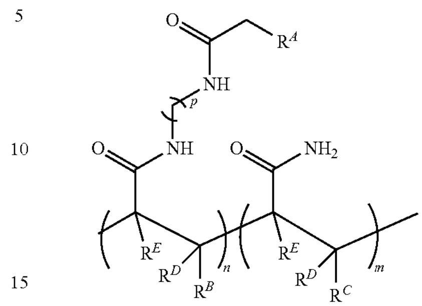

wherein:

$R^A$ is selected from the group consisting of azido, optionally substituted amino, optionally substituted alkenyl, optionally substituted alkyne, halogen, optionally substituted hydrazone, optionally substituted hydrazine, carboxyl, hydroxy, optionally substituted tetrazole, optionally substituted tetrazine, nitrile oxide, nitrone, sulfate, and thiol;

$R^B$ is H or optionally substituted alkyl;

$R^C$, $R^D$, and $R^E$ are each independently selected from the group consisting of H and optionally substituted alkyl;

each of the $—(CH_2)_p—$ can be optionally substituted;

p is an integer in the range of 1 to 50;

n is an integer in the range of 1 to 50,000; and m is an integer in the range of 1 to 1010,000.

One specific example of the acrylamide copolymer represented by structure (I) is poly(N-(5-azidoacetamidylpentyl)acrylamide-co-acrylamide, PAZAM.

One of ordinary skill in the art will recognize that the arrangement of the recurring "n" and "m" features in structure (I) are representative, and the monomeric subunits may be present in any order in the polymer structure (e.g., random, block, patterned, or a combination thereof).

The molecular weight of the acrylamide copolymer may range from about 5 kDa to about 1500 kDa or from about 10 kDa to about 1000 kDa, or may be, in a specific example, about 312 kDa.

In some examples, the acrylamide copolymer is a linear polymer. In some other examples, the acrylamide copolymer is a lightly cross-linked polymer.

In other examples, the gel material may be a variation of structure (I). In one example, the acrylamide unit may be replaced with N,N-dimethylacrylamide ( 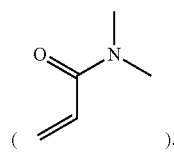 ).

In this example, the acrylamide unit in structure (I) may be replaced with,

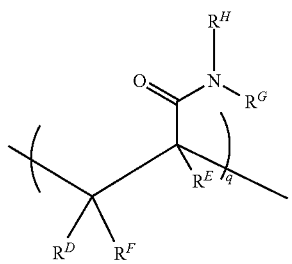

where $R^D$, $R^E$, and $R^F$ are each H or a C1-C6 alkyl, and $R^G$ and $R^H$ are each a C1-C6 alkyl (instead of H as is the case with the acrylamide). In this example, q may be an integer in the range of 1 to 100,000. In another example, the N,N-dimethylacrylamide may be used in addition to the acrylamide unit. In this example, structure (I) may include

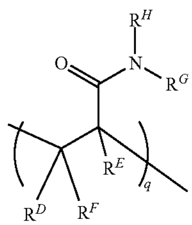

in addition to the recurring "n" and "m" features, where $R^D$, $R^E$, and $R^F$ are each H or a C1-C6 alkyl, and $R^G$ and $R^H$ are each a C1-C6 alkyl. In this example, q may be an integer in the range of 1 to 100,000.

As another example of the polymeric hydrogel, the recurring "n" feature in structure (I) may be replaced with a monomer including a heterocyclic azido group having structure (II):

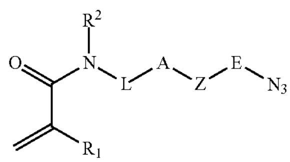

wherein $R^1$ is H or a C1-C6 alkyl; $R_2$ is H or a C1-C6 alkyl; L is a linker including a linear chain with 2 to 20 atoms selected from the group consisting of carbon, oxygen, and nitrogen and 10 optional substituents on the carbon and any nitrogen atoms in the chain; E is a linear chain including 1 to 4 atoms selected from the group consisting of carbon, oxygen and nitrogen, and optional substituents on the carbon and any nitrogen atoms in the chain; A is an N substituted amide with an H or a C1-C4 alkyl attached to the N; and Z is a nitrogen containing heterocycle. Examples of Z include 5 to 10 carbon-containing ring members present as a single cyclic structure or a fused structure. Some specific examples of Z include pyrrolidinyl, pyridinyl, or pyrimidinyl. As still another example, the gel material may include a recurring unit of each of structure (III) and (IV):

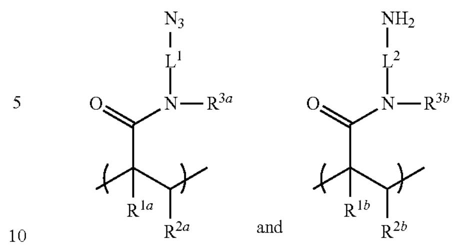

wherein each of $R^{1a}$, $R^{2a}$, $R^{1b}$ and $R^{2b}$ is independently selected from hydrogen, an optionally substituted alkyl or optionally substituted phenyl; each of $R^{3a}$ and $R^{3b}$ is independently selected from hydrogen, an optionally substituted alkyl, an optionally substituted phenyl, or an optionally substituted C7-C14 aralkyl; and each $L^1$ and $L^2$ is independently selected from an optionally substituted alkylene linker or an optionally substituted heteroalkylene linker.

In still another example, the acrylamide copolymer is formed using nitroxide mediated polymerization, and thus at least some of the copolymer chains have an alkoxyamine end group. In the copolymer chain, the term "alkoxyamine end group" refers to the dormant species $—ONR_1R_2$, where each of $R_1$ and $R_2$ may be the same or different, and may independently be a linear or branched alkyl, or a ring structure, and where the oxygen atom is attached to the rest of the copolymer chain. In some examples, the alkoxyamine may also be introduced into some of the recurring acrylamide monomers, e.g., at position $R^A$ in structure (I). As such, in one example, structure (I) includes an alkoxyamine end group; and in another example, structure (I) includes an alkoxyamine end group and alkoxyamine groups in at least some of the side chains.

It is to be understood that other molecules may be used to form the functionalized layer 24, 26, as long as they are capable of being functionalized with the desired chemistry, e.g., primer set(s) 30, 32. Some examples of suitable materials for the functionalized layer 24, 26 include functionalized silanes, such as norbornene silane, azido silane, alkyne functionalized silane, amine functionalized silane, maleimide silane, or any other silane having functional groups that can respectively attach the desired chemistry. Still other examples of suitable materials for the functionalized layer 24, 26 include those having a colloidal structure, such as agarose; or a polymer mesh structure, such as gelatin; or a cross-linked polymer structure, such as polyacrylamide polymers and copolymers, silane free acrylamide (SFA), or an azidolyzed version of SFA. Examples of suitable polyacrylamide polymers may be synthesized from acrylamide and an acrylic acid or an acrylic acid containing a vinyl group, or from monomers that form [2+2] photo-cycloaddition reactions. Still other examples of suitable materials for the functionalized layer 24, 26 include mixed copolymers of acrylam ides and acrylates. A variety of polymer architectures containing acrylic monomers (e.g., acrylamides, acrylates etc.) may be utilized in the examples disclosed herein, such as branched polymers, including dendrimers (e.g., multi-arm or star polymers), star-shaped or star-block polymers, and the like. For example, the monomers (e.g., acrylamide, acrylamide containing the catalyst, etc.) may be incorporated, either randomly or in block, into the branches (arms) of a dendrimer.

The gel material for the functionalized layer 24, 26 may be formed using any suitable copolymerization process, such as nitroxide mediated polymerization (NMP), reversible addition-fragmentation chain-transfer (RAFT) polymerization, etc.

It is to be understood that in any of the examples shown in FIGS. 2B through FIG. 2E, the positioning of the functionalized layer 24 and the functionalized layer 26 may be reversed. In an example, in FIG. 2B, the functionalized layers 24, 26 may be in either position within the depression 20, as long as the functionalized layers 24, 26 are adjacent to one another.

The attachment of the functionalized layers 24, 26 to the underlying base support 14, 14' or resin layer 18, 18' may be through covalent bonding. In some instances, the underlying base support 14, 14' or resin layer 18, 18' may first be activated, e.g., through silanization or plasma ashing. Covalent linking is helpful for maintaining the primer set(s) 30, 32 in the desired regions throughout the lifetime of the flow cell 10 during a variety of uses.

In the examples set forth herein, the flow cell 10 includes one primer set 30, 32 attached to one of the functionalized layers 24, 26 and a different primer set 30, 32 attached to another of the functionalized layers 24, 26. The different primers sets 30, 32 are related in that one set includes an un-cleavable first primer and a cleavable second primer, and the other set includes a cleavable first primer and an un-cleavable second primer. These primer sets 30, 32 allow a single template strand to be amplified and clustered across both primer sets, and also enable the generation of forward and reverse strands on the adjacent functionalized layers due to the cleavage groups being present on the opposite primers of the sets. Examples of these primer sets 30, 32 will be discussed in reference to FIG. 3A through FIG. 3D.

FIG. 3A through FIG. 3D depict different configurations of the primer sets 30A, 32A, 30B, 32B, 30C, 32C, and 30D, 32D attached to the functionalized layers 24, 26.

Each of the first primer sets 30A, 30B, 30C, and 30D includes an un-cleavable first primer 34 or 34' and a cleavable second primer 36 or 36'; and each of the second primer sets 32A, 32B, 32C, and 32D includes a cleavable first primer 38 or 38' and an un-cleavable second primer 40 or 40'.

The un-cleavable first primer 34 or 34' and the cleavable second primer 36 or 36' are oligonucleotide pairs, e.g., where the un-cleavable first primer 34 or 34' is a forward amplification primer and the cleavable second primer 36 or 36' is a reverse amplification primer or where the cleavable second primer 36 or 36' is the forward amplification primer and the un-cleavable first primer 34 or 34' is the reverse amplification primer. In each example of the first primer set 30A, 30B, 30C, and 30D the cleavable second primer 36 or 36' includes a cleavage site 42, while the un-cleavable first primer 34 or 34' does not include a cleavage site 42.

The cleavable first primer 38 or 38' and the un-cleavable second primer 40 or 40' are also oligonucleotide pairs, e.g., where the cleavable first primer 38 or 38' is a forward amplification primer and the un-cleavable second primer 40 or 40' is a reverse amplification primer or where the un-cleavable second primer 40 or 40' is the forward amplification primer and the cleavable first primer 38 or 38' is the reverse amplification primer. In each example of the second primer set 32A, 32B, 32C, and 32D, the cleavable first primer 38 or 38' includes a cleavage site 42' or 44, while the un-cleavable second primer 40 or 40' does not include a cleavage site 42' or 44.

It is to be understood that the un-cleavable first primer 34 or 34' of the first primer set 30A, 30B, 30C, and 30D and the cleavable first primer 38 or 38' of the second primer set 32A, 32B, 32C, and 32D have the same nucleotide sequence (e.g., both are forward amplification primers), except that the cleavable first primer 38 or 38' includes the cleavage site 42' or 44 integrated into the nucleotide sequence or into a linker 46' attached to the nucleotide sequence. Similarly, the cleavable second primer 36 or 36' of the first primer set 30A, 30B, 30C, and 30D and the un-cleavable second primer 40 or 40' of the second primer set 32A, 32B, 32C, and 32D have the same nucleotide sequence (e.g., both are reverse amplification primers), except that the cleavable second primer 36 or 36' includes the cleavage site 42 integrated into the nucleotide sequence or into a linker 46 attached to the nucleotide sequence.

It is to be understood that when the first primers 34 and 38 or 34' and 38' are forward amplification primers, the second primers 36 and 40 or 36' and 40' are reverse primers, and vice versa.

The un-cleavable primers 34, 40 or 34', 40' may be any primers with a universal sequence for capture and/or amplification purposes, such as P5 and P7 primers, or any combination of PA, PB, PC, and PD primers (e.g., PA and PB or PA and PD, etc.).

Examples of the P5 and P7 primers are used on the surface of commercial flow cells sold by Illumina Inc. for sequencing, for example, on HISEQ™, HISEQX™, MISEQ™, MISEQDX™, MINISEQ™, NEXTSEQ™, NEXTSEQDX™, NOVASEQ™, ISEQ™, GENOME ANALYZER™, and other instrument platforms. The P5 primer is:

```
P5: 5' → 3'
                                    (SEQ. ID. NO. 1)
AATGATACGGCGACCACCGAGACTACAC
```

The P7 primer may be any of the following:

```
P7 #1: 5' → 3'
                                    (SEQ. ID. NO. 2)
CAAGCAGAAGACGGCATACGAAT

P7 #2: 5' → 3'
                                    (SEQ. ID. NO. 3)
CAAGCAGAAGACGGCATACAGAT
```

The other primers (PA-PD) mentioned above include:

```
PA 5' → 3'
                                    (SEQ. ID. NO. 4)
GCTGGCACGTCCGAACGCTTCGTTAATCCGTTGAG

cPA (PA') 5' → 3'
                                    (SEQ. ID. NO. 5)
CTCAACGGATTAACGAAGCGTTCGGACGTGCCAGC

PB 5' → 3'
                                    (SEQ. ID. NO. 6)
CGTCGTCTGCCATGGCGCTTCGGTGGATATGAACT

cPB (PB') 5' → 3'
                                    (SEQ. ID. NO. 7)
AGTTCATATCCACCGAAGCGCCATGGCAGACGACG

PC 5' → 3'
                                    (SEQ. ID. NO. 8)
ACGGCCGCTAATATCAACGCGTCGAATCCGCAACT

cPC (PC') 5' → 3'
                                    (SEQ. ID. NO. 9)
AGTTGCGGATTCGACGCGTTGATATTAGCGGCCGT
```

-continued

PD 5' → 3'

(SEQ. ID. NO. 10)
GCCGCGTTACGTTAGCCGGACTATTCGATGCAGC cPD (PD') 5' → 3'

(SEQ. ID. NO. 11)
GCTGCATCGAATAGTCCGGCTAACGTAACGCGGC

These primers are un-cleavable primers 34, 40 or 34', 40' because they do not include a cleavage site 42, 42', 44. It is to be understood that any suitable universal sequence can be used as the un-cleavable primers 34, 40 or 34', 40'.

Figure 3A:
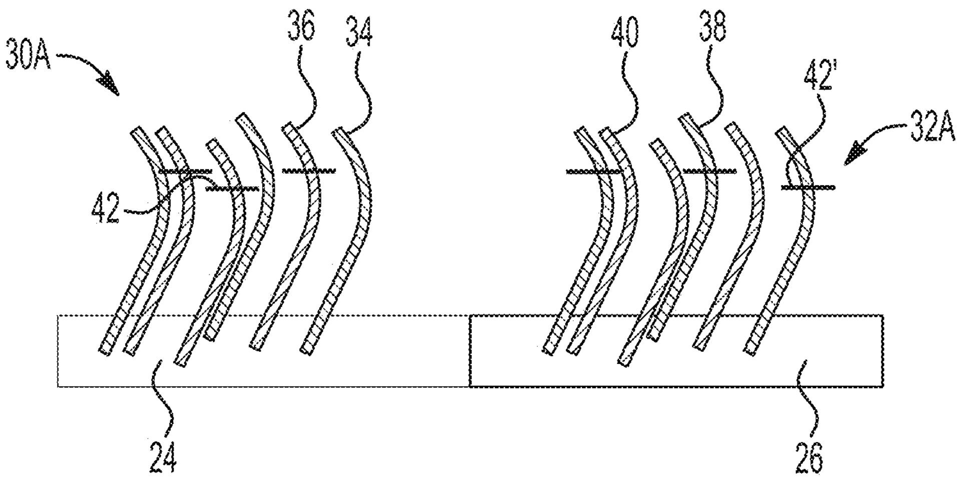
FIG. 3A through FIG. 3D are schematic views of different examples of primer sets that are used in some examples of the flow cells disclosed herein.
Figure 3B:
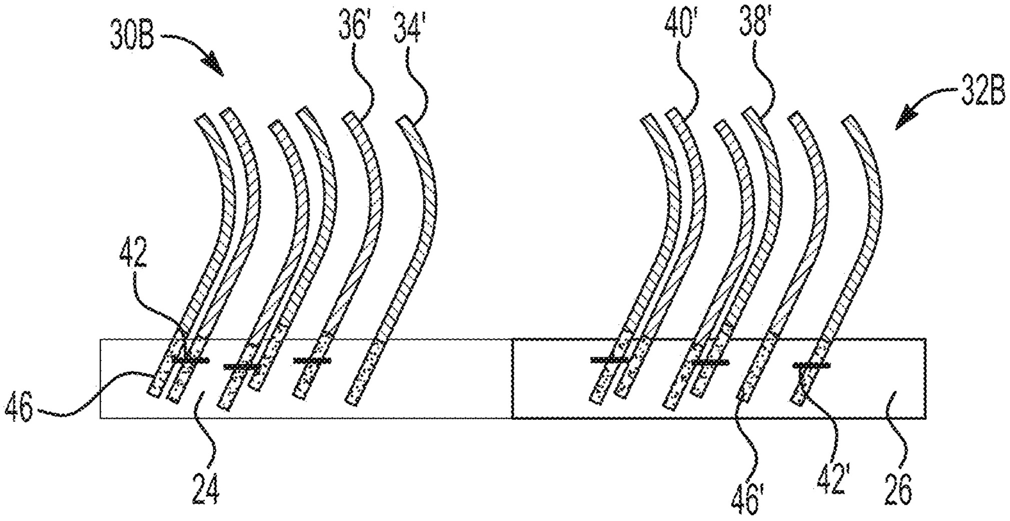
Figure 3C:
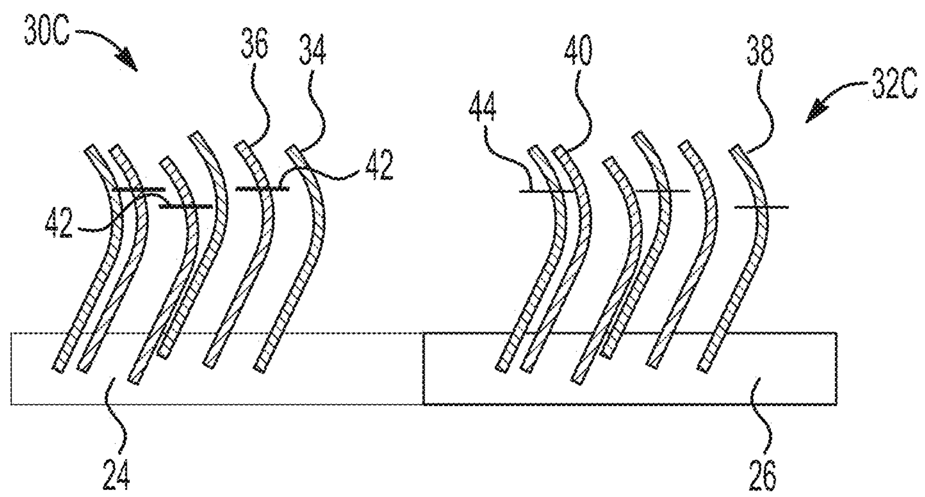
Figure 3D:
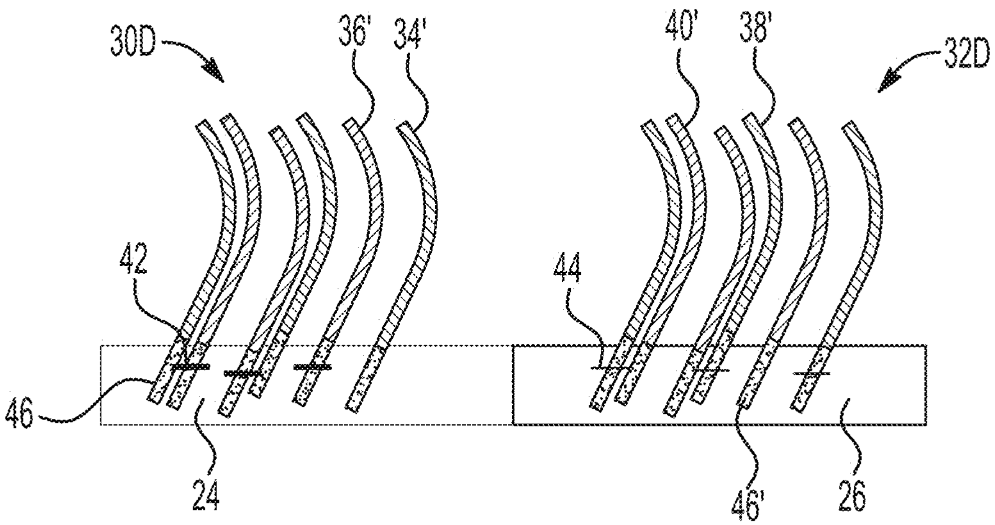

Examples of cleavable primers 36, 38 or 36', 38' include the P5 and P7 primers or other universal sequence primers (e.g., the PA, PB, PC, PD primers) with the respective cleavage sites 42, 42', 44 incorporated into the respective nucleic acid sequences (e.g., FIG. 3A and FIG. 3C), or into a linker 46', 46 that attaches the cleavable primers 36, 38 or 36', 38' to the respective functionalized layers 24, 26 (FIG. 3B and FIG. 3D). Examples of suitable cleavage sites 42, 42', 44 include enzymatically cleavable nucleobases or chemically cleavable nucleobases, modified nucleobases, or linkers (e.g., between nucleobases), as described herein. Some specific examples of the cleavage sites 42, 42', 44 include uracil, 8-oxoguanine, allyl-T. The cleavage sites 42, 42', 44 may be incorporated at any point in the strand.

Some specific examples of the cleavable primers 36, 38 or 36', 38' are shown below, where the cleavage site 42, 42', 44 is shown as "U" or at "n":

P5: 5' → 3'

(SEQ. ID. NO. 12)
AATGATACGGCGACCACCGAGAnCTACAC wherein "n" is uracil or allyl T.

The P7 primer may be any of the following:

P7 #1: 5' → 3'

(SEQ. ID. NO. 13)
CAAGCAGAAGACGGCATACGAnAT

P7 #2: 5' → 3'

(SEQ. ID. NO. 14)
CAAGCAGAAGACGGCATACnAGAT where "n" is 8-oxoguanine in each of the sequences.

Each primer set 30A and 32A or 30B and 32B or 30C and 32C or 30D and 32D is attached to a respective functionalized layer 24, 26. As described herein, the functionalized layers 24, 26 include different functional groups that can selectively react with the respective primers 34, 36 or 34', 36' or 38, 40 or 38', 40'.

While not shown in FIG. 3A through FIG. 3D, it is to be understood that one or both of the primer sets 30A, 30B, 30C, 30D or 32A, 32B, 32C or 32D may also include a PX primer for capturing a library template seeding molecule. As one example, PX may be included with the primer set 30A, 30B, 30C, 30D, but not with primer set 32A, 32B, 32C or 32D. As another example, PX may be included with the primer set 30A, 30B, 30C, 30D and with the primer set 32A, 32B, 32C or 32D. The density of the PX motifs should be relatively low in order to minimize polyclonality within each depression 20, 20'. The PX capture primers may be:

PX 5 '→ 3'

(SEQ. ID. NO. 15)
AGGAGGAGGAGGAGGAGGAGGAGG

-continued cPX (PX') 5' → 3'

(SEQ. ID. NO. 16)
CCTCCTCCTCCTCCTCCTCCTCCT

FIG. 3A through FIG. 3D depict different configurations of the primer sets 30A, 32A, 30B, 32B, 30C, 32C, and 30D, 32D attached to the functionalized layers 24, 26. More specifically, FIG. 3A through FIG. 3D depict different configurations of the primers 34, 36 or 34', 36' and 38, 40 or 38', 40' that may be used.

In the example shown in FIG. 3A, the primers 34, 36 and 38, 40 of the primer sets 30A and 32A are directly attached to the functionalized layers 24, 26, for example, without a linker 46, 46'. The functionalized layer 24 has surface functional groups that can immobilize the terminal groups at the 5' end of the primers 34, 36. Similarly, the functionalized layer 26 has surface functional groups that can immobilize the terminal groups at the 5' end of the primers 38, 40. As described, the immobilization chemistry between the functionalized layer 24 and the primers 34, 36 and the immobilization chemistry between the functionalized layer 26 and the primers 38, 40 is different so that the primers 34, 36 or 38, 40 selectively attach to the desirable functionalized layer 24, 26. The immobilization chemistry between the functionalized layer 24 and the primers 34, 36 and the immobilization chemistry between the functionalized layer 26 and the primers 38, 40 may be different so that the primers 34, 36 or 38, 40 selectively attach to the desirable functionalized layer 24, 26. Alternatively, the primers 34, 36 or 38, 40 may be pre-grafted or sequentially applied via some of the methods disclosed herein.

Also, in the example shown in FIG. 3A, the cleavage site 42, 42' of each of the cleavable primers 36, 38 is incorporated into the sequence of the primer. In this example, the same type of cleavage site 42, 42' is used in the cleavable primers 36, 38 of the respective primer sets 30A, 32A. As an example, the cleavage sites 42, 42' are uracil bases, and the cleavable primers 36, 38 are P5U and P7U. The uracil bases or other cleavage sites may also be incorporated into any of the PA, PB, PC, and PD primers to generate the cleavable primers 36, 38. In this example, the un-cleavable primer 34 of the oligonucleotide pair 34, 36 may be P7, and the un-cleavable primer 40 of the oligonucleotide pair 38, 40 may be P5. Thus, in this example, the first primer set 30A includes P7, P5U and the second primer set 32A includes P5, P7U. The primer sets 30A, 32A have opposite linearization chemistries, which, after amplification, cluster generation, and linearization, allows forward template strands to be formed on one functionalized layer 24 and reverse strands to be formed on the other functionalized layer 26.

In the example shown in FIG. 3B, the primers 34', 36' and 38', 40' of the primer sets 30B and 32B are attached to the functionalized layers 24, 26, for example, through linkers 46, 46'. The functionalized layers 24, 26 include respective functional groups of the functional group pairs disclosed herein, and the terminal ends of the respective linkers 46, 46' are capable of covalently attaching to the respective functional groups. As such, the functionalized layer 24 may have surface functional groups that can immobilize the linker 46 at the 5' end of the primers 34', 36'. Similarly, the functionalized layer 26 may have surface functional groups that can immobilize the linker 46' at the 5' end of the primers 38', 40'. The immobilization chemistry for the functionalized layer 24 and the linkers 46 and the immobilization chemistry for the functionalized layer 26 and the linkers 46' is different so that the primers 34', 36' or 38', 40' selectively graft to the desirable functionalized layer 24, 26. Alternatively, the primers 34, 36 or 38, 40 may be pre-grafted or sequentially applied via some of the methods disclosed herein.

Examples of suitable linkers 46, 46' may include nucleic acid linkers (e.g., 10 nucleotides or less) or non-nucleic acid linkers, such as a polyethylene glycol chain, an alkyl group or a carbon chain, an aliphatic linker with vicinal diols, a peptide linker, etc. An example of a nucleic acid linker is a polyT spacer, although other nucleotides can also be used. In one example, the spacer is a 6 T to 10 T spacer. The following are some examples of nucleotides including non-nucleic acid linkers with terminal alkyne groups (where B is the nucleobase and "oligo" is the primer):

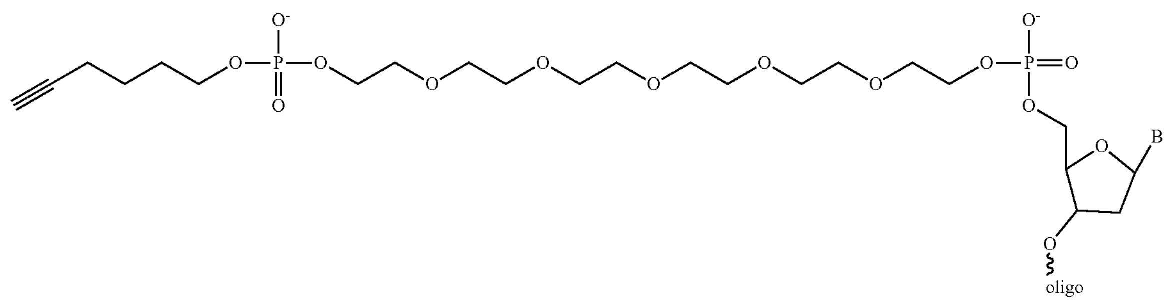

5' Hexynyl-HEG-oligo

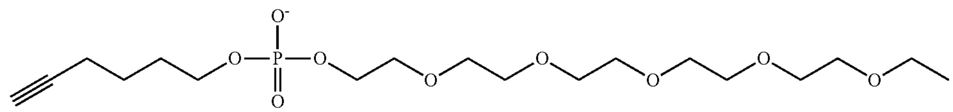

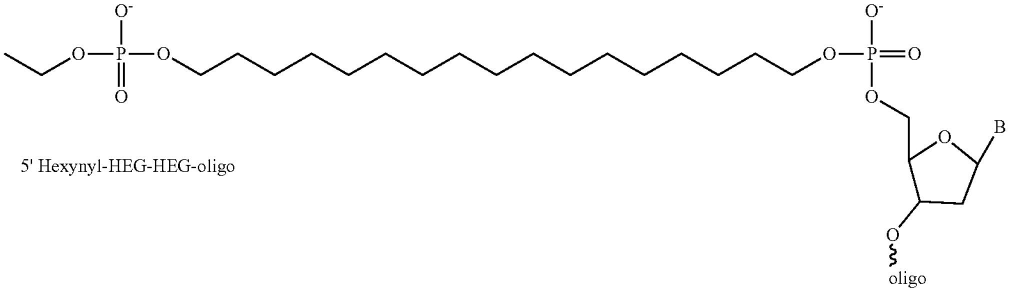

5' Hexynyl-HEG-HEG-oligo

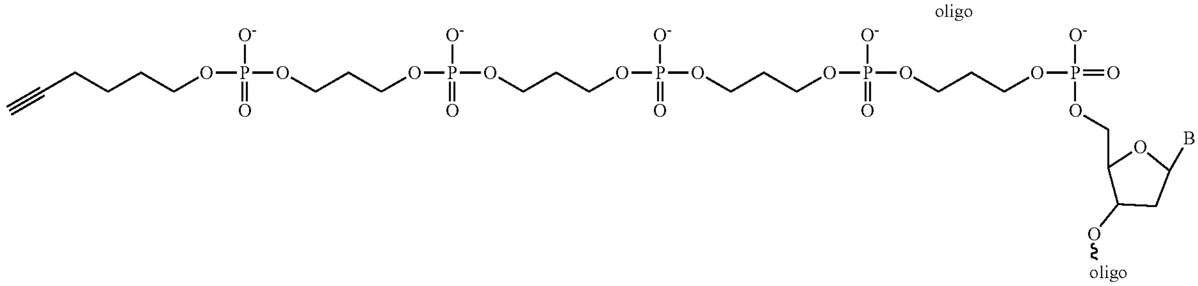

5' Hexynyl-C3 spacer-C3 spacer-C3 spacer-C3 spacer-oligo

In the example shown in FIG. 3B, the primers 34', 38' have the same sequence (e.g., P5). The primer 34' is un-cleavable, whereas the primer 38' includes the cleavage site 42' incorporated into the linker 46'. Also in this example, the primers 36', 40' have the same sequence (e.g., P7). The primer 40' in un-cleavable, and the primer 36' includes the cleavage site 42 incorporated into the linker 46. The same type of cleavage site 42, 42' is used in the linker 46, 46' of each of the cleavable primers 36', 38'. As an example, the cleavage sites 42, 42' may be uracil bases that are incorporated into nucleic acid linkers 46, 46'. The primer sets 30B, 32B have opposite linearization chemistries, which, after amplification, cluster generation, and linearization, allows forward template strands to be formed on one functionalized layer 24 and reverse strands to be formed on the other functionalized layer 26.

The example shown in FIG. 3C is similar to the example shown in FIG. 3A, except that different types of cleavage sites 42, 44 are used in the cleavable primers 36, 38 of the respective primer sets 30C, 32C. As examples, two different enzymatic cleavage sites may be used, two different chemical cleavage sites may be used, or one enzymatic cleavage site and one chemical cleavage site may be used. Examples of different cleavage sites 42, 44 that may be used in the respective cleavable primers 36, 38 include any combination of the following: vicinal diol, uracil, allyl ether, disulfide, restriction enzyme site, and 8-oxoguanine.

The example shown in FIG. 3D is similar to the example shown in FIG. 3B, except that different types of cleavage sites 42, 44 are used in the linkers 46, 46' attached to the cleavable primers 36', 38' of the respective primer sets 30D, 32D. Examples of different cleavage sites 42, 44 that may be used in the respective linkers 46, 46' attached to the cleavable primers 36', 38' include any combination of the following: vicinal diol, uracil, allyl ether, disulfide, restriction enzyme site, and 8-oxoguanine.

In any of the examples shown in FIG. 2 and FIG. 3A through FIG. 3D, the attachment of the primers 34, 36 and 38, 40 or 34', 36' and 38', 40' to the functionalized layers 24, 26 leaves a template-specific portion of the primers 34, 36 and 38, 40 or 34', 36' and 38', 40' free to anneal to its cognate template and the 3' hydroxyl group free for primer extension.

As will be described in more detail below, the primers 34, 36 and 38, 40 or 34', 36' and 38', 40' may be attached to the respective functionalized layer 24, 26 prior to its application to a flow cell substrate, and thus the functionalized layer 24, 26 may be pre-grafted. In other examples, the primers 34, 36 and 38, 40 or 34', 36' and 38', 40' may be attached to the respective functionalized layer 24, 26 after its application to the flow cell substrate.

As shown in FIG. 2B through FIG. 2E, the functionalized layers 24, 26 and primer sets 30, 32 are positioned in particular positions in the different architectures. Different methods may be used to generate these flow cell architectures (including the positioning of the functionalized layers 24, 26 and primer sets 30, 32), and these methods will now be described.

Methods for Making Flow Cells

The architecture within the flow cell 10 may be obtained through a variety of methods.

Methods with Timed Dry Etching

Some examples of the method utilize a time dry etching process of a sacrificial layer (e.g., a photoresist) in order to pattern one or more layers. These methods are shown in FIG. 4A through FIG. 4D in combination with any of i) FIG. 5A through FIG. 5E, ii) FIG. 6A through FIG. 6F, iii) FIG. 7A through FIG. 7F, or FIG. 7A through FIG. 7D and FIG. 7G, or FIG. 7A through FIG. 7D and FIG. 7H through FIG. 7L, or iv) FIG. 8A through FIG. 8G. FIG. 9A through FIG. 9H depict another example method.

The beginning of examples of the method that utilize the time dry etching process are shown in FIG. 4A through FIG. 4D.

Figures 4A, 4B, 4C, 4D, 5A, 5B, 5C, 5D, 5E:
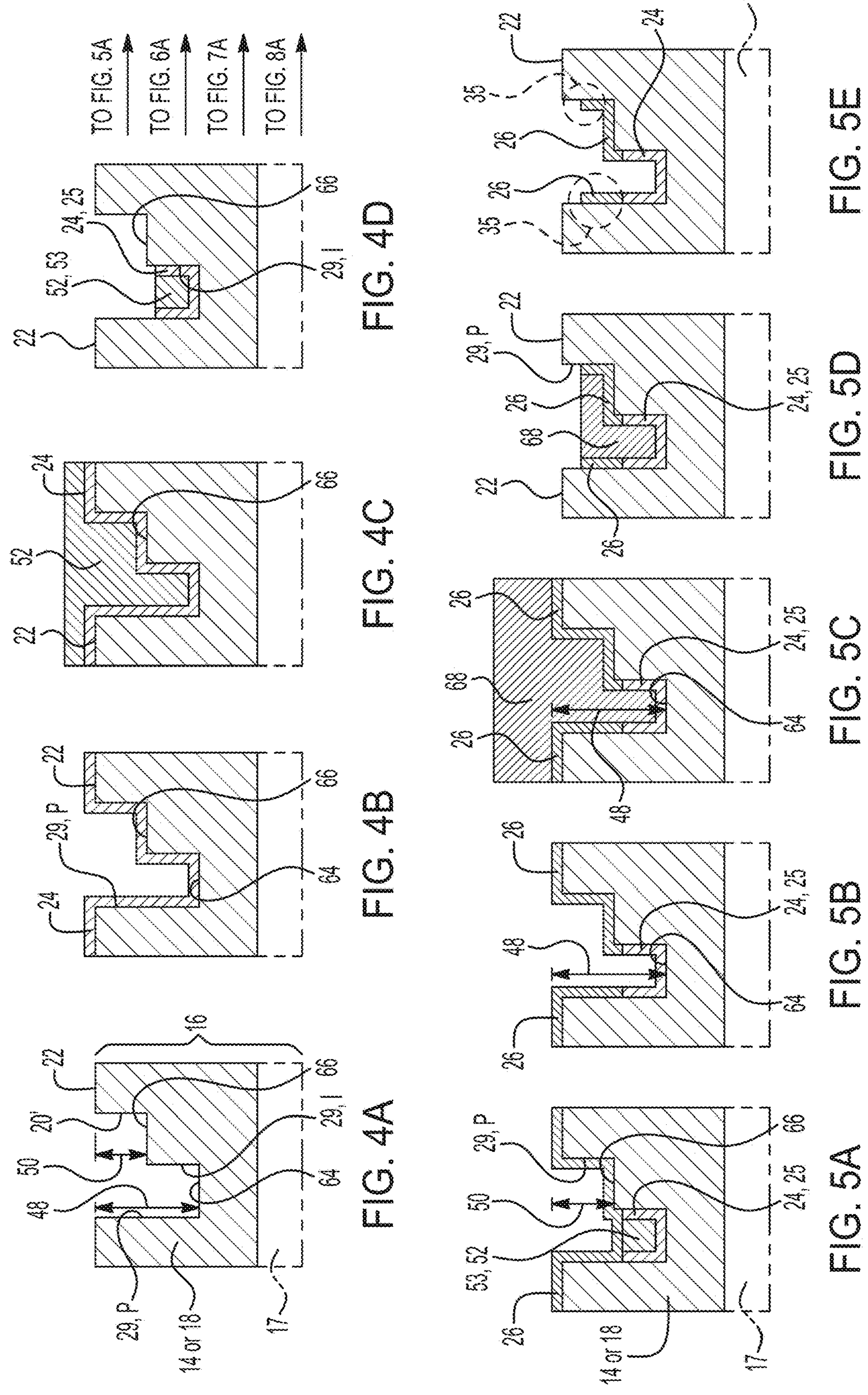
FIG. 4A through FIG. 4D are schematic views that together illustrate an example of a method to pattern a functionalized layer in a deep portion of a multi-depth depression.
FIG. 5A through FIG. 5E are schematic views that together with FIG. 4A through FIG. 4D depict an example of a method to generate a flow cell surface.

As shown in FIG. 4A, the multi-depth depression 20' is defined in either the single layer base support 14 or the resin layer 18 of the multi-layered structure 16 as described herein. In these example methods, the single layer base support 14 is one example of the resins set forth herein, and thus is also referred to as the resin layer 14. As such, the term "resin layer" is referred to as "resin layer 14, 18" throughout the description of these methods. With the underlying base support 17 being shown in phantom, both the multi-layered structure 16 and the single layer base support 14 are represented in FIG. 4A through FIG. 4D.

In the examples when the resin layer 14, 18 is the single layer base support 14, the resin layer 14, 18 may be any of the resins described herein.

In the examples when the resin layer 14, 18 is the resin layer 18 of the multi-layered structure 16, the resin layer 18 may be any of the resins described herein. The base support 17 may be any of the substrates described herein.

The multi-depth depression 20' may be etched, imprinted, or defined in the resin layer 14, 18 using any suitable technique. In one example, nanoimprint lithography is used. In this example, a working stamp is pressed into the resin layer 14, 18 while the material is soft, which creates an imprint (negative replica) of the working stamp features in the resin layer 14, 18. The resin layer 14, 18 may then be cured with the working stamp in place.

Curing may be accomplished by exposure to actinic radiation, such as visible light radiation or ultraviolet (UV) radiation, when a radiation-curable resin material is used; or by exposure to heat when a thermal-curable resin material is used. Curing may promote polymerization and/or cross-linking. As an example, curing may include multiple stages, including a softbake (e.g., to drive off any liquid carrier that may be used to deposit the resin) and a hardbake. The softbake may take place at a lower temperature, ranging from about 50° C. to about 150° C., for greater than 0 seconds to about 3 minutes. The duration of the hardbake may last from about 5 seconds to about 10 minutes at a temperature ranging from about 100° C. to about 300° C. Examples of devices that can be used for softbaking and/or hardbaking include a hot plate, oven, etc.

After curing, the working stamp is released. This creates topographic features in the resin layer 14, 18. In this example, the topographic features of the multi-depth depression 20' include the shallow portion 50, the deep portion 48, the internal wall 29, I separating the deep portion 48 and the shallow portion 50, and the perimeter sidewall 29, P, each of which is shown in FIG. 4A.

While one multi-depth depression 20' is shown in FIG. 4A, it is to be understood that the method may be performed to generate an array of multi-depth depressions 20' including respective deep portions 48 and shallow portions 50, separated by interstitial regions 22, across the surface of the resin layer 14, 18.

If the resin layer 14, 18 does not include surface groups to covalently attach to the functionalized layers 24, 26, the resin layer 14, 18 may first be activated, e.g., through silanization or plasma ashing. If the resin layer 14, 18 does include surface groups to covalently attach to the functionalized layers 24, 26, the activation process is not performed. As examples, the resin layer 14, 18 is $Ta_2O_5$ which can be silanized to generate surface groups to react with the functionalized layers 24, 26 or the resin layer 14, 18 is a polyhedral oligomeric silsesquioxane based resin which can be plasma ashed or silanized to generate surface groups to react with the functionalized layers 24, 26.

Some examples of the methods disclosed herein include depositing a first functionalized layer 24 over the resin layer 14, 18 including a plurality of multi-depth depressions 20' separated by interstitial regions 22, each multi-depth depression 20' including a deep portion 48 and a shallow portion 50 adjacent to the deep portion 48 (as shown in FIG. 4B); patterning the first functionalized layer 24, whereby a portion of the first functionalized layer 24 in the deep portion 48 is covered by a region 53 of a sacrificial layer 52 and portions of the first functionalized layer 24 in the shallow portion 50 and over the interstitial regions 22 are removed (as shown in FIGS. 4C and 4D); and utilizing at least one additional sacrificial layer to define a second functionalized layer adjacent to the portion of the first functionalized layer 24 in the deep portion 48. Different ways of utilizing the additional sacrificial layer to define the second functionalized layer are described in i) FIG. 5A through FIG. 5E, ii) FIG. 6A through FIG. 6F, iii) FIG. 7A through FIG. 7F, or FIG. 7A through FIG. 7D and FIG. 7G, or FIG. 7A through FIG. 7D and FIG. 7H through FIG. 7L, and iv) FIG. 8A through FIG. 8G.

Referring specifically to FIG. 4B, the functionalized layer 24 is deposited over the resin layer 14, 18. As depicted, the functionalized layer 24 is positioned over the exposed surfaces of the resin layer 14, 18, including a surface 64 of the resin layer 14, 18 at the deep portion 48, a surface 66 of the resin layer 14, 18 at the shallow portion 50, the interstitial regions 22, and the sidewalls 29, P, I. The functionalized layer 24 may be any of the gel materials described herein and may be applied using any suitable deposition technique. A curing process may be performed after deposition. The functionalized layer 24 covalently attaches to the resin layer 14, 18 in the depression 20'. Covalent linking is helpful for maintaining the primer set(s) 30, 32 in the desired regions throughout the lifetime of the flow cell 10 during a variety of uses.

The first functionalized layer 24 is then patterned, which is shown and described in reference to FIG. 4C and FIG. 4D. Patterning the first functionalized layer 24 involves applying the sacrificial layer 52 over the first functionalized layer 24 (FIG. 4C); and dry etching the sacrificial layer 52 and portions of the first functionalized layer 24 in the shallow portion 50 and over the interstitial regions 22.

Referring specifically to FIG. 4C, the sacrificial layer 52 is deposited over the first functionalized layer 24. In this example, the sacrificial layer 52 may be any material that is susceptible to plasma etching conditions and is soluble in an organic solvent. As examples, the sacrificial material 52 is a negative photoresist, a positive photoresist, poly(methyl methacrylate), or the like. The sacrificial material 52 may be applied using any suitable deposition technique disclosed herein (e.g., spin coating, etc.) and may be cured (e.g., using heating).

An example of a suitable negative photoresist includes the NR® series photoresist (available from Futurrex). Other suitable negative photoresists include the SU-8 Series and the KMPR® Series (both of which are available from Kayaku Advanced Materials, Inc.), or the UVN™ Series (available from DuPont).

Examples of suitable positive photoresists include the MICROPOSIT® S1800 series or the AZ® 1500 series, both of which are available from Kayaku Advanced Materials, Inc. Another example of a suitable positive photoresist is SPR™-220 (from DuPont).

Referring now to FIG. 4D, the sacrificial layer 52 and the first functionalized layer 24 are dry etched to expose the surface 66 in the shallow portion 50 and the interstitial regions 22. This dry etching process is performed for a measured amount of time to expose the desired surfaces/regions 66, 22. As shown in FIG. 4D, the timed dry etching is stopped so that the region 53 of the sacrificial layer 52 and the underlying portion 25 of the functionalized layer 24 remain in the portion of the deep portion 48 that is next to the interior wall 29, I. As such, the remaining sacrificial layer 52 is at least substantially co-planar with the surface 66 at the shallow portion 50. In one example, the timed dry etch may involve a reactive ion etch (e.g., with 10% $CF_4$ and 90% $O_2$) where the sacrificial layer 52 and functionalized layer 24 are etched at a rate of about 17 nm/min. In another example, the timed dry etch may involve a 100% $O_2$ plasma etch where the sacrificial layer 52 and functionalized layer 24 are etched at a rate of about 98 nm/min.

One example of the method continues from FIG. 4D to FIG. 5A through FIG. 5E. FIG. 5A through FIG. 5E together depict one example of utilizing the at least one additional sacrificial layer 68 (FIG. 5C and FIG. 5D) to define the second functionalized layer 26 adjacent to the portion 25 of the first functionalized layer 24 in the deep portion 48. This example method also includes utilizing the at least one additional sacrificial layer 68 to keep the interstitial regions 22 free of the second functionalized layer 26 and to remove the portion of the second functionalized layer 26 from the perimeter 29, P of the multi-depth depression 20'. As will be discussed further in reference to FIG. 5D, the presence of the additional sacrificial layer 68 within the multi-depth depression 20' allows the second functionalized layer 26 to be removed from the interstitial regions 22 and from a portion of the sidewall 29, P. This reduces the padlock like conformation within the multi-depth depression 20'.

As such, in this example method, utilizing the at least one additional sacrificial layer 68 to define the second functionalized layer 26, to keep the interstitial regions 22 free of the second functionalized layer 26, and to remove the portion of the second functionalized layer 26 from the perimeter 29, P of the multi-depth depression 20' involves depositing the second functionalized layer 26 in the shallow portion 50 and over the region 53 of the sacrificial layer 52 and the interstitial regions 22 (as shown in FIG. 5A); lifting off the region 53 of the sacrificial layer 52, thereby exposing the portion 25 of the first functionalized layer 24 (as shown in FIG. 5B); applying the at least one additional sacrificial layer 68 over the second functionalized layer 26 and over the portion 25 of the first functionalized layer 24 (as shown in FIG. 5C); dry etching the at least one additional sacrificial layer 68 and the second functionalized layer 26 until the second functionalized layer 26 is removed from the interstitial regions 22 and remains in the shallow portion 50 (as shown in FIG. 5D); and lifting off the at least one additional sacrificial layer 68 (shown in FIG. 5E).

Referring specifically to FIG. 5A, the second functionalized layer 26 is deposited in the shallow portion 50, and over the region 53 of the sacrificial layer 52 and over the interstitial regions 22. By "in the shallow portion," it is meant that the second functionalized layer 26 is deposited over portions of the resin layer 14, 18 that are exposed in the shallow portion 50, e.g., the surface 66 and the perimeter sidewall 29, P. It is to be understood that the second functionalized layer 26 may also be deposited over other exposed portions of the perimeter sidewall 29, P as well as the internal wall 29, I.

The second functionalized layer 26 may be any of the gel materials described herein and may be applied using any suitable deposition technique. A curing process, as described herein, may be performed after deposition. The second functionalized layer 26 covalently attaches to the resin layer 14, 18 in the depression 20'. Covalent linking is helpful for maintaining the primer set(s) 30, 32 in the desired regions throughout the lifetime of the flow cell 10 during a variety of uses.

Referring specifically to FIG. 5B, the sacrificial layer 52 is removed in a lift-off process. The lift-off process may involve an organic solvent that is capable of dissolving or otherwise lifting off the sacrificial layer 52. A cured positive photoresist may be lifted off with removers such as dimethylsulfoxide (DMSO) with sonication, an acetone wash, a propylene glycol monomethyl ether acetate wash, or an NMP (N-methyl-2-pyrrolidone) based stripper wash. A cured negative photoresist may be lifted off with removers such as dimethylsulfoxide (DMSO) with sonication, an acetone wash, or an NMP (N-methyl-2-pyrrolidone) based stripper wash. Cured poly(methyl methacrylate) may be lifted off with dimethylsulfoxide (DMSO) using sonication, or in acetone, or with an NMP (N-methyl-2-pyrrolidone) based stripper. The sacrificial layer 52 is soluble (at least 99% soluble) in the organic solvent used in the lift-off process. The lift-off process removes i) at least 99% of the region 53 of the sacrificial layer 52 and ii) the functionalized layer 26 positioned thereon. The lift-off process does not remove the portion 25 of the functionalized layer 24 that had been in contact with the region 53 of the sacrificial layer 52'. Thus, the lift-off process exposes the functionalized layer 24 at the surface 64 of the resin layer 14, 18 at the deep portion 48, as depicted in FIG. 5B.

Referring now to FIG. 5C, an additional sacrificial layer 68 is applied over the second functionalized layer 26 and over the exposed portion 25 of the first functionalized layer 24. In this example, the additional sacrificial layer 68 may be a negative or positive photoresist or poly(methyl methacrylate) and may be applied and cured so that all of the additional sacrificial layer 68 remains over the functionalized layers 24, 26.

The additional sacrificial layer 68 is then timed dry etched, using any of the timed dry etching techniques described herein. The result of time dry etching is depicted in FIG. 5D. This dry etching process is performed for a measured amount of time to expose the interstitial regions 22 and a portion of the perimeter sidewall 29, P. As shown in FIG. 5D, the timed dry etching is stopped so that the functionalized layer 26 remains on the surface 66 in the shallow portion 50. Timed dry etching does remove some of the functionalized layer 26 from portions of the perimeter sidewall 29, P near the opening of the multi-depth depression 20'. This reduces the padlock like conformation 33.

Because the functionalized layer 24 is positioned over the lower surface 64 in the deep portion 48, along the interior wall 29, I (which is lower than the surface 66), and along a portion of the perimeter sidewall 29, P that is lower than the surface 66, the timed dry etching does not affect the functionalized layer 24. Thus, the timed dry etching is stopped so that at least some of the additional sacrificial layer 68 and the underlying functionalized layer 24 remain in an area of the deep portion 48 that is next to the interior wall 29, I. As a result of timed dry etching, the portion 25 of the functionalized layer 24 and the functionalized layer 26 over the surface 66 remain intact.

In some instances, timed dry etching is stopped so that some of the additional sacrificial layer 68 remains over the functionalized layer 26 on the surface 66 and adjacent to the functionalized layer 26 along the perimeter sidewall 29, P. In these instances, the functionalized layer 26 along the perimeter sidewall 29, P and the additional sacrificial layer 68 are substantially co-planar in the multi-depth depression 20'. As noted above, however, dry etching does remove some of the functionalized layer 26 from portions of the perimeter sidewall 29, P near the opening of the multi-depth depression 20' to reduce the padlock like conformation 33. As shown in FIG. 5E, the portions 35 of the functionalized layer 26 that remain along the perimeter sidewall 29, P after timed dry etching may still form a minimal padlock like conformation 33. By "minimal padlock like conformation," it is meant that signal interference from the padlock like conformation 33 is 50% or less. In other words, the signals from the nascent strands that are attached to the functionalized layer 24 make up 50% or more of the of the signals that are imaged in the area corresponding to the functionalized layer 24.

Referring specifically to FIG. 5E, the additional insoluble sacrificial layer 68 is removed in a lift-off process. The lift-off process may be performed using any of the suitable organic solvents described herein, which depends on the type of sacrificial layer 68 used.

While not shown, the method shown in FIG. 4A through FIG. 4D and FIG. 5A through FIG. 5E also includes attaching respective primer sets 30, 32 to the functionalized layers 24, 26. In some examples, the primers 34, 36 or 34', 36' (not shown in FIG. 4A through FIG. 4D or FIG. 5A through FIG. 5E) may be pre-grafted to the functionalized layer 24. Similarly, the primers 38, 40 or 38', 40' (not shown in Fig. FIG. 4A through FIG. 4D or FIG. 5A through FIG. 5E) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 4B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 5A); or after the region 53 is removed (FIG. 5B) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 5E, it is to be understood that the method described in reference to FIG. 4A through FIG. 4D and FIG. 5A through FIG. 5E may be performed to generate an array of depressions 20' (each having functionalized layers 24, 26 therein) separated by interstitial regions 22 across the surface of the support 14 or resin layer 18 of the multi-layer structure 16.

Still another method is shown in FIG. 4A through FIG. 4D and continues at FIG. 6A through FIG. 6F. FIG. 6A through FIG. 6F together depict one example of utilizing the at least one additional sacrificial layer 68 (FIG. 6C and FIG. 6D) to define the second functionalized layer 26 adjacent to the portion 25 of the first functionalized layer 24 in the deep portion 48. This example method also includes utilizing the at least one additional sacrificial layer 68 to keep the interstitial regions 22 free of the second functionalized layer 26, and to remove the portion of the second functionalized layer 26 from the perimeter 29, P of the multi-depth depression 20'. As will be discussed further in reference to FIG. 6D, the presence of the additional sacrificial layer 68 within the multi-depth depression 20' allows the second functionalized layer 26 to be removed from the interstitial regions 22 and from a portion of the sidewall 29, P. This reduces the padlock like conformation 33 within the multi-depth depression 20'.

Figure 6A:
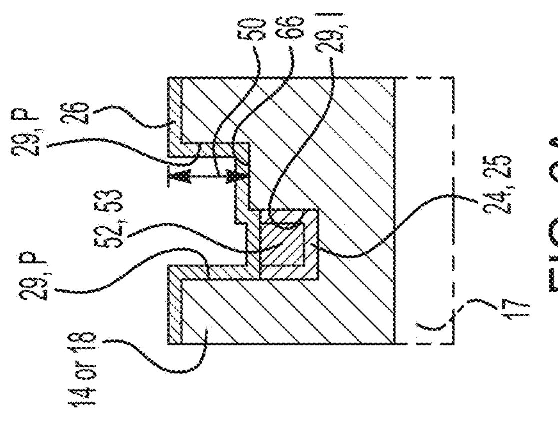
FIG. 6A through FIG. 6F are schematic views that together with FIG. 4A through FIG. 4D depict an example of a method to generate a flow cell surface.
Figure 6B:
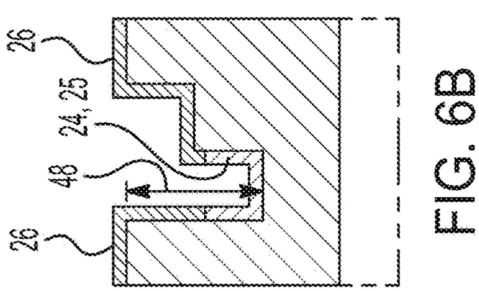
Figure 6C:
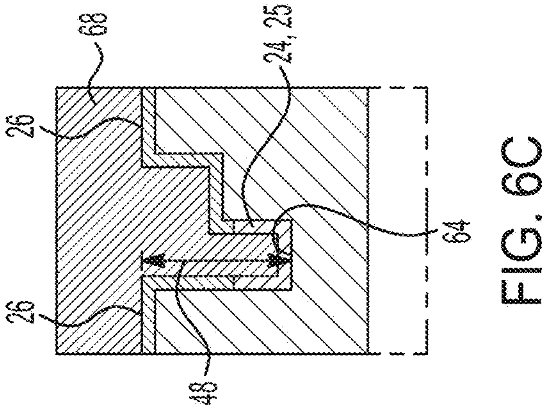
Figure 6D:
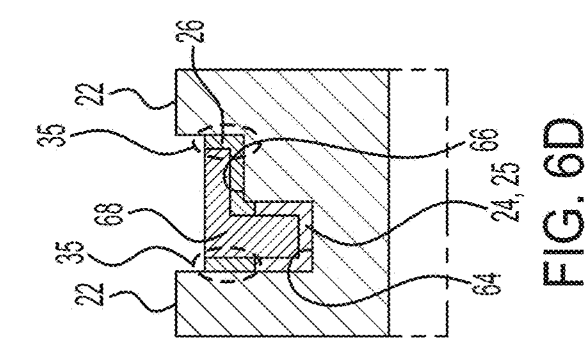
Figure 6E:
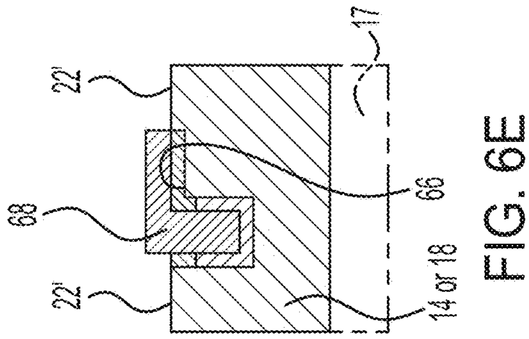
Figure 6F:
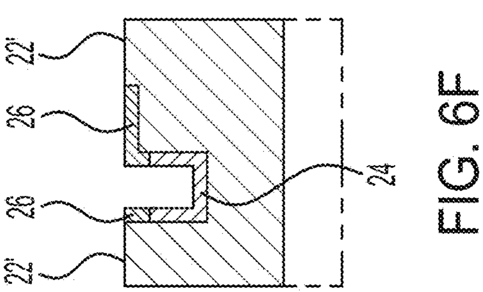

As such, in this example method, utilizing the at least one additional sacrificial layer 68 to define the second functionalized layer 26, to keep the interstitial regions 22 free of the second functionalized layer 26, and to remove the portion of the second functionalized layer 26 from the perimeter 29, P of the multi-depth depression 20' involves depositing the second functionalized layer 26 in the shallow portion 50 and over the region 53 of the sacrificial layer 52 and the interstitial regions 22 (as shown in FIG. 6A); lifting off the region 53 of the sacrificial layer 52, thereby exposing the portion 25 of the first functionalized layer 24 (as shown in FIG. 6B); applying the at least one additional sacrificial layer 68 over the second functionalized layer 26 and over the portion 25 of the first functionalized layer 24 (as shown in FIG. 6C); dry etching the at least one additional sacrificial layer 68 and the second functionalized layer 26 until the second functionalized layer 26 is removed from the interstitial regions 22 and remains in the shallow portion 50 (as shown in FIG. 6D); dry etching the resin layer 14, 18 at the interstitial regions 22 until the interstitial regions (shown at 22') are substantially co-planar with the second functionalized layer 26 in the shallow portion 50 (as shown in FIG. 6E); and lifting off the at least one additional sacrificial layer 68 (as shown in FIG. 6F).

Referring specifically to FIG. 6A, the second functionalized layer 26 is deposited in the shallow portion 50, and over the region 53 of the sacrificial layer 52 and over the interstitial regions 22. As depicted, the second functionalized layer 26 is deposited over portions of the resin layer 14, 18 that are exposed in the shallow portion 50, e.g., the surface 66 and the perimeter sidewall 29, P. It is to be understood that the second functionalized layer 26 may also be deposited over other exposed portions of the perimeter sidewall 29, P as well as the internal wall 29, I.

The second functionalized layer 26 may be any of the gel materials described herein and may be applied using any suitable deposition technique. A curing process, as described herein, may be performed after deposition. The second functionalized layer 26 covalently attaches to the resin layer 14, 18 in the depression 20', including the sidewall 29, P.

Referring specifically to FIG. 6B, the sacrificial layer 52 is removed in a lift-off process. The lift-off process may be performed using any of the suitable organic solvent described herein, which depends, in part, on the type of sacrificial layer 52 used. The lift-off process exposes the portion 25 of the functionalized layer 24 in the deep portion 48.

Referring now to FIG. 6C, the additional sacrificial layer 68 is applied over the second functionalized layer 26 and over the exposed portion 25 of the first functionalized layer 24. In this example, the additional sacrificial layer 68 may be a negative or positive photoresist or poly(methyl methacrylate), and may be applied and cured as described in reference to FIG. 4C so that all of the sacrificial layer 68 remains over the functionalized layers 24, 26.

The additional sacrificial layer 68 is then timed dry etched, using any of the timed dry etching techniques described herein. The result of timed dry etching is depicted in FIG. 6D. This dry etching process is performed for a measured amount of time to expose the interstitial regions 22 and a portion of the perimeter sidewall 29, P. As shown in FIG. 6D, the timed dry etching is stopped so that the functionalized layer 26 remains on the surface 66 in the shallow portion 50. Timed dry etching does remove some of the functionalized layer 26 from portions of the perimeter sidewall 29, P near the opening of the multi-depth depression 20'. This reduces the padlock like conformation 33.

Because the functionalized layer 24 is positioned over the lower surface 64 in the deep portion 48, along the interior wall 29, I (which is lower than the surface 66), and along a portion of the perimeter sidewall 29, P that is lower than the surface 66, the timed dry etching does not affect the functionalized layer 24. Thus, the timed dry etching is stopped so that at least some of the additional sacrificial layer 68 and the underlying functionalized layer 24 remain in an area of the deep portion 48 that is next to the interior wall 29, I. As a result of timed dry etching, the portion 25 of the functionalized layer 24 and the functionalized layer 26 over the surface 66 remain intact.

In some instances, timed dry etching is stopped so that some of the additional sacrificial layer 68 remains over the functionalized layer 26 on the surface 66 and adjacent to the functionalized layer 26 along the perimeter sidewall 29, P. In these instances, the functionalized layer 26 along the perimeter sidewall 29, P and the additional sacrificial layer 68 are substantially co-planar in the multi-depth depression 20'. As noted above, however, dry etching does remove some of the functionalized layer 26 from portions of the perimeter sidewall 29, P near the opening of the multi-depth depression 20' to reduce the padlock like conformation 33. The portions 35 (FIG. 6D) of the functionalized layer 26 that remain along the perimeter sidewall 29, P after timed dry etching may still form the minimal padlock like conformation 33, which exhibit reduced signal interference relative to the padlock like conformation 33. In this example, the minimal padlock like conformation 33 is even further reduced in subsequent processing.

Referring now specifically to FIG. 6E, the resin layer 14, 18 at the interstitial regions 22 is then timed dry etched to form new interstitial regions 22' that are substantially co-planar with the second functionalized layer 26 in (what had been) the shallow portion 50, i.e., the portion of the second functionalized layer 26 on the surface 66. Etching of the resin layer 14, 18 may involve a dry etching process, such as an anisotropic oxygen plasma, a $CF_4$ plasma, or a mixture of 90% $CF_4$ and 10% $O_2$ plasma. It is to be understood that the dry etching of the resin layer 14, 18 shown in FIG. 6E may use the same ions as the dry etching of the sacrificial layer 68 shown in FIG. 6D at a different ratio. The dry etching process shown in FIG. 6E removes the perimeter sidewall 29, P, and thus, may also remove at least some of the portions 35 of the functionalized layer 26 that remained along the perimeter sidewall 29, P after the timed dry etching process of FIG. 6D. The portions 35 of the functionalized layer 26 on the perimeter sidewall 29, P are susceptible to the dry etching process of FIG. 6E, and thus at least some of the portions 35 are removed with the resin layer 14, 18. The removal of the at least some of the portions 35 further reduces the minimal padlock like conformation 33.

Referring specifically to FIG. 6F, the additional sacrificial layer 68 is removed in a lift-off process. The lift-off process may be performed using any of the suitable organic solvents described herein, which depends on the type of sacrificial layer 68 used.

While not shown, the method shown in FIG. 4A through FIG. 4D and FIG. 6A through FIG. 6F also includes attaching respective primer sets 30, 32 to the functionalized layers 24, 26. In some examples, the primers 34, 36 or 34', 36' (not shown in FIG. 4A through FIG. 4D or FIG. 6A through FIG. 6F) may be pre-grafted to the functionalized layer 24. Similarly, the primers 38, 40 or 38', 40' (not shown in FIG. 4A through FIG. 4D or FIG. 6A through FIG. 6F) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 4B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 6A); or after the region 53 is removed (FIG. 6B) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 6F, it is to be understood that the method described in reference to FIG. 4A through FIG. 4D and FIG. 6A through FIG. 6F may be performed to generate an array of depressions 20' (each having functionalized layers 24, 26 therein) separated by interstitial regions 22' across the surface of the resin layer 14, 18.

Still further examples of the method described in FIG. 4A through FIG. 4D continue from FIG. 4D to FIG. 7A through FIG. 7D. Different examples of these methods then continue from FIG. 7D to FIG. 7E through FIG. 7F, or from FIG. 7D to FIG. 7G, or from FIG. 7D to FIG. 7H through FIG. 7L. In all of these examples of the method, the resin layer 18 is positioned on a base support 17 (as shown in phantom in FIG. 4A). It is to be understood that in these examples of the method, the multi-layer structure 16 is used (i.e., the resin layer 18 positioned on the base support 17), even though the base support 17 is shown in phantom in FIG. 4A. In these examples of the method, patterning the first functionalized layer 24 involves applying a sacrificial layer 52 over the first functionalized layer (as shown in FIG. 4C); and dry etching the sacrificial layer 52 and the portions of the first functionalized layer 24 in the shallow portion 50 and over the interstitial regions 22 (as shown in FIG. 4D). It is to be understood that in the methods shown, in part, in FIG. 7E through FIG. 7F or FIG. 7G, the resin layer 18 is positioned on the base support 17 which does not include surface groups to covalently attach the second functionalized layer 26. In contrast, in the method shown, in part, in FIG. 7H through FIG. 7L, the base support 17 may or may not include surface groups that are capable of covalently attaching to the second functionalized layer 26, as the base support 17 is covered by a third photoresist during the application of the second functionalized layer 26.

Figures 7A, 7B, 7C, 7D, 7E, 7F:
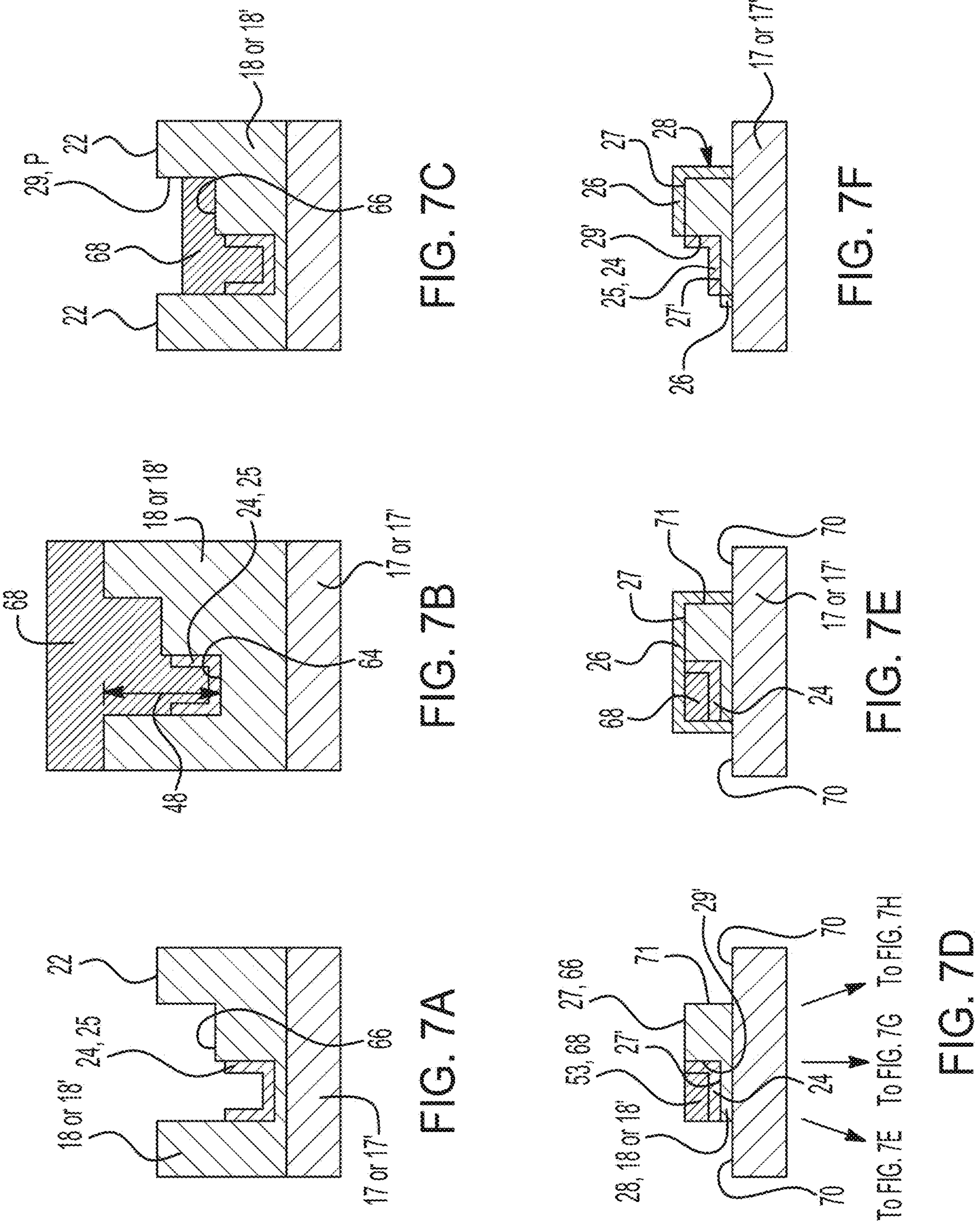
FIG. 7A through FIG. 7F are schematic views that together with FIG. 4A through FIG. 4D depict an example of a method to generate a flow cell surface.
Figure 7I:
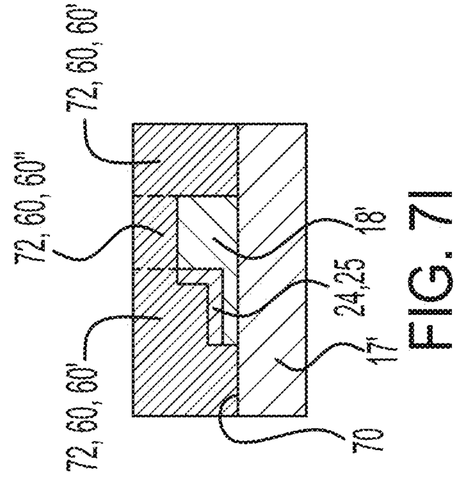
Figure 7H:
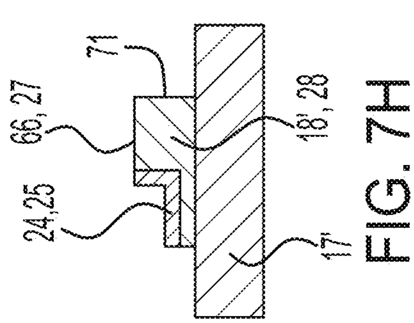
Figure 7G:
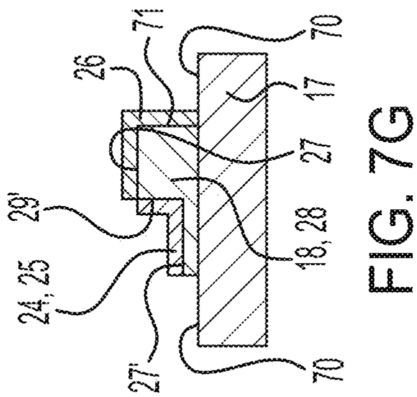

FIG. 7A through FIG. 7D together with either FIG. 7E and FIG. 7F or FIG. 7G depict utilizing the at least one additional sacrificial layer 68 (as shown in FIG. 7B) to define the second functionalized layer 26 adjacent to the portion 25 of the first functionalized layer 24 in the deep portion 48 (shown in FIG. 7A). The utilizing of the at least one additional sacrificial layer 68 involves lifting off the region 53 of the sacrificial layer 52, thereby exposing the portion 25 of the first functionalized layer 24 (shown in FIG. 7A); applying the at least one additional sacrificial layer 68 over the portion 25 of the first functionalized layer 24 and the resin layer 18 (shown in FIG. 7B); dry etching the at least one additional sacrificial layer 68 to expose the interstitial regions 22 and to remove at least some of the at least one additional sacrificial layer 68 from each multi-depth depression 20' (shown in FIG. 7C); sequentially dry etching the resin layer 18 and the at least one additional sacrificial layer 68 to respectively expose a surface 70 of the base support 17 underlying the interstitial regions 22 and a surface 66 of the resin layer 18 at the shallow portion 50 (shown in FIG. 7D); and depositing the second functionalized layer 26 over the exposed surface 66 of the resin layer 18, whereby the second functionalized layer 26 does not adhere to the exposed surface 70 of the base support 17 (which will be described in further detail in reference to either FIG. 7E and FIG. 7F, or FIG. 7G).

Referring now specifically to FIG. 7A, the sacrificial layer 52 (shown in FIG. 4D) is removed in a lift-off process. The lift-off process may be performed using any of the suitable organic solvents described herein, which depends on the type of sacrificial layer 52 used. The lift-off process exposes the portion 25 of the first functionalized layer 24.

Referring now specifically to FIG. 7B, the at least one additional sacrificial layer 68 is applied over the exposed portion 25 of the first functionalized layer 24 and the resin layer 18. In this example, the additional sacrificial layer 68 may be a negative or positive photoresist or poly(methyl methacrylate), and may be applied and cure as described in reference to FIG. 4C.

Referring now to FIG. 7C, the additional sacrificial layer 68 is then timed dry etched, using any of the timed dry etching techniques described herein for the sacrificial layer 52 or 68. The result of time dry etching is depicted in FIG. 7C. This dry etching process is performed for a measured amount of time to expose the interstitial regions 22 and a portion of the perimeter sidewall 29, P. As shown in FIG. 7C, the timed dry etching is stopped so that some of the additional sacrificial layer 68 remains over the surface 66 of the resin layer 18. This will protect the surface 66 and the underlying resin layer 18 when other portions of the resin layer 18, e.g., at the interstitial regions 22, are removed.

FIG. 7D illustrates a protrusion 28 that is formed by sequentially dry etching the resin layer 18 and the at least one additional sacrificial layer 68. In performing the sequential dry etching processes, first the resin layer 18 at the interstitial regions 22 is dry etched until the interstitial regions 22 are removed to expose a surface 70 of the base support 17. In this example, the base support 17 acts as an etch stop. The dry etch of these portions of the resin layer 18 eliminates the multi-depth depression 20' and forms the protrusion 28. Without the portions of the resin layer 18 that define the perimeter sidewall 29, P, the padlock like conformation 33 within the multi-depth depression 20' cannot be generated. The protrusion 28 includes a top surface 27 (which may correspond with the surface 66 of the multi-depth depression 20' located at the shallow portion 50), a lower surface 27' (which may correspond with the surface 64 of the multi-depth depression 20' located at the deep portion 48), and a sidewall 29' (which may correspond with the interior wall 29, I of the multi-depth depression 20') separating the surfaces 27, 27'.

The resin layer 18 may be dry etched using any of the examples set forth herein specifically for the resin layer 14, 18.

After the resin layer 18 is etched away to expose the base support surface 70, the at least one additional sacrificial layer 68 is then timed dry etched using any of the timed dry etching techniques described herein. This dry etching process is performed for a measured amount of time to expose the surface 66, which was in/at the shallow portion 50 when the multi-depth depression 20' was present. This surface 66 or an area of the resin layer 18 directly underlying this surface 66 becomes the top (or outermost) surface 27 of the protrusion 28.

From FIG. 7D, one example of the method continues to FIG. 7E through FIG. 7F. In the example method depicted in FIG. 7E and FIG. 7F, depositing the second functionalized layer 26 over the exposed surface 66 of the resin layer 18 (i.e., surface 27 of the protrusion 28) also deposits the second functionalized layer 26 over the at least one additional sacrificial layer 68 (shown in FIG. 7E); and the method further comprises lifting off the at least one additional sacrificial layer 68 to expose the portion 25 of the first functionalized layer 24 (shown in FIG. 7F).

In this example, the second functionalized layer 26 may be any of the gel materials described herein and may be applied using any suitable deposition technique. A curing process, as described herein, may be performed after deposition. As shown in FIG. 7E, the second functionalized layer 26 is applied over the resin layer 18 at the top surface 27 of the protrusion 28, and over the at least one additional sacrificial layer 68, but is not applied over the surface 70 of the base support 17. The second functionalized layer 26 covalently attaches to the resin layer 18 at the top surface 27 of the protrusion 28, and can also covalently attach to other exposed surfaces 71 (e.g., exterior sidewalls) of the resin layer 18/protrusion 28. The second functionalized layer 26 may or may not covalently attach to the at least one sacrificial layer 68. The functionalized layer 26 does not covalently attach to the exposed surface 70 of the base support 17, as the base support 17 in this example does not have surface groups for the functionalized layer 26 to attach to. Because of the different interactions at the surface(s) 27, 71 of the resin layer 18 and at the surface 70 of the base support 17, the functionalized layer 26 remains over the surface(s) 27, 71 and along exterior sidewalls 71, and can be easily removed (e.g., via sonication, washing, wiping, etc.) from the surface 70. This reduces the padlock like conformation 33 such that signal interference from the second functionalized layer 26 adjacent to the surface 27' is expected to be less than 10%.

Referring specifically now to FIG. 7F, the at least one additional sacrificial layer 68 is lifted off to expose the portion 25 of the first functionalized layer 24. The lift-off process may be performed using any of the suitable organic solvents described herein, which depends on the type of sacrificial layer 68 used. This lift-off process removes the additional sacrificial layer 68 as well as the second functionalized layer 26 that may be positioned on the additional sacrificial layer 68.

As depicted in FIG. 7F, a sidewall 29' is positioned between the top surface 27 and the lower surface 27' of the protrusion 28. This sidewall 29' corresponds with at least a portion of the interior wall 29, I of the multi-depth depression 20' and may have the first functionalized 24 covalently attached thereto.

While not shown, the method shown in FIG. 4A through FIG. 4D and FIG. 7A through FIG. 7F also includes attaching respective primer sets 30, 32 to the functionalized layers 24, 26. In some examples, the primers 34, 36 or 34', 36' (not shown in FIG. 4A through FIG. 4D or FIG. 7A through FIG. 7F) may be pre-grafted to the functionalized layer 24. Similarly, the primers 38, 40 or 38', 40' (not shown in FIG. 4A through FIG. 4D or FIG. 7A through FIG. 7F) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 4B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 7E); or after the at least one additional sacrificial layer 68 is lifted off (FIG. 7F) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 7F, it is to be understood that the method described in reference to FIG. 4A through FIG. 4D and FIG. 7A through FIG. 7F may be performed to generate an array of protrusions 28 (each having functionalized layers 24, 26 thereon) across the base support 17, where the protrusions 28 are separated by the exposed surface 70 of the base support 17.

Referring back to FIG. 7D, another example of the method continues to FIG. 7G. In this example, prior to depositing the second functionalized layer 26, the method further comprises lifting off the at least one additional sacrificial layer 68 to expose the portion 25 of the first functionalized layer 24; and wherein depositing the second functionalized layer 26 over the exposed surface 66 of the resin layer 18 involves a selective deposition process.

In this example method, the at least one additional sacrificial layer 68 is lifted off to expose the portion 25 of the first functionalized layer 24 (FIG. 7G). The lift-off process may be performed using any of the suitable organic solvents described herein, which depends on the type of sacrificial layer 68 used. As depicted in FIG. 7G, the first functionalized layer 24 is positioned over the lower surface 27' as well as the sidewall 29' of the protrusion 28.

In this example, after the additional sacrificial layer 68 is removed, the second functionalized layer 26 is selectively deposited. The second functionalized layer 26 may be any of the gel materials described herein and may be applied using any suitable deposition technique under high ionic strength conditions (e.g., in the presence of 10×PBS, NaCl, KCl, etc.). A curing process, as described herein, may be performed after deposition.

When the deposition of the gel material of the functionalized layer 26 is performed under high ionic strength, the second functionalized layer 26 does not deposit on or adhere to the first functionalized layer 24. As such, the second functionalized layer 26 does not contaminate the first functionalized layer 24.

The second functionalized layer 26 does attach to the exposed surfaces (e.g., 27, 71) of the resin layer 18, which has surface groups capable of attaching to the second functionalized layer 26.

The second functionalized layer 26 does not attach to the exposed surface 70 of the base support 17, as the base support 17 does not have surface groups for the functionalized layer 26 to attach to, as described above.

While not shown, the method shown in FIG. 4A through FIG. 4D, FIG. 7A through FIG. 7D and FIG. 7G also includes attaching respective primer sets 30, 32 to the functionalized layers 24, 26. In some examples, the primers 34, 36 or 34', 36' (not shown in FIG. 4A through FIG. 4D, FIG. 7A through FIG. 7D and FIG. 7G) may be pre-grafted to the functionalized layer 24. Similarly, the primers 38, 40 or 38', 40' (not shown in FIG. 4A through FIG. 4D, FIG. 7A through FIG. 7D and FIG. 7G) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 4B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 7G) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 7G, it is to be understood that the method described in reference to FIG. 4A through FIG. 4D, FIG. 7A through FIG. 7D and FIG. 7G may be performed to generate an array of protrusions 28 (each having functionalized layers 24, 26 thereon) across the base support 17, where the protrusions 28 are separated by the exposed surface 70 of the base support 17.

Figure 7L:
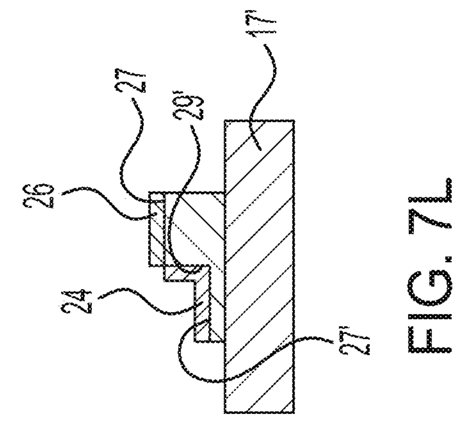
Figure 7K:
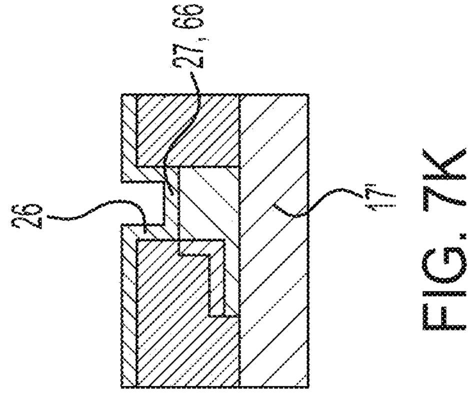
Figure 7J:
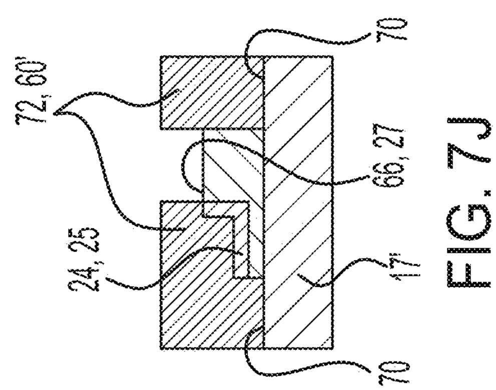

The method shown in FIG. 4A through FIG. 4D, FIG. 7A through FIG. 7D, and FIG. 7H through FIG. 7L utilizes two additional sacrificial layers 68 (as shown in FIG. 7B) and 72, 60' (as shown in FIG. 7J). In this example, the additional sacrificial layer 72, 60' is a negative photoresist. In this example of the method, the base support 17' and the resin layer 18' are utilized. As described herein, the base support 17' is a UV transmitting material, and thick and thin portions of the resin layer 18' are adjusted to achieve the desired UV absorption (at thicker portions) and UV transmittance (at thinner portions). The UV transmitting materials may be any of the UV transmitting materials described herein, providing the base support 17' allows a dosage of ultraviolet light to be transmitted through the material and the thickness of the resin layer 18' can be adjusted to be transparent or absorbing. Additionally, in these examples, the base support 17' may or may not include surface groups to covalently attach to the functionalized layers 24, 26, as the base support 17' is not exposed during the deposition of either the first functionalized layer 24 (see FIG. 4B) or the second functionalized layer 26 (see FIG. 7K).

The portion of the method depicted in FIG. 4A through FIG. 4D may be performed as described herein. The method continues at FIG. 7A through FIG. 7D and then at FIG. 7G through FIG. 7L. In this example, utilizing the at least one additional sacrificial layer 68 to define the second functionalized layer 26 involves lifting off the region 53 of the sacrificial layer 52, thereby exposing the portion 25 of the first functionalized layer 24 (shown in FIG. 7A); applying a first of the at least one additional sacrificial layer 68 over the portion 25 of the first functionalized layer 24 and the resin layer 18 (shown in FIG. 7B); dry etching the first of the at least one additional sacrificial layer 68 to expose the interstitial regions 22 and to remove at least some of the first of the at least one additional sacrificial layer 68 from each multi-depth depression 20' (shown at FIG. 7C); sequentially dry etching the resin layer 18 and the first of the at least one additional sacrificial layer 68 to respectively expose a surface 70 of the base support 17' underlying the interstitial regions 22 and a surface 66 of the resin layer 18' at the shallow portion 50 (shown in FIG. 7D); lifting off the at least one additional sacrificial layer 68 to expose the portion 25 of the first functionalized layer 24 (shown in FIG. 7H); applying a second of the at least one additional sacrificial layer 72 over the portion 25 of the first functionalized layer 24, the exposed surface 70 of the base support 17', and the exposed surface 66 of the resin layer 18' wherein the second of the at least one additional sacrificial layer 72 is a negative photoresist (shown in FIG. 7I); directing, through the base support 17', an ultraviolet light dosage, thereby forming an insoluble negative photoresist 60' over the portion 25 of the first functionalized layer 24 and the exposed surface 70 of the base support 17' and a soluble negative photoresist 60" over the exposed surface 66 of the resin layer 18 at the shallow portion 50 (also shown in FIG. 7I); removing the soluble negative photoresist 60" such that the exposed surface 66 of the resin layer 18' (e.g., top surface 27 of the protrusion 28) remains exposed (shown in FIG. 7J); depositing the second functionalized layer 26 over the exposed surface 66 of the resin layer 18' and the insoluble negative photoresist 60' (shown in FIG. 7K); and lifting off the insoluble negative photoresist 60' (shown in FIG. 7L).

The portions of this example of the method depicted in FIG. 7A through FIG. 7D may be performed as described herein.

Referring now to FIG. 7H, the additional sacrificial layer 68 is lifted off to expose the portion 25 of the first functionalized layer 24. The lift-off process may be performed using any of the suitable organic solvents described herein, which depends on the type of sacrificial layer 68 used.

FIG. 7I depicts the deposition of the second of the at least one additional sacrificial layer 72 over the portion 25 of the first functionalized layer 24, the exposed surface 66 of the resin layer 18', and the surface 70 of the base support 17'. The second of the at least one additional sacrificial layer 72 is a negative photoresist, and can be any of the negative photoresists described herein. The negative photoresist may be applied using any suitable technique. To develop the negative photoresist, an ultraviolet light dosage is directed through the base support 17' and the resin layer 18'. The thicker resin portion(s) (e.g., the portion that defines the surfaces 66, 27) blocks at least 75% of light that is transmitted through the base support 17' and the resin layer 18' from reaching the third (negative) photoresist 72 that is positioned directly in line with the thicker resin portions. As such, these portions become the soluble negative photoresist 60". The soluble portions are removed, e.g., with the developer, to re-expose the surface 66, 27. In contrast, the UV light is able to transmit through the base support 17' and the thinner resin portions (to which the first functionalized layer 24 is attached). Thus, portions of the negative photoresist (third additional sacrificial layer 72) in direct contact with the surface 70' and over the first functionalized layer 24 become insoluble. FIG. 7J depicts the negative insoluble photoresist 60' that is formed over the portion 25 of the first functionalized layer 24 as well as the surface 70 of the base support 17' after development of the third photoresist 72.

Referring now to FIG. 7K, the second functionalized layer 26 is deposited over the exposed surface 66 of the resin layer 18' and the negative insoluble photoresist 60'. The second functionalized layer 26 may be any of the gel materials described herein and may be applied using any suitable technique described herein. A curing process, as described herein, may be performed after deposition. The second functionalized layer 26 covalently attaches to the resin layer 18' at the surface 66 (surface 27 of the protrusion 28).

FIG. 7K depicts the lift-off of the negative insoluble photoresist 60'. The lift-off process may be performed using any suitable removers for the negative photoresists described herein.

The lift-off process removes i) at least 99% of the negative insoluble photoresist 60' and ii) the functionalized layer 26 positioned thereon. The negative insoluble photoresist 60' is lifted off to expose the portion 25 of the first functionalized layer 24, shown in FIG. 7K.

The resulting protrusion 28 includes the functionalized layers 24, 26 on the surfaces 27', 27. As depicted in FIG. 7K, a sidewall 29' is positioned between the top surface 27 and the lower surface 27' of the protrusion 28. This sidewall 29' corresponds with at least a portion of the interior wall 29, I of the multi-depth depression 20' and may have the first functionalized 24 covalently attached thereto.

While not shown, the method shown in FIG. 4A through FIG. 4D, FIG. 7A through FIG. 7D and FIG. 7H through FIG. 7L also includes attaching respective primer sets 30, 32 to the functionalized layers 24, 26. In some examples, the primers 34, 36 or 34', 36' (not shown in FIG. 4A through FIG. 4D, FIG. 7A through FIG. 7D and FIG. 7H through FIG. 7L) may be pre-grafted to the functionalized layer 24. Similarly, the primers 38, 40 or 38', 40' (not shown in FIG. 4A through FIG. 4D, FIG. 7A through FIG. 7D and FIG. 7H through FIG. 7L) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 4B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 7K); or after the negative insoluble photoresist 60' is removed as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 7L, it is to be understood that the method described in reference to FIG. 4A through FIG. 4D, FIG. 7A through FIG. 7D and FIG. 7H through FIG. 7L may be performed to generate an array of protrusions 28 (each having functionalized layers 24, 26 thereon) across the base support 17', where the protrusions 28 are separated by the exposed surface 70 of the base support 17'.

Figures 8A, 8B, 8C, 8D, 8E, 8F, 8G:
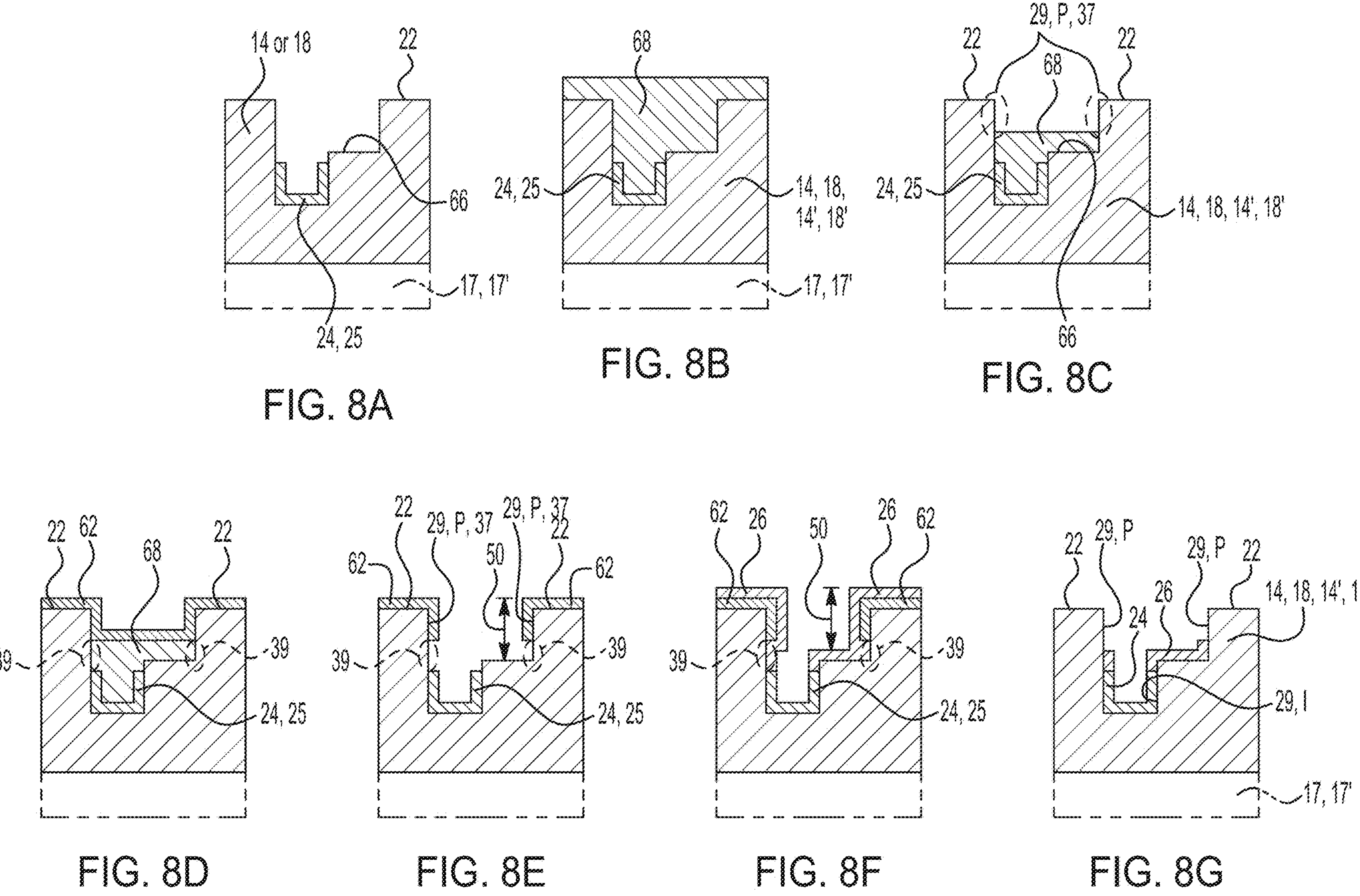
FIG. 8A through FIG. 8G are schematic views that together with FIG. 4A through FIG. 4D depict an example of a method to generate a flow cell surface.

Another example of the method continues from FIG. 4A through FIG. 4D at FIG. 8A to FIG. 8G. As discussed herein, the portion of the method described in reference to FIG. 4A through FIG. 4D generates the portion 25 of the functionalized layer 24 in the deep portion 48, which is covered by the region 53 of the sacrificial layer 52. This example method continues at FIG. 8A and includes utilizing the at least one additional insoluble sacrificial layer 68 to define the second functionalized layer 26, which involves: lifting off the region 53 of the sacrificial layer 52, thereby exposing the portion 25 of the first functionalized layer 24 (FIG. 8A); applying the at least one additional sacrificial layer 68 over the portion 25 of the first functionalized layer 24 and the resin layer 14, 14', 18, 18' (FIG. 8B); dry etching the at least one additional sacrificial layer 68 to expose the interstitial regions 22 and to remove at least some of the at least one additional sacrificial layer 68 from each multi-depth depression 20' (FIG. 8C); depositing a metal film 62 over the interstitial regions 22 and the at least one additional sacrificial layer 68 (FIG. 8D); lifting off the at least one additional sacrificial layer 68, thereby exposing the portion 25 of the first functionalized layer 24 and the resin layer 14, 14', 18, 18' at the shallow portion 50, and whereby the metal film 62 remains intact over the interstitial regions 22 and on at least a portion 37 of the sidewall 29, P of each multi-depth depression 20' (FIG. 8E); depositing the second functionalized layer 26 over the metal film 62 and the resin layer 14, 14', 18, 18' at the shallow portion 50 (FIG. 8F); and etching the metal film 62 from the interstitial regions 22 and the portion 37 of the sidewall 29, P of each multi-depth depression 20' (as shown in FIG. 8G).

Referring specifically to FIG. 8A, the region 53 of the sacrificial layer 52 is lifted off to expose the portion 25 of the first functionalized layer 24. The first sacrificial layer 52 may be lifted off using any suitable technique described herein, and any suitable remover. The lift-off process and remover will depend, in part, on what type of material is used as the sacrificial layer 52.

Referring specifically to FIG. 8B, the at least one additional sacrificial layer 68 is then applied over the portion 25 of the first functionalized layer 24 and the resin layer 14, 14', 18, 18'. In this example, the sacrificial layer 68 may be any example of the negative or positive photoresist disclosed herein or poly(methyl methacrylate). The additional sacrificial layer 68 may be applied using any suitable deposition technique disclosed and exposed to curing.

FIG. 8C depicts the at least one additional sacrificial layer 68 after it has been dry etched to expose the interstitial regions 22 and to remove at least some of the at least one additional sacrificial layer 68 from the multi-depth depression 20'. The dry etching process may be performed as described herein, for example, in reference to FIG. 7B. The dry etching process exposes a portion 37 of the perimeter of the sidewall 29, P, but does not expose the surface 66 or the portion 25 of the functionalized layer 24. As such, the additional sacrificial layer 68 that remains after dry etching covers both the surface 66 and the portion 25 of the functionalized layer 24. Because dry etching is substantially uniform and the surface 66 is not exposed, the additional sacrificial layer 68 that remains will also cover some of the perimeter sidewall 29, P (e.g., portion 39 shown in FIG. 8D). The portion 37 of the perimeter of the sidewall 29, P that is exposed is between the interstitial region 22 and the top of the remaining additional sacrificial layer 68, and ultimately defines the region of the sidewall 29, P where a metal film 62 will be formed to prevent the second functionalized layer 26 from being deposited, which will reduce the padlock like conformation 33. As such, dry etching is controlled (e.g., via time) so that the length of the portion 37 is maximized without exposing the surface 66.

FIG. 8D depicts when the metal film 62 is deposited over the interstitial regions 22 and the at least one additional sacrificial layer 68. Examples of suitable materials for the metal film 62 include semi-metals, such as silicon, or metals, such as aluminum, copper, titanium, gold, silver, etc. In some examples, the semi-metal or metal may be at least substantially pure (<99% pure). In other examples, molecules or compounds of the listed elements may be used. For example, oxides of any of the listed semi-metals (e.g., silicon dioxide) or metals (e.g., aluminum oxide) may be used, alone or in combination with the listed semi-metal or metal. These materials may be deposited using any suitable technique disclosed herein that results in a substantially uniform film, such as chemical vapor deposition (CVD), spray coating (e.g., ultrasonic spray coating), spin coating, etc. A directional coating method may be used, such as sputtering or thermally evaporating, which generates a metal film 62 with varying thicknesses. In these instances, the portion of the metal film 62 on the interstitial regions 22 is thicker than on the portion of the metal film 62 on the sidewalls 29 and on the additional sacrificial layer 68.

Referring now to FIG. 8E, the at least one additional sacrificial layer 68 is removed to expose the resin layer 14, 14', 18, 18' at the shallow portion 50. In one example, the at least one additional sacrificial layer 68 may be lifted off using any suitable technique described herein, depending, in part, on what type of sacrificial material is used for the at least one additional sacrificial layer 68. Lift-off may be used when the portion of the metal layer 62 overlying the additional sacrificial layer 68 is thin. A combination of the organic solvent and agitation may attack the thinner portions of the metal 62, enabling lift-off of both the additional sacrificial layer 68 and the portion of the metal layer 62 thereon. In another example, the portion of the metal layer 62 overlying the additional sacrificial layer 68 and the additional sacrificial layer 68 may be removed sequentially. In this example, the portion of the metal layer 62 overlying the additional sacrificial layer 68 may be anisotropically etched, and then the organic solvent may be used to lift-off the additional sacrificial layer 68. As shown in FIG. 8E, the removal exposes the surface 66, the functionalized layer 24, and other portions 39 of the perimeter sidewall 29, P that are not covered by the metal film 62 and that had been covered by the additional sacrificial layer 68. In contrast, another portion of the metal film 62 remains intact over the interstitial regions 22 and may remain intact on the portion 37 of the perimeter sidewall 29, P of each multi-depth depression 20'.

As shown at FIG. 8E, the removal of the additional sacrificial layer 68 also exposes the portion 25 of the functionalized layer 24.

Referring specifically to FIG. 8F, the second functionalized layer 26 is then deposited over the metal film 62 and the resin layer 14, 14', 18, 18' at the shallow portion 50. As depicted in FIG. 8F, the exposed portions of the resin layer 14, 14', 18, 18', including surface 66 at the shallow portion 50 and portions 39 of the perimeter sidewall 29, P, have the second functionalized layer 26 deposited thereon. The metal film 62 prevents the functionalized layer 26 from adhering to the resin layer 14, 14', 18, 18' at the portion 37 of the perimeter sidewall 29, P. This reduces the padlock like conformation 33.

The second functionalized layer 26 may be any of the gel materials described herein, and may be deposited using any suitable technique under high ionic strength conditions (e.g., in the presence of 10×PBS, NaCl, KCl, etc.) as described herein. When the deposition of the gel material of the functionalized layer 26 is performed under high ionic strength, the second functionalized layer 26 does not deposit on or adhere to the first functionalized layer 24. As such, the second functionalized layer 26 does not contaminate the first functionalized layer 24, as shown in FIG. 8F. A curing process, as described herein, may be performed after deposition.

Referring specifically to FIG. 8G, the metal film 62 is then etched, and thus removed from the interstitial regions 22 and the portion 37 of the perimeter sidewall 29, P of each multi-depth depression 20'. The metal film 62 may be dry or wet etched. The dry etching is performed as described herein, e.g., using reactive ion etching with $BCl_3+Cl_2$. As examples of wet etching, an aluminum metal film 62 can be removed in acidic (e.g., nitric acid based) or basic (e.g., KOH based) conditions, a copper metal film 62 can be removed using $FeCl_3$, a copper, gold or silver metal film 62 can be removed in an iodine and iodide solution, and a silicon metal film 62 can be removed in basic (pH) conditions. The resin layer 14, 14', 18, 18' is not susceptible to the etching process, and thus the resin layer 14, 14', 18, 18' at the interstitial regions 22 and at the portion 37 of the perimeter sidewall 29, P is exposed by the wet etching process and remains intact. The first and second functionalized layers 24, 26 are covalently attached to the resin layer 14, 14', 18, 18', and thus are not affected by the etching process.

The resulting multi-depth depression 20' includes the functionalized layers 24, 26 therein. As depicted in FIG. 8G, the portion 39 of the perimeter sidewall 29, P of the multi-depth depression 20' may have the second functionalized layer 26 covalently attached thereto after metal film 62 removal, which creates the padlock like conformation 33. However, the second functionalized layer 26 on the portion 39 of the perimeter sidewall 29, P is minimized by the metal mask 62 and how much of the sacrificial layer 68 is removed in the timed dry etch.

While not shown, the method shown in FIG. 4A through FIG. 4D and FIG. 8A through FIG. 8G also includes attaching respective primer sets 30, 32 to the functionalized layers 24, 26. In some examples, the primers 34, 36 or 34', 36' (not shown in FIG. 4A through FIG. 4D and FIG. 8A through FIG. 8G) may be pre-grafted to the functionalized layer 24. Similarly, the primers 38, 40 or 38', 40' (not shown in FIG. 4A through FIG. 4D and FIG. 8A through FIG. 8G) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 4B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 8F) or after the metal mask 62 is removed (e.g., at FIG. 8G) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 8G, it is to be understood that the method described in reference to FIG. 4A through FIG. 4D and FIG. 8A through FIG. 8G may be performed to generate an array of depressions 20' (each having functionalized layers 24, 26 therein) across the surface of the resin layer 14, 14', 18, 18'.

Another example method is shown in FIG. 9A through FIG. 9H, and this method generally includes: forming a metal film 62 on at least a portion of a sidewall 29, P of each of a plurality of multi-depth depressions 20' defined in a resin layer 14, 14', 18, 18' and separated by interstitial regions 22 (FIG. 9A), wherein each multi-depth depression 20' includes a deep portion 48 and a shallow portion 50 adjacent to the deep portion 48 and wherein at least some of a bottom surface 64, 66 of each multi-depth depression 20' is free of the metal film 62; depositing a first functionalized layer 24 over each of the multi-depth depressions 20' and the interstitial regions 22 (FIG. 9B); patterning the first functionalized layer 24, whereby a portion 25 of the first functionalized layer 24 in the deep portion 48 is covered by a region 53 of a sacrificial layer 52 and portions of the first functionalized layer 24 in the shallow portion 50, over the metal film 62, and over the interstitial regions 22 are removed (FIG. 9D); depositing a second functionalized layer 26 over the interstitial regions 22, over the metal film 62, over the region 53 of the sacrificial layer 52, and in the shallow portion 50 (FIG. 9E); lifting off the region 53 of the sacrificial layer 52, thereby exposing the portion 25 of the first functionalized layer 24 (FIG. 9F); wet etching the metal film 62, thereby removing the second functionalized layer 26 positioned over the metal film 62 (FIG. 9G); and polishing the interstitial regions 22, whereby the portion 25 of the first functionalized layer 24 in the deep portion 48 and the second functionalized layer 26 in the shallow portion 50 remain intact.

Figures 9A, 9B, 9C, 9D, 9E, 9F, 9G, 9H:
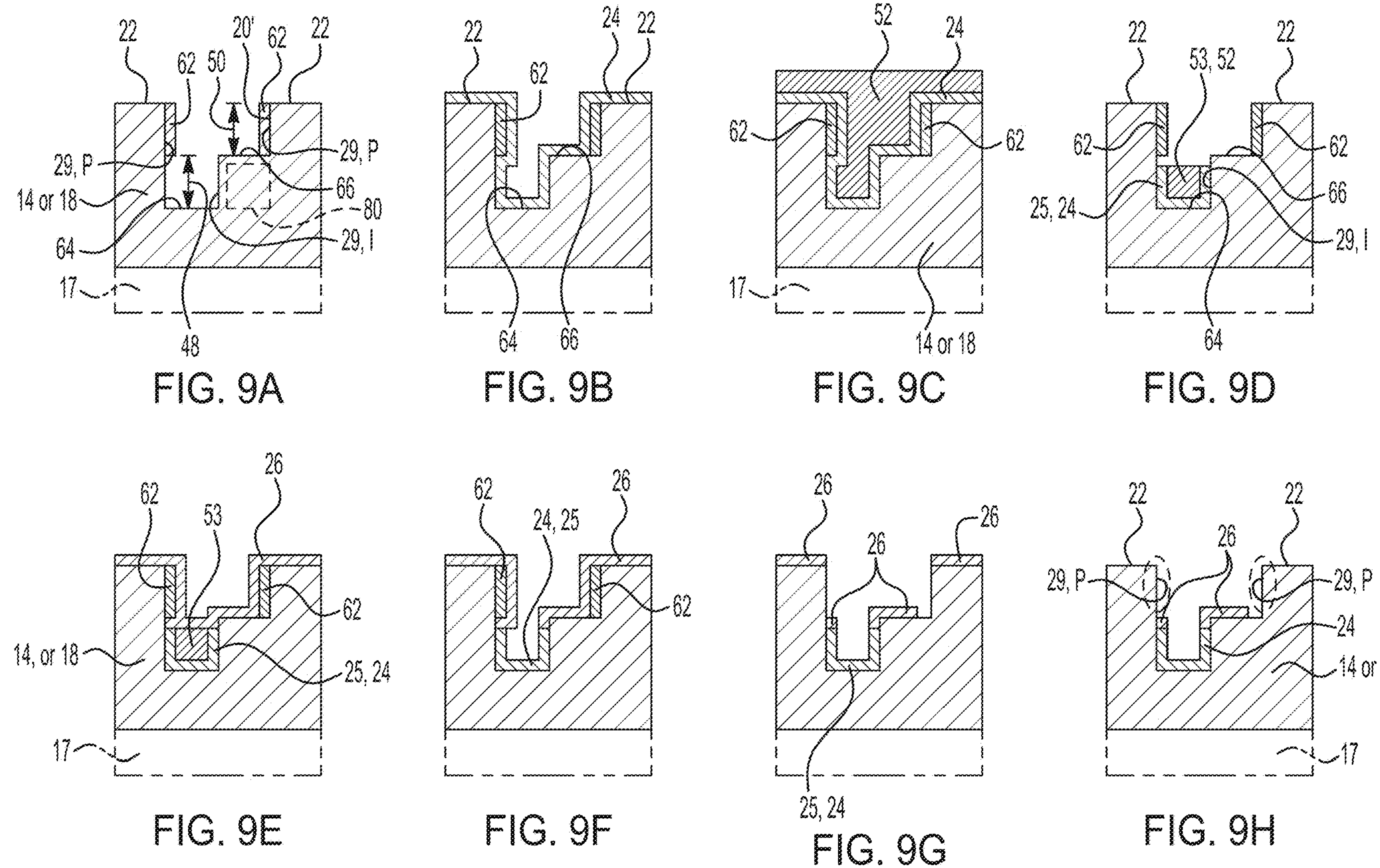
FIG. 9A through FIG. 9H are schematic views that depict another example of a method to generate a flow cell surface.

FIG. 9A depicts the application of a metal film 62 to at least a portion of the perimeter sidewall 29, P of the multi-depth depression 20'. In this example, the portion of the perimeter sidewall 29, P that is covered by the metal film 62 is between the interstitial region 22 and the surface 66. Around the perimeter sidewall 29, P, the length of the metal film 62 is the same as the depth of the shallow portion 50. It is to be understood that the bottom surface 64 of the depression 20' is free of the metal film 62, and the bottom surface 66 of the depression 20' is free of the metal film 62 except at the intersection of the surface 66 and the perimeter sidewall 29, P.

While not shown, the metal film 62 shown in FIG. 9A may be formed using yet another sacrificial layer. In this example, the sacrificial layer is deposited on the resin layer 14, 18 and cured. The sacrificial layer may then be etched back so that the sacrificial layer remains in the deep portion 48 adjacent to the step feature 80, and so that the surface 66 has a thin layer of the sacrificial layer thereon. The metal film 62 may then be applied using a directional coating method. This would result in a metal film 62 on the interstitial regions 22, on the sidewalls 29, and on the sacrificial layer. Anisotropic etching may then be used to remove the metal film 62 from the interstitial regions 22 and from the sacrificial layer, and then the sacrificial layer may be removed using a suitable organic solvent. The metal film 62 remains on the sidewalls 29 as shown in FIG. 9A. Alternatively, the metal film 62 could be conformally coated using sputtering, and anisotropic etching could be used to remove the metal film 62 from desired areas.

FIG. 9B depicts the deposition of a first functionalized layer 24 over the multi-depth depression 20' and the interstitial regions 22. The functionalized layer 24 may be any of the gel materials described herein and may be applied using any suitable deposition technique. A curing process may be performed after deposition. The functionalized layer 24 covalently attaches to the exposed surfaces of the resin layer 14, 14' or to the exposed surfaces of the resin layer 18, 18'. When the resin layer 14, 14' is used, the applied functionalized layer 24 is positioned over the metal film 62 and over exposed surfaces of the resin layer 14, 14', including over the surface 64 of the deep portion 48, the surface 66 of the shallow portion 50, and the interstitial regions 22. When the multi-layer structure 16 is used, the applied functionalized layer 24 is positioned over the metal film 62 and over the exposed surfaces of the resin layer 18, 18', including over the exposed surface 64 of the deep portion 48, the surface 66 of the shallow portion 50, and the interstitial regions 22.

The first functionalized layer 24 is then patterned. In an example, patterning the first functionalized layer 24 involves: applying a sacrificial layer 52 over the first functionalized layer 24; and dry etching the sacrificial layer 52 and the portions of the first functionalized layer 24 in the shallow portion 50 and over the interstitial regions 22.

FIG. 9C depicts the deposition of the sacrificial layer 52. The sacrificial layer 52 may be any of the photoresists described herein, i.e., a positive photoresist 56 or a negative photoresist 60, or poly(methyl methacrylate). The sacrificial layer 52 may be applied using any suitable deposition technique disclosed herein and then may be exposed to curing.

FIG. 9D depicts the remaining region 53 of the sacrificial layer 52 and the portion 25 of the functionalized layer 24 after a dry etch process, which exposes the metal film 62, the surface 66 at the shallow portion 50, and the interstitial regions 22. This dry etching may be performed by any suitable technique described herein (e.g., in reference to FIG. 4D). The dry etching process removes the sacrificial layer 52 from the multi-depth depression 20' at the shallow portion 50, and also removes the sacrificial layer 52 from the interstitial regions 22. The metal film 62 remains intact over the portion of the sidewall 29, P. The remaining sacrificial layer 52 forms the region 53 that remains in the deep portion 48, as shown in FIG. 9D. The region 53 of the sacrificial layer 52 is directly over, i.e. covers, the portion 25 of the first functionalized layer 24 in the deep portion 48.

This dry etching process may be performed for a measured amount of time to expose the surface 66. In these instances, the region 53 of the sacrificial layer 52 and underlying functionalized layer 24 remain in the portion of the deep portion 48 that is next to the interior wall 29, I. As such, the remaining sacrificial layer 52, 53 is at least substantially co-planar with the surface 66 at the shallow portion 50, and the perimeter sidewall 29, P adjacent to the deep portion 48 is not exposed. Alternatively, this dry etching process may be performed to extend deeper than the surface 66. In these instances, some of the region 53 of the sacrificial layer 52 and underlying functionalized layer 24 are removed such that some of the perimeter sidewall 29, P adjacent to the deep portion 48 and some of the interior sidewall 29, I are exposed. This exposure is shown in FIG. 9D.

FIG. 9E depicts the second functionalized layer 26 deposited over the interstitial regions 22, over the metal film 62, over the region 53 of the sacrificial layer 52, and on the surface 66 in the shallow portion 50. The second functionalized layer 26 (e.g., the gel material that forms the second functionalized layer 26) may be applied using any suitable deposition technique. When the perimeter sidewall 29, P adjacent to the deep portion 48 is not exposed as a result of dry etching, the second functionalized layer 26 does not deposit over the perimeter sidewall 29, P adjacent to the deep portion 48. In this example, the padlock like conformation 33 is eliminated. Alternatively, when the perimeter sidewall 29, P adjacent to the deep portion 48 is partially exposed as a result of dry etching, the second functionalized layer 26 may deposit over the perimeter sidewall 29, P adjacent to the deep portion 48 and the interior sidewall 29, I due to covalent attachment to the exposed resin layer 14, 14', 18, 18'. In this example, the padlock like conformation 33 is reduced.

The second functionalized layer 26 does not contaminate the portion of first functionalized layer 24, which is covered by the region 53 of the sacrificial layer 52.

FIG. 9F depicts the removal of the region 53 of the sacrificial layer 52. The region 53 of the sacrificial layer 52 is removed through a lift-off process. The lift-off process may be any suitable lift-off process described herein that involves any suitable organic solvent, which depends, in part, on the type of sacrificial layer 52 used. The lift-off process removes i) at least 99% of the sacrificial layer 52 and ii) the functionalized layer 26 positioned thereon. The sacrificial layer 52 is lifted off to expose the portion 25 of the first functionalized layer 24, shown in FIG. 9F.

FIG. 9G depicts the removal of the metal film 62. In an example, the removal of the metal film 62 may involve a wet etching or lift-off process, which depends upon the material of the metal film 62. As examples, an aluminum metal film 62 can be removed in acidic or basic conditions, a copper metal film 62' can be removed using $FeCl_3$, a copper, gold or silver metal film 62 can be removed in an iodine and iodide solution, and a silicon metal film 62 can be removed in basic (pH) conditions. The removal of the metal film 62 also removed the second functionalized layer 26 thereon and exposes the sidewall 29, P of the multi-depth depression 20'.

In FIG. 9H, the functionalized layer 26 that is positioned over the interstitial regions 22 is removed, e.g., using a polishing process. The polishing process may be performed with a chemical slurry (including, e.g., an abrasive, a buffer, a chelating agent, a surfactant, and/or a dispersant) which can remove the functionalized layer 26 from the interstitial regions 22 without deleteriously affecting the underlying resin layer 14, 14', 18, 18' at those regions 22. Alternatively, polishing may be performed with a solution that does not include the abrasive particles.

The chemical slurry may be used in a chemical mechanical polishing system to polish the surface of the interstitial regions 22. The polishing head(s)/pad(s) or other polishing tool(s) is/are capable of polishing the functionalized layer 26 that may be present over the interstitial regions 22 while leaving the functionalized layers 24, 26 in the depression(s) 20' at least substantially intact. As an example, the polishing head may be a Strasbaugh ViPRR II polishing head.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

As depicted in FIG. 9H, the functionalized layer 24 is positioned in the deep portion 48 of the multi-depth depression 20' and the functionalized layer 26 is positioned on the surface 66 in the shallow portion 50 and the adjacent portion of the perimeter 29, P along the deep portion 48. As such, the padlock like conformation 33 is reduced, or in some instances eliminated, depending, in part, on how much of the portion of the sidewall 29, P is covered by the metal film 62 and whether dry etching is extended deeper than the surface 66.

While not shown, the method of FIG. 9A through FIG. 9H also includes attaching respective primer sets 30, 32 to the functionalized layers 24, 26. In some examples, the primers 34, 36 or 34', 36' (not shown in FIG. 9A through FIG. 9H) may be pre-grafted to the functionalized layer 24. Similarly, the primers 38, 40 or 38', 40' (not shown in FIG. 9A through FIG. 9H) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 9B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, in some instances, the primers 38, 40 or 38', 40' may be grafted immediately after the second functionalized layer 26 is applied (e.g., at FIG. 9E). In other instances, the primers 38, 40 or 38', 40' may be grafted after the portion 53 of the sacrificial layer 52 is removed (e.g., at FIG. 9F) or after the metal film 62 has been removed (e.g., at FIG. 9G) or after the interstitial regions 22 have been polished (e.g., at FIG. 9H) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 9H, it is to be understood that the method described in reference to FIG. 9A through FIG. 9H may be performed to generate an array of depressions 20' (each having functionalized layers 24, 26 therein) across the resin layer 14, 14', 18, 18'.

Methods with a Metal Film

Some examples of the method disclosed herein use a metal film to pattern one or more layers. In these examples, the metal film is a sacrificial layer that protects the underlying resin layer 18, 18' (of the multi-layer structure 16, 16') or base support 17, 17' during processing, but is readily removable at a desirable time. These methods are shown in FIG. 10A through FIG. 10C or FIG. 10A, FIG. 10D, FIG. 10B, and FIG. 10C in combination with any of i) FIG. 11A through FIG. 11E, ii) FIG. 12A through FIG. 12G, iii) FIG. 12A through FIG. 12D and FIG. 12H through FIG. 12J, iv) FIG. 13A through FIG. 13I, or v) FIG. 14A through FIG. 14I, or vi) FIG. 15A through FIG. 15F. In some of these examples, the metal film also functions as a mask for photoresist development.

Figures 10A, 10B, 10C, 10D, 11A, 11B, 11C, 11D, 11E:
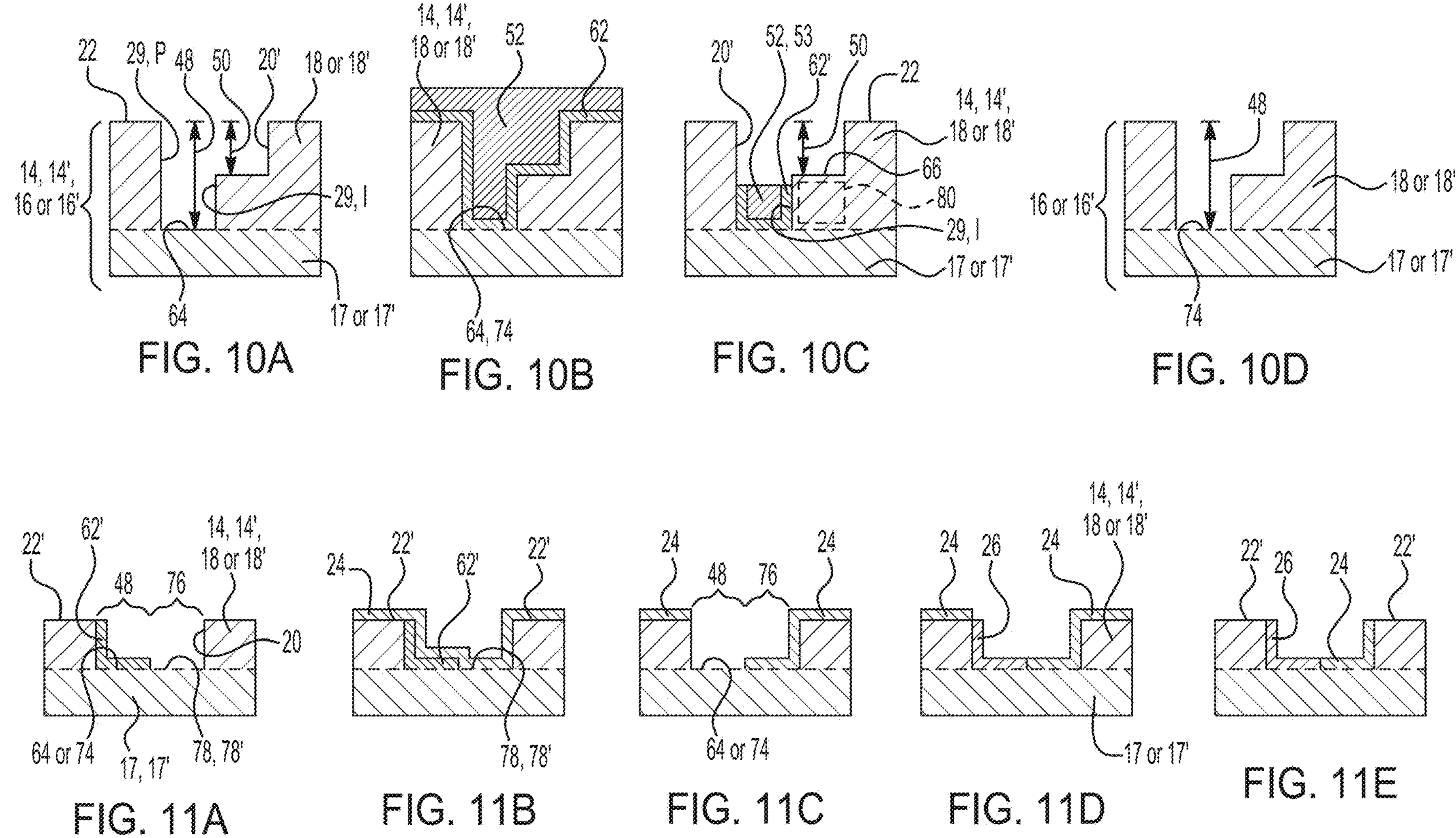
FIG. 10A through FIG. 10D are schematic views that together illustrate an example of a method to pattern a metal film in a deep portion of a multi-depth depression.
FIG. 11A through FIG. 11E are schematic views that together with FIG. 10A through FIG. 10D depict an example of a method to generate a flow cell surface.

The examples of the method shown in each of these series of figures generally include forming a metal film 62 over a resin layer 14, 14', 18, or 18' including the plurality of multi-depth depressions 20' separated by interstitial regions 22, each multi-depth depression 20' including a deep portion 48 and a shallow portion 50 adjacent to the deep portion 48 (FIG. 10B); forming a sacrificial layer 52 over the metal film 62 (FIG. 10B); and sequentially dry etching the sacrificial layer 52 and the metal film 62 to expose a surface 66 of the resin layer 14, 14', 18, or 18' at the shallow portion 50 and the interstitial regions 22 (FIG. 10C). As such, the beginning of each of the example methods that utilize the metal film 62 as a sacrificial layer are shown in FIG. 10A through FIG. 10C or FIG. 10A, FIG. 10D, FIG. 10B, and FIG. 10C.

As shown in FIG. 10A, the multi-depth depression 20' is defined in either the single layer base support 14, 14' or the resin layer 18, 18' of the multi-layered structure 16, 16' as described herein. As such, the term "resin layer" may be referred to as "resin layer 14, 14', 18, or 18'" throughout the description of these methods. In examples where the "resin layer 14, 14'" is specifically mentioned, it is meant that the resin layer is the single layer base support 14, 14'. In other examples where "the resin layer 18, 18'" is mentioned, it is meant that the resin layer is the resin layer 18, 16' of the multi-layer structure 16, 16'. The underlying base support 17, 17' is shown in phantom, which indicates that both the multi-layered structure 16 and the single layer base support 14 are represented in FIG. 10A through FIG. 10D, as well as each of the series of figures with which they can be combined.

The resin layer 14 may be any of the examples of the resin set forth herein for the single layer base support 14, the resin layer 14' may be any of the examples of the resin set forth herein for the single layer base support 14', the resin layer 18 may be any of the resins described herein for the resin layer 18 of the multi-layer structure 16, and the resin layer 18' may be any of the resins described herein for the resin layer 18' of the multi-layer structure 16'. When included, the base support 17 or 17' may be any of the respective examples described herein.

The multi-depth depression 20' may be etched, imprinted, or defined in the resin layer 14, 14', 18, or 18' using any suitable technique, such as the nanoimprint lithography process described in reference to FIG. 4A. While one multi-depth depression 20' is shown in FIG. 10A, it is to be understood that the method may be performed to generate an array of multi-depth depressions 20' including respective deep portions 48 and shallow portions 50, separated by interstitial regions 22, across the surface of the resin layer 14, 14', 18, or 18'.

The method shown in FIG. 10A through FIG. 10C includes the resin layer 14, 14' i.e., the single layer base support 14, 14'. After the multi-depth depression 20' is formed in the resin layer 14, 14', the resin layer 14, 14' may be exposed to activation, e.g., through silanization or plasma ashing, before the metal film 62 is deposited. If the resin layer 14, 14' includes surface groups to covalently attach to the functionalized layers 24, 26, the activation process is not performed.

As shown in FIG. 10B, the metal film 62 is deposited over the resin layer 14, 14'. Examples of suitable materials for the metal film 62 include semi-metals, such as silicon, or metals, such as aluminum, copper, titanium, gold, silver, etc. In some examples, the semi-metal or metal may be at least substantially pure (<99% pure). In other examples, molecules or compounds of the listed elements may be used. When the method uses backside exposure for development of a photoresist the metal film 62 is selected to be opaque (non-transparent or having transmittance less than 0.25) to the light energy used for photoresist development. For example, oxides of any of the listed semi-metals (e.g., silicon dioxide) or metals (e.g., aluminum oxide) may be used, alone or in combination with the listed semi-metal or metal. These materials may be deposited using any suitable technique disclosed herein.

Also as shown in FIG. 10B, the sacrificial layer 52 is deposited over the metal film 62 and cured. In this example, the sacrificial layer 52 may be a negative or positive photoresist or poly(methyl methacrylate).

Referring now to FIG. 10C, the sacrificial layer 52 and the metal film 62 are sequentially dry etched to expose the surface 66 of the resin layer 14, 14' in the shallow portion 50 and to expose the interstitial regions 22. The first dry etching process removes some of the sacrificial layer 52, and is performed for a measured amount of time to expose the metal film 62 that overlies the surface 66. Examples of the first dry etching process include a reactive ion etch (e.g., with 10% $CF_4$ and 90% $O_2$) or a 100% $O_2$ plasma etch. The second dry etching process removes some of the metal film 62, and is performed for a measured amount of time to expose the resin layer 14, 14' that overlies the surface 66. Examples of the second dry etching process include a reactive ion etch, e.g., with $BCl_3+Cl_2$. As shown in FIG. 10C, the dry etching processes are stopped so that the region 53 of the sacrificial layer 52 and the underlying metal film 62' remain in the portion of the deep portion 48 that is next to the interior wall 29, I.

The method shown in FIG. 10A, FIG. 10D, FIG. 10B, and FIG. 10C includes the resin layer 18, 18' positioned on the base support 17, 17'. After the multi-depth depression 20' is formed in the resin layer 18, 18' (FIG. 10A), the method includes additional processing to expose a surface 74 of the underlying base support 17, 17' as shown in FIG. 10D. In this example method, the resin layer 18, 18' is positioned over the base support 17, 17', and prior to forming the metal film 62, the method further comprises dry etching the resin layer 18, 18' at the deep portion 48 to expose a first region 74 of a surface of the base support 17, 17', wherein the first region 74 of the surface is the surface at the deep portion 48 and may be referred to herein as "surface 74." In this example, the resin layer 18, 18' may be etched using a dry etching process, such as an anisotropic oxygen plasma, a $CF_4$ plasma, or a mixture of 90% $CF_4$ and 10% $O_2$ plasma, and the underlying base support 17, 17' acts as an etch stop.

In this example method, if the base support 17, 17' (including first region 74) includes surface groups to covalently attach to the functionalized layers 24, 26 and the resin layer 18, 18' does not include surface groups to covalently attach to the functionalized layers 24, 26, the resin layer 18, 18' can be exposed to activation, e.g., through silanization or plasma ashing, after the depression 20' is formed and before the first region 74 is exposed. As examples, tantalum pentoxide and fused silica include surface groups that can attach to PAZAM and may be suitable for the base support 17, 17'. Alternatively, if the resin layer 18, 18' and the base support 17, 17' (including first region 74) include surface groups to covalently attach to the functionalized layers 24, 26, the activation process is not performed. In still other examples, if neither of the resin layer 18, 18' nor the base support 17, 17' includes surface groups to covalently attach to the functionalized layers 24, 26, the resin layer 18, 18' and the first region 74 may be exposed to activation after the first region 74 is exposed and before the metal film 62 is deposited.

As shown in FIG. 10B, the metal film 62 is deposited over the resin layer 18, 18' and the first region 74, and the sacrificial layer 52 is deposited and cured over the metal film 62. Each of these processes may be performed as described herein. In this example, when the metal film 62 is applied, a portion of it is in direct contact with the first region 74 of the base support 17, 17'.

In this example method, the sacrificial layer 52 and the metal film 62 are sequentially dry etched to expose the surface 66 of the resin layer 18, 18' in the shallow portion 50 and to expose the interstitial regions 22, as described herein in reference to FIG. 10C. In this example, the region 53 of the sacrificial layer 52 and the underlying metal film 62' remain in the portion of the deep portion 48 that is next to the interior wall 29, I, and the metal film 62' is in direct contact with the first region 74 of the base support 17, 17'.

As mentioned, the methods shown in FIG. 10A through FIG. 10C or FIG. 10A, FIG. 10D, FIG. 10B, and FIG. 10C may continue at any of i) FIG. 11A through FIG. 11E, ii) FIG. 12A through FIG. 12G, iii) FIG. 12A through FIG. 12D and FIG. 12H through FIG. 12J, iv) FIG. 13A through FIG. 13I, or v) FIG. 14A through FIG. 14I, or vi) FIG. 15A through FIG. 15F. Each of these methods will now be described.

In addition to the processes described in reference to either FIG. 10A through FIG. 10C or FIG. 10A, FIG. 10D, FIG. 10B, and FIG. 10C, the method shown in FIG. 11A through FIG. 11E generally includes: removing portions of the resin layer 14, 14', 18, 18' i) at the shallow portion 50 of the multi-depth depression 20' to form a depression region 76 having a surface 78, 78' that is directly adjacent to a surface 64 or 74 at the deep portion 48 and ii) at the interstitial regions 22 to form new interstitial regions 22' surrounding the deep portion 48 and the depression region 76 (FIG. 11A); depositing a first functionalized layer 24 over the metal film 62', the depression region 76, and the new interstitial regions 22' (FIG. 11B); removing the metal film 62' from the deep portion 48 (FIG. 11C); depositing a second functionalized layer 26 over the surface 64 or 74 at the deep portion 48 (FIG. 11D); and polishing the new interstitial regions 22' (FIG. 11E).

The removal of the portions of the resin layer 14, 14', 18, 18' to form the depression region 76 and the new interstitial regions 22' is shown in FIG. 11A. The resin layer 14, 14', 18, 18' may be dry etched using any of the examples set forth herein, e.g., an anisotropic oxygen plasma, a $CF_4$ plasma, or a mixture of 90% $CF_4$ and 10% $O_2$ plasma. In this example, dry etching removes exposed portions of the resin layer 14, 14', 18, 18', e.g., at the interstitial regions 22 and at the step feature 80 that defines the surface 66 and the shallow portion 50 (see FIG. 10C). When the resin layer 14, 14' is used, this dry etching process may be a timed dry etch that is performed for a measured amount of time to create the surface 78 which is substantially co-planar with the surface 64 that had been at the deep portion 48 (see FIG. 11A). In this particular example, the surface 78 is the surface of the depression region 76. Alternatively, when the resin layer 18, 18' is used, this dry etching process may be performed until the surface 78' is reached, which acts as an etch stop. The surface 78' is co-planar with the surface 74 (see FIG. 11A). In this example, the removal of portions (e.g., step feature 80) of the resin layer 18, 18' at the shallow portion 50 of the multi-depth depression 20' exposes a second region of the surface of the base support 17, 17', wherein second region of the surface of the base support 17, 17' is the surface 78' of the depression region 76. As shown in FIG. 11A, this dry etching process removes the step feature 80 of the resin layer 14, 14', 18, 18' (which had defined the shallow portion 50) in order to create the depression region 76. This dry etching process also removes a portion of the perimeter sidewall 29, P. The resulting structure is the single depth depression 20 shown in FIG. 11A.

As shown in FIG. 11A, the metal film 62' remains intact after the resin layer 14, 14', 18, 18' is dry etched.

Referring now to FIG. 11B, the method then includes depositing the functionalized layer 24. When the resin layer 14, 14' is used, the applied functionalized layer 24 is positioned over the metal film 62' and over exposed surfaces of the resin layer 14, 14' (including over surface 78 and new interstitial regions 22'). When the multi-layer structure 16, 16' is used, the applied functionalized layer 24 is positioned over the metal film 62', over exposed surfaces of the resin layer 18, 18', and over the exposed surface 78' of the base support 17, 17'. The functionalized layer 24 may be any of the gel materials described herein and may be applied using any suitable deposition technique. A curing process may be performed after deposition. The functionalized layer 24 covalently attaches to the exposed surfaces of the resin layer 14, 14' or to the exposed surfaces of the resin layer 18, 18' and the base support 17, 17' (including surface 78').

The metal film 62' is then removed from what had been, prior to resin layer 14, 14', 18, 18' etching, the deep portion 48. The metal film 62' may be removed by a wet etching or lift-off process, which depends upon the material of the metal film 62'. As examples, an aluminum metal film 62' can be removed in acidic or basic conditions, a copper metal film 62' can be removed using $FeCl_3$, a copper, gold or silver metal film 62' can be removed in an iodine and iodide solution, and a silicon metal film 62' can be removed in basic (pH) conditions. The underlying surface 64, 74 may be inert to the wet etching or lift-off process.

As shown in FIG. 11C, the wet etching or lift-off process removes i) at least 99% of the metal film 62' and ii) the first functionalized layer 24 thereon. This process exposes the surface 64 of the resin layer 14, 14' or the surface 74 of the base support 17, 17'.

As shown in FIG. 11D, the second functionalized layer 26 may then be applied over the surface 64 or 74. The second functionalized layer 26 (e.g., the gel material that forms the second functionalized layer 26) may be applied using any suitable deposition technique. In this example, when deposition of the gel material is performed under high ionic strength (e.g., in the presence of 10×PBS, NaCl, KCl, etc.), the second functionalized layer 26 does not deposit on or adhere to the first functionalized layer 24. As such, the second functionalized layer 26 does not contaminate the first functionalized layer 24.

In FIG. 11E, the functionalized layer 24 that is positioned over the new interstitial regions 22' is removed, e.g., using a polishing process as described in reference to FIG. 9H.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

While not shown, the methods of FIG. 10A through FIG. 10C or FIG. 10A, FIG. 10D, FIG. 10B, and FIG. 10C in combination with FIG. 11A through FIG. 11E also include attaching respective primer sets 30, 32 to the functionalized layers 24, 26. In some examples, the primers 34, 36 or 34', 36' (not shown in FIG. 10A through FIG. 10D or in FIG. 11A through FIG. 11E) may be pre-grafted to the functionalized layer 24. Similarly, the primers 38, 40 or 38', 40' (not shown in FIG. 10A through FIG. 10D or in FIG. 11A through FIG. 11E) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 11B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 11D or FIG. 11E) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 11E, it is to be understood that the method described in reference to FIG. 10A through FIG. 10C or FIG. 10A, FIG. 10D, FIG. 10B, and FIG. 10C in combination with FIG. 11A through FIG. 11E may be performed to generate an array of depressions 20 (each having functionalized layers 24, 26 therein) across the resin layer 14, 14', 18, 18'.

Figures 12A, 12B, 12C, 12D, 12E, 12F, 12G, 12H, 12I, 12J:
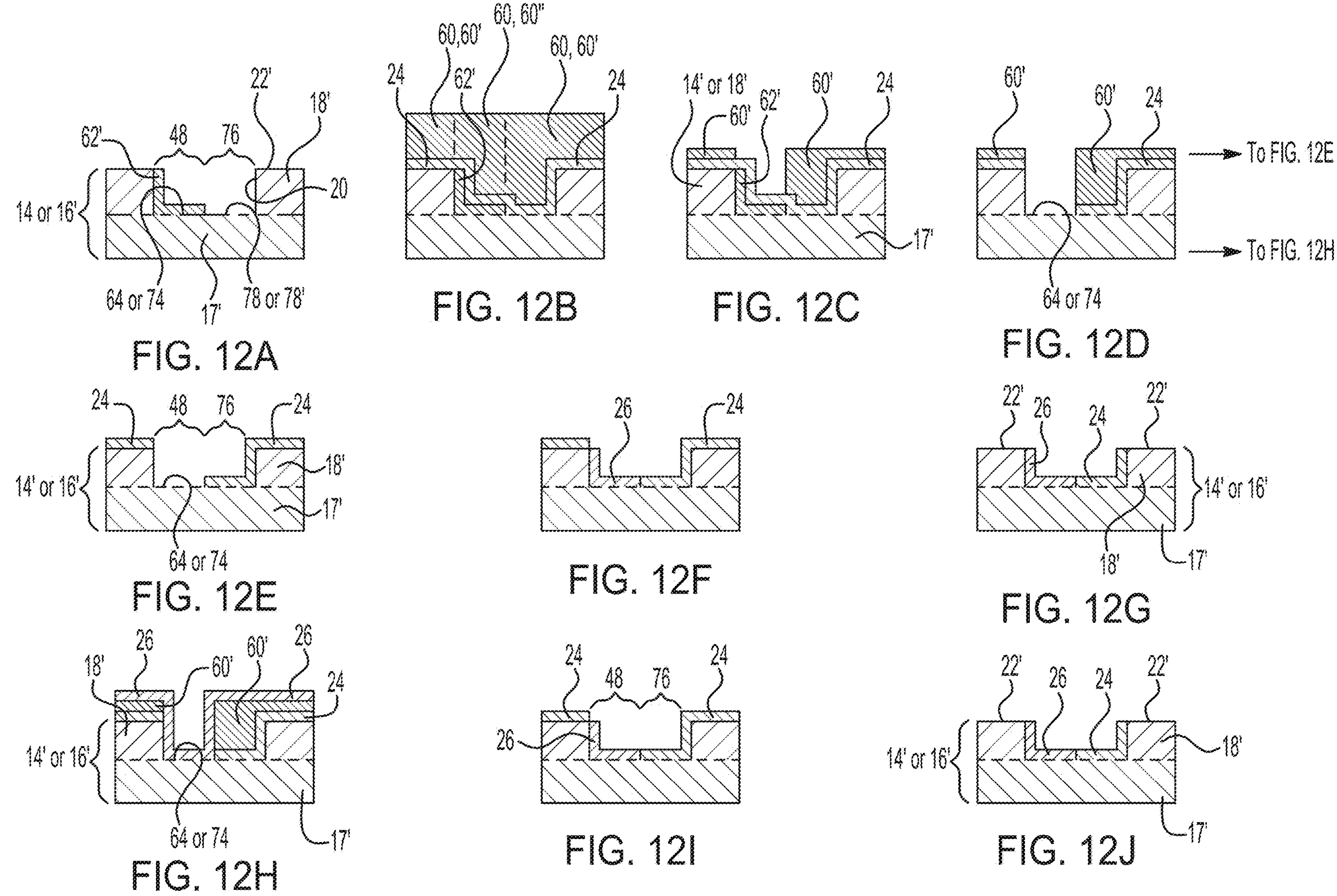

In addition to the processes described in reference to either FIG. 10A through FIG. 10C or FIG. 10A, FIG. 10D, FIG. 10B, and FIG. 10C (which generates the metal film 62'), the method shown in FIG. 12A through FIG. 12G generally includes: removing portions of the resin layer 14', 18' i) at the shallow portion 50 of the multi-depth depression 20' to form a depression region 76 having a surface 78, 78' that is directly adjacent to a surface 64 or 74 at the deep portion 48 and ii) at the interstitial regions 22 to form new interstitial regions 22' surrounding the deep portion 48 and the depression region 76 (FIG. 12A); depositing a first functionalized layer 24 over the metal film 62', the depression region 76, and the new interstitial regions 22' (FIG. 12B); prior to the removal of the metal film 62' from the deep portion 48: depositing a negative photoresist 60 over the first functionalized layer 24 (FIG. 12B); directing, through the resin layer 14', or alternatively through the base support 17', an ultraviolet light dosage, thereby forming an insoluble negative photoresist 60' over the surface 78, 78' of the depression region 76 and the new interstitial regions 22' and a soluble negative photoresist 60" over the first functionalized layer 24 over the metal film 62' (FIG. 12B); removing the soluble negative photoresist 60" (FIG. 12C); and ashing the first functionalized layer 24 from over the metal film 62' (FIG. 12D); wherein removing the metal film 62' from the deep portion 48 involves etching the metal film 62' (FIG. 12D); and the method further comprises removing the insoluble negative photoresist 60' before depositing the second functionalized layer 26 (FIG. 12E). This example method also includes depositing the second functionalized layer 26 over the surface 64 or 74 at the deep portion 48 (FIG. 12F); and polishing the new interstitial regions 22' (FIG. 12G).

The removal of the portions of the resin layer 14', 18' to form the depression region 76 and the new interstitial regions 22' is shown in FIG. 12A. The resin layer 14', 18' may be dry etched using any of the examples set forth herein, e.g., an anisotropic oxygen plasma, a $CF_4$ plasma, or a mixture of 90% $CF_4$ and 10% $O_2$ plasma. In this example, dry etching removes exposed portions of the resin layer 14', 18', e.g., at the interstitial regions 22 and at the step feature 80 that defines the surface 66 and the shallow portion 50 (see FIG. 10C). When the resin layer 14' is used, this dry etching process may be a timed dry etch that is performed for a measured amount of time to create the surface 78 which is substantially co-planar with the surface 64 that had been at the deep portion 48 (see FIG. 12A). In this particular example, the surface 78 is the surface of the depression region 76. Alternatively, when the resin layer 18' is used, this dry etching process may be performed until the surface 78' of the base support 17' is reached, which acts as an etch stop. In this example, the removal of portions (e.g., step feature 80) of the resin layer 18' at the shallow portion 50 of the multi-depth depression 20' exposes a second region of the surface of the base support 17', wherein the second region of the surface of the base support 17' is the surface 78' of the depression region 76. In these examples, the surface 78 or 78' is at least substantially co-planar with the surface 64 or 74 (see FIG. 12A). The dry etching process also removes a portion of the perimeter sidewall 29, P. The resulting structure is the single depth depression 20 shown in FIG. 12A.

As shown in FIG. 12A, the metal film 62' remains intact after the resin layer 14', 18' is dry etched.

Referring now to FIG. 12B, the method then includes depositing the functionalized layer 24. When the resin layer 14' is used, the applied functionalized layer 24 is positioned over the metal film 62' and over exposed surfaces of the resin layer 14' (including over surface 78 and new interstitial regions 22'). When the multi-layer structure 16' is used, the applied functionalized layer 24 is positioned over the metal film 62', over exposed surfaces of the resin layer 18', and over the exposed surface 78' of the base support 17'. The functionalized layer 24 may be any of the gel materials described herein and may be applied using any suitable deposition technique. A curing process may be performed after deposition. The functionalized layer 24 covalently attaches to the exposed surfaces of the resin layer 14' (including surface 78) or to the exposed surfaces of the resin layer 18' and the base support 17' (including surface 78').

FIG. 12B also depicts depositing a negative photoresist 60 over the first functionalized layer 24. The negative photoresist 60 may be any of the negative photoresists described herein. The negative photoresist 60 is then exposed to an ultraviolet light dosage through the resin layer 14' or, alternatively, through the base support 17', which forms an insoluble negative photoresist 60' over the surface 78, 78' of the depression region 76 and over the new interstitial regions 22', and a soluble negative photoresist 60" over the first functionalized layer 24 that is positioned over the metal film 62'. The metal film 62' blocks the light from reaching the negative photoresist 60 overlying the metal film 62', and thus this portion becomes soluble. The remainder of the negative photoresist 60 is exposed to the light and thus becomes insoluble.

FIG. 12C depicts when the soluble negative photoresist 60" is removed from (what had been) the deep portion 48. The soluble negative photoresist 60" is removed using any suitable developer. Examples of suitable developers for the negative photoresist include aqueous-alkaline solutions, such as diluted sodium hydroxide, diluted potassium hydroxide, or an aqueous solution of the metal ion free organic TMAH (tetramethylammoniumhydroxide).

After developer exposure, the insoluble negative photoresist 60' remains over the first functionalized layer 24 at what had been, prior to resin layer 14', 18' etching, the shallow portion 50, and the new interstitial regions 22'.

Referring now to FIG. 12D, a portion of the first functionalized layer 24 and the metal film 62' are sequentially removed. The portion of the first functionalized layer 24 that is positioned over the metal film 62' may be removed via ashing. The ashing process that is used to remove the functionalized layer 24 may be performed with plasma, such as 100% $O_2$ plasma, air plasma, argon plasma, etc. This process may also be used to remove the metal film 62'. Alternatively, this process may be stopped to leave the metal film 62' intact. In these instances, the metal film 62' is then removed from what had been, prior to resin layer 14', 18' etching, the deep portion 48. The metal film 62' may be removed by a dry etching process or by wet etching or lift-off process, which depends upon the material of the metal film 62'. The dry etching process that is used to remove the metal film 62' may be reactive ion etching with $BCl_3+Cl_2$. As examples of the wet etch or lift-off process, an aluminum metal film 62' can be removed in acidic or basic conditions, a copper metal film 62' can be removed using $FeCl_3$, a copper, gold or silver metal film 62' can be removed in an iodine and iodide solution, and a silicon metal film 62' can be removed in basic (pH) conditions. The removal of the metal film 62' exposes the surface 64 or 74. When the resin layer 14' has been used, the surface exposed is the resin layer surface 64. When the multi-layer structure 16' has been used, the surface exposed is the base support surface 74. The underlying surface 64, 74 may be inert to the wet etching or lift-off process. The underlying surface 64, 74 may or may not be inert to the dry etching process. If not, the etch rate of the underlying surface 64, 74 is much slower than that of the metal film 62', and thus effectively acts as an etch stop.

At FIG. 12E, the insoluble negative photoresist 60' is removed before depositing the second functionalized layer 26. The insoluble negative photoresist 60' may be removed by any suitable remover, which depends, in part, on the type of negative photoresist 60 used.

At FIG. 12F, the second functionalized layer 26 may then be applied over the surface 64 or 74. The second functionalized layer 26 (e.g., the gel material that forms the second functionalized layer 26) may be applied using any suitable deposition technique. In this example, when deposition of the gel material is performed under high ionic strength (e.g., in the presence of 10×PBS, NaCl, KCl, etc.), the second functionalized layer 26 does not deposit on or adhere to the first functionalized layer 24. As such, the second functionalized layer 26 does not contaminate the first functionalized layer 24.

In FIG. 12G, the functionalized layer 24 that is positioned over the new interstitial regions 22' is removed, e.g., using a polishing process. The polishing process may be performed as described herein, e.g., in reference to FIG. 9H.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

While not shown, the methods of FIG. 10A through FIG. 10C or FIG. 10A, FIG. 10D, FIG. 10B, and FIG. 10C in combination with FIG. 12A through FIG. 12G also include attaching respective primer sets 30, 32 to the functionalized layers 24, 26. In some examples, the primers 34, 36 or 34', 36' (not shown in FIG. 10A through FIG. 10D or in FIG. 12A through FIG. 12G) may be pre-grafted to the functionalized layer 24. Similarly, the primers 38, 40 or 38', 40' (not shown in FIG. 10A through FIG. 10D or in FIG. 12A through FIG. 12G) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 12B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 12F) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 12G, it is to be understood that the method described in reference to FIG. 10A through FIG. 10C or FIG. 10A, FIG. 10D, FIG. 10B, and FIG. 10C in combination with FIG. 12A through FIG. 12G may be performed to generate an array of depressions 20 (each having functionalized layers 24, 26 therein) across the resin layer 14', 18'.

In addition to the processes described in reference to either FIG. 10A through FIG. 10C or FIG. 10A, FIG. 10D, FIG. 10B, and FIG. 10C, the method shown in FIG. 12A through FIG. 12D and continuing at FIG. 12H through FIG. 12J generally includes: removing portions of the resin layer 14', 18' i) at the shallow portion 50 of the multi-depth depression 20' to form a depression region 76 having a surface 78, 78' that is directly adjacent to a surface 64 or 74 at the deep portion 48 and ii) at the interstitial regions 22 to form new interstitial regions 22' surrounding the deep portion 48 and the depression region 76 (FIG. 12A); depositing a first functionalized layer 24 over the metal film 62', the depression region 76, and the new interstitial regions 22' (FIG. 12B); prior to the removal of the metal film 62' from the deep portion 48: depositing a negative photoresist 60 over the first functionalized layer 24 (FIG. 12B); directing, through the resin layer 14', or alternatively through the base support 17', an ultraviolet light dosage, thereby forming an insoluble negative photoresist 60' over the surface 78 or 78' of the depression region 76 and the new interstitial regions 22' and a soluble negative photoresist 60" over the first functionalized layer 24 over the metal film 62' (also FIG. 12B); removing the soluble negative photoresist 60" (FIG. 12C); and ashing the first functionalized layer from over the metal film 62' (FIG. 12D); wherein removing the metal film 62' from the deep portion 48 involves etching the metal film 62' (FIG. 12D); wherein the second functionalized layer 26 is also deposited over the insoluble negative photoresist 60' (FIG. 12H); and the method further comprises removing the insoluble negative photoresist 60' (FIG. 12I). This example of the method also involves polishing the new interstitial regions 22' (FIG. 12J).

In this example method, the processes shown in FIG. 12A through FIG. 12D may be performed as described herein.

The method then continues from FIG. 12A through FIG. 12D to FIG. 12H. At FIG. 12H, the second functionalized layer 26 may then be applied over the surface 64 or 74 and the insoluble negative photoresist 60'. The second functionalized layer 26 (e.g., the gel material that forms the second functionalized layer 26) may be applied using any suitable deposition technique. The second functionalized layer 26 does not contaminate the first functionalized layer 24, which is covered by the insoluble negative photoresist 60'.

At FIG. 12I, the insoluble negative photoresist 60' is removed. The insoluble negative photoresist 60' may be removed by any suitable remover, which depends, in part, on the type of negative photoresist 60 used. As shown in FIG. 12I, the removal process removes i) at least 99% of the insoluble negative photoresist 60' and ii) the second functionalized layer 26 thereon. This removal process leaves the second functionalized layer 26 that is positioned on the surface 64 or 74, and also leaves the first functionalized layer 24 intact. These portions of the functionalized layers 24, 26 remain intact, in part because they are covalently attached to the resin layer 14' or 18' and/or base support 17'.

In FIG. 12J, the functionalized layer 24 that is positioned over the new interstitial regions 22' is removed, e.g., using a polishing process as described, for example, in reference to FIG. 9H.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

While not shown, the methods of FIG. 10A through FIG. 10C or FIG. 10A, FIG. 10D, FIG. 10B, and FIG. 10C in combination with FIG. 12A through FIG. 12D and continued at FIG. 12H through FIG. 12J also include attaching respective primer sets 30, 32 to the functionalized layers 24, 26. In some examples, the primers 34, 36 or 34', 36' (not shown in FIG. 10A through FIG. 10D or in FIG. 12A through FIG. 12D and continued at FIG. 12H through FIG. 12J) may be pre-grafted to the functionalized layer 24. Similarly, the primers 38, 40 or 38', 40' (not shown in FIG. 10A through FIG. 10D or in FIG. 12A through FIG. 12D and continued at FIG. 12H through FIG. 12J) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 12B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied and prior to additional processing (e.g., at FIG. 12H); or after the second functionalized layer 26 is applied and exposed to additional processing (e.g., at FIG. 12I or at 12J) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 12J, it is to be understood that the method described in reference to FIG. 10A through FIG. 10C or FIG. 10A, FIG. 10D, FIG. 10B, and FIG. 10C in combination with FIG. 12A through FIG. 12D and continued in FIG. 12H through FIG. 12J may be performed to generate an array of depressions 20 (each having functionalized layers 24, 26 therein) across the resin layer 14', 18'.

Figures 13A, 13B, 13C, 13D, 13E, 13F, 13G, 13H, 13I:
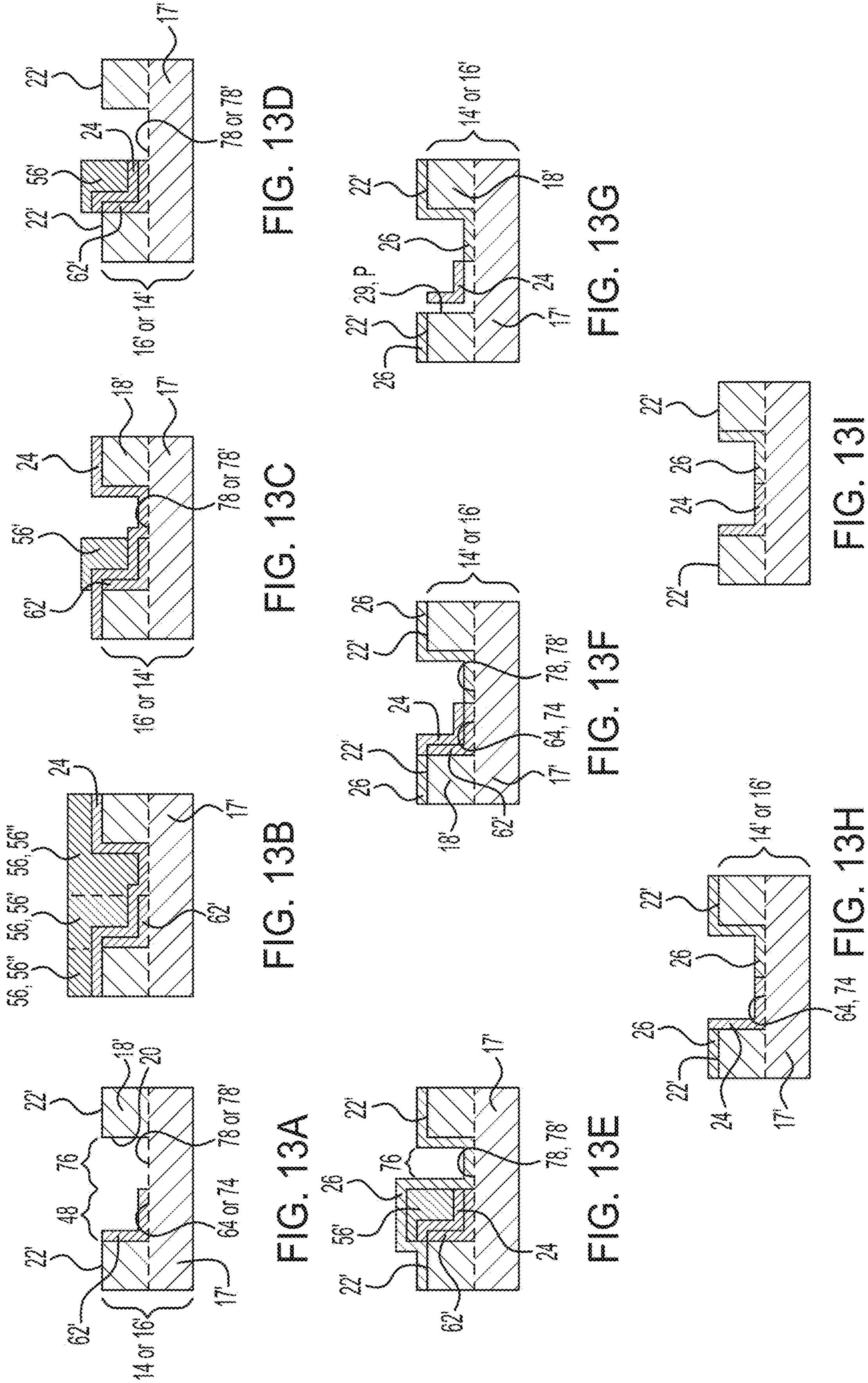
FIG. 13A through FIG. 13I are schematic views that together with FIG. 10A through FIG. 10D depict an example of a method to generate a flow cell surface.

In addition to the processes described in reference to either FIG. 10A through FIG. 10C or FIG. 10A, FIG. 10D, FIG. 10B, and FIG. 10C (which generates the metal film 62'), the method shown in FIG. 13A through FIG. 13I generally includes: removing portions of the resin layer 14', 18' i) at the shallow portion 50 of the multi-depth depression 20' to form a depression region 76 having a surface 78, 78' that is directly adjacent to a surface 64 or 74 at the deep portion 48 and ii) at the interstitial regions 22 to form new interstitial regions 22' surrounding the deep portion 48 and the depression region 76 (FIG. 13A); depositing a first functionalized layer 24 over the metal film 62', the depression region 76, and the new interstitial regions 22' (FIG. 13B); prior to the removal of the metal film 62' from the deep portion 48: depositing a positive photoresist 56 over the first functionalized layer 24 (FIG. 13B); directing, through the resin layer 14', or alternatively through the base support 17', an ultraviolet light dosage, thereby forming an insoluble positive photoresist 56' over the first functionalized layer 24 over the metal film 62' and a soluble positive photoresist 56" over the surface 78, 78' of the depression region 76 and the new interstitial regions 22' (FIG. 13B); removing the soluble positive photoresist 56" (FIG. 13C); ashing the first functionalized layer 24 from the surface 78, 78' of the depression region 76 and the new interstitial regions 22' (FIG. 13D); wherein the deposition of the second functionalized layer 26 over the surface 64, 74 at the deep portion 48 involves depositing the second functionalized layer 26 over the insoluble positive photoresist 56', the surface 78, 78' of the depression region 76, and the new interstitial regions 22' (FIG. 13E); and removing the insoluble positive photoresist 56' (FIG. 13F); and after the removal of the metal film 62' from the deep portion 48, the method further comprises increasing adhesion between the first functionalized layer 24 and the surface 64 at the deep portion 48, or between the first functionalized layer 24 and the first region 74 of the surface of the base support 17' (FIG. 13G).

The removal of the portions of the resin layer 14', 18' to form the depression region 76 and the new interstitial regions 22' is shown in FIG. 13A. The resin layer 14', 18' may be dry etched using any of the examples set forth herein, e.g., an anisotropic oxygen plasma, a $CF_4$ plasma, or a mixture of 90% $CF_4$ and 10% $O_2$ plasma. In this example, dry etching removes exposed portions of the resin layer 14', 18', e.g., at the interstitial regions 22 and at the step feature 80 that defines the surface 66 and the shallow portion 50 (see FIG. 10C). When the resin layer 14' is used, this dry etching process may be a timed dry etch that is performed for a measured amount of time to create the surface 78 which is substantially co-planar with the surface 64 or 74 that had been at the deep portion 48 (see FIG. 13A). In this particular example, the surface 78 is the surface of the depression region 76. Alternatively, when the resin layer 18' is used, this dry etching process may be performed until the surface 78' of the base support 17' is reached, which acts as an etch stop. The surface 78' is co-planar with the surface 74 (see FIG. 13A). In this example, the removal of portions (e.g., step feature 80) of the resin layer 18' at the shallow portion 50 of the multi-depth depression 20' exposes a second region of the surface of the base support 17', wherein the second region of the surface of the base support 17' is the surface 78' of the depression region 76. This dry etching process also removes a portion of the perimeter sidewall 29, P. The resulting structure is the single depth depression 20 shown in FIG. 13A.

As shown in FIG. 13A, the metal film 62' remains intact after the resin layer 14', 18' is dry etched.

Referring now to FIG. 13B, the method then includes depositing the functionalized layer 24. When the resin layer 14' is used, the applied functionalized layer 24 is positioned over the metal film 62' and over exposed surfaces of the resin layer 14' (including over surface 78 and new interstitial regions 22'). When the multi-layer structure 16' is used, the applied functionalized layer 24 is positioned over the metal film 62', over exposed surfaces of the resin layer 18', and over the exposed surface 78' of the base support 17'. The functionalized layer 24 may be any of the gel materials described herein and may be applied using any suitable deposition technique. A curing process may be performed after deposition. The functionalized layer 24 covalently attaches to the exposed surfaces of the resin layer 14' or to the exposed surfaces of the resin layer 18' and the base support 17' (including surface 78').

FIG. 13B also depicts depositing a positive photoresist 56 over the first functionalized layer 24. The positive photoresist 56 may be any of the positive photoresists described herein. The positive photoresist 56 is then exposed to an ultraviolet light dosage through the resin layer 14' or, alternatively, the base support 17', which forms an insoluble positive photoresist 56' over the metal film 62' and the first functionalized layer 24 at the deep portion 48, and a soluble positive photoresist 56" over the surface 78, 78' of the depression region 76 and the new interstitial regions 22'. The metal film 62' blocks the light from reaching the positive photoresist 56 overlying the metal film 62', and thus this portion becomes insoluble. The remainder of the positive photoresist 56 is exposed to the light and thus becomes soluble.

FIG. 13C depicts when the soluble positive photoresist 56" is removed from over the surface 78, 78' of the depression region 76 and from over the new interstitial regions 22'. The soluble positive photoresist 56" is removed using any suitable developer. Examples of suitable developers for the positive photoresist 56 include aqueous-alkaline solutions, such as diluted sodium hydroxide, diluted potassium hydroxide, or an aqueous solution of the metal ion free organic TMAH (tetramethylammoniumhydroxide).

After developer exposure, the insoluble positive photoresist 56' remains over the metal film 62' positioned over the first functionalized layer 24 at what had been, prior to resin layer 14', 18' etching, the deep portion 48.

FIG. 13D depicts ashing the first functionalized layer 24 from the surface 78, 78' of the depression region 76 and the new interstitial regions 22'. The ashing may be performed as described herein, and removes the first functionalized layer 24 to expose the surface 78, 78' of the depression region 76 and the new interstitial regions 22'. The insoluble positive photoresist 56' is not susceptible to the ashing process, and thus the insoluble photoresist 56', the first functionalized layer 24, and the metal film 62' remain in what had been the deep portion 48 after the ashing process.

Referring now to FIG. 13E, the second functionalized layer 26 may then be applied over the surface 78, 78', the new interstitial regions 22', and the insoluble positive photoresist 56'. The second functionalized layer 26 (e.g., the gel material that forms the second functionalized layer 26) may be applied using any suitable deposition technique. The second functionalized layer 26 does not contaminate the first functionalized layer 24, which is covered by the insoluble positive photoresist 56'.

Referring now to FIG. 13F, the insoluble positive photoresist 56' is removed. The insoluble positive photoresist 56' may be removed by any suitable remover, which depends, in part, on the type of positive photoresist 56 used. As shown in FIG. 13F, the removal process removes i) at least 99% of the insoluble positive photoresist 56' and ii) the second functionalized layer 26 thereon. This removal process leaves the second functionalized layer 26 that is positioned over the surface 78, 78' and the new interstitial regions 22'. These portions of the functionalized layer 26 remain intact, in part because they are covalently attached to the resin layer 14' or 18' and/or base support 17'.

FIG. 13G depicts when the metal film 62' is removed from what had been, prior to resin layer 14', 18' etching, the deep portion 48. The metal film 62' may be removed by a wet etching process, which depends upon the material of the metal film 62'. In an example, the metal film 62' (e.g., aluminum having about 30 nm thickness) can be etched by exposure to a 1-2% KOH solution or a sodium carbonate buffer (pH~10) for about 3 to 5 minutes, without mechanical stress including agitation or sonication. The etching process can be slowed by diluting the etchant and increasing the duration of the process, which may improve the retention of the functionalized layer 24. The removal of the metal film 62' does not remove the first functionalized layer 24 deposited over the metal film 62' at what had been the deep portion 48, but does expose the surface 64, 74. The underlying surface 64, 74 may also be inert to the wet etching process.

As depicted in FIG. 13G, the metal film 62' removal creates a gap between the surface 64, 74 and the first functionalized layer 24. A variety of methods may be performed for increasing adhesion between the first functionalized layer 24 and either the surface 64 of the resin layer 14' at the deep portion 48 or the first region 74 of the surface of the base support 17'. These methods may also improve the adhesion between the first functionalized layer 24 and the remaining portion of the perimeter 29, P.

The following are examples of methods that may be used to increase adhesion between the first functionalized layer 24 and the surface 64 of the resin layer 14'.

In one example, increasing the adhesion between the first functionalized layer 24 and the surface 64 at the deep portion 48 involves heating the first functionalized layer 24 and the surface 64 at the deep portion 48. Heating can speed up covalent bonding between the first functionalized layer 24 and the underlying surface 64. In an example, heating may be performed at a temperature ranging from about 55° C. to about 65° C. for a time ranging from about 25 minutes to about 35 minutes. In another example, heating may be performed at a temperature of about 60° C. for a time of about 30 minutes.

In another example, increasing the adhesion between the first functionalized layer 24 and the surface 64 at the deep portion 48 involves applying a protective coating (not shown) over the first and the second functionalized layers 24, 26; heating the first functionalized layer 24 and the surface 64 at the deep portion 48; and removing the protective coating. The protective coating may be generated using an aqueous solution that includes up to about 15% (mass to volume) of a water soluble material selected from the group consisting of a polyvinyl alcohol/polyethylene glycol graft copolymer (one example of which includes KOLLICOAT® IR, available from BASF Corp.), sucrose, polyacrylamide, dextran (e.g., molecular weight of 200,000 Da), polyacrylamide (e.g., molecular weight of 40,000 Da, 200,000 Da, etc.), polyethylene glycol, ethylenediaminetetraacetic acid sodium salt (i.e., EDTA), tris(hydroxymethyl)aminomethane with ethylenediaminetetraacetic acid, (tris(2-carboxyethyl)phosphine), tris(3-hydroxypropyltriazolylmethyl) amine, bathophenanthrolinedisulfonic acid disodium salt, hydroxyl functional polymers, glycerol, or saline sodium citrate. Any suitable deposition technique may be used to apply the aqueous solution. After the aqueous solution is applied, it may be heated to evaporate the water and form the protective coating. The protective coating may then be removed by exposure to water.

In still another example, increasing the adhesion between the first functionalized layer 24 and the surface 64 at the deep portion 48 involves selectively silanizing the surface 64 at the deep portion 48. For selective silanization, a silane may be used that includes functional groups that can attach to functional groups of the first functionalized layer 24 and functional groups that can attach to the surface 64. Examples of suitable silanes include an amino silane, an alkynyl silane, and a norbornene silane. The amino silane or the alkynyl silane can attach to an azide functional group of the functionalized layer 24. The norbornene silane can respectively attach to an azide functional group or a tetrazine of the functionalized layer. An example of the amino silane may include (3-aminopropyl)trimethoxysilane) (APTMS), (3-aminopropyl)triethoxysilane) (APTES), N-(6-aminohexyl)aminomethyltriethoxysilane (AHAMTES), N-(2-aminoethyl)-3-aminopropyltriethoxysilane (AEAPTES), and N-(2-aminoethyl)-3-aminopropyltrimethoxysilane (AEAPTMS), each of which is available from Gelest. The alkynyl silane may include a cycloalkyne unsaturated moiety, such as O-propargyl)-N-(triethoxysilylpropyl)carbamate, cyclooctyne, a cyclooctyne derivative, or bicyclononynes (e.g., bicyclo[6.1.0]non-4-yne or derivatives thereof, bicyclo[6.1.0]non-2-yne, or bicyclo[6.1.0]non-3-yne). The norbornene silane may be a norbornene derivative, e.g., a (hetero)norbornene including an oxygen or nitrogen in place of one of the carbon atoms. An example of the norbornene silane includes [(5-bicyclo[2.2.1]hept-2-enyl)ethyl] trimethoxysilane.

The silane is introduced into an aqueous solution that the functionalized layer 24 can take up (e.g., absorb), and the appropriate reactions take place between the silane and the respective functional groups. The aqueous silane solution may be applied using any suitable technique, e.g., vapor deposition (e.g., a YES method), spin coating, or other deposition method disclosed herein.

The following are examples of methods that may be used to increase adhesion between the first functionalized layer 24 and the first region 74 of the surface of the base support 17'.

One example of the method of increasing the adhesion between the first functionalized layer 24 and the first region 74 of the surface of the base support 17' involves heating the first functionalized layer 24 and the first region 74 of the surface of the base support 17'. This process may be performed as described herein.

Another example of the method of increasing the adhesion between the first functionalized layer 24 and the first region 74 of the surface of the base support 17' involves: applying a protective coating over the first and the second functionalized layers; heating the first functionalized layer 24 and the first region 74 of the surface of the base support 17'; and removing the protective coating. This process may be performed as described herein.

Still another example of the method of increasing the adhesion between the first functionalized layer 24 and the first region 74 of the surface of the base support 17' involves selectively silanizing the first region 74 of the surface of the base support 17'. This process may be performed as described herein.

In any of the examples of the method of increasing the adhesion between the first functionalized layer 24 and the surface 64 or the first region 74 of the surface of the base support 17', the first functionalized layer 24 is brought into direct contact with the surface 64 or the first region 74. The method may also covalently attach the functionalized layer 24 to the surface 64 or the first region 74. The resulting structure is shown schematically in FIG. 13H. FIG. 13H depicts the depression 20 with the first functionalized layer 24 in direct contact with the surface 64 or the first region 74 of the base support 17', and the second functionalized layer 26 adjacent to the first functionalized layer 26.

In FIG. 13I, the functionalized layer 26 that is positioned over the new interstitial regions 22' is removed, e.g., using a polishing process as described, for example, in reference to FIG. 9H.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

While not shown, the methods of FIG. 10A through FIG. 10C or FIG. 10A, FIG. 10D, FIG. 10B, and FIG. 10C in combination with FIG. 13A through FIG. 13I and also include attaching respective primer sets 30, 32 to the functionalized layers 24, 26. In some examples, the primers 34, 36 or 34', 36' (not shown in FIG. 10A through FIG. 10D or in FIG. 13A through FIG. 13I) may be pre-grafted to the functionalized layer 24. Similarly, the primers 38, 40 or 38', 40' (not shown in FIG. 10A through FIG. 10D or in FIG. 13A through FIG. 13I) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 13B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied and prior to subsequent processing (e.g., at FIG. 13E), or after the second functionalized layer 26 is applied and processed (e.g., at FIG. 13F, FIG. 13H, or FIG. 13I) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 13I, it is to be understood that the method described in reference to FIG. 10A through FIG. 10C or FIG. 10A, FIG. 10D, FIG. 10B, and FIG. 10C in combination with FIG. 13A through FIG. 13I may be performed to generate an array of depressions 20 (each having functionalized layers 24, 26 therein) across the resin layer 14', 18'.

Figures 14A, 14B, 14C, 14D, 14E, 14F, 14G, 14H, 14I:
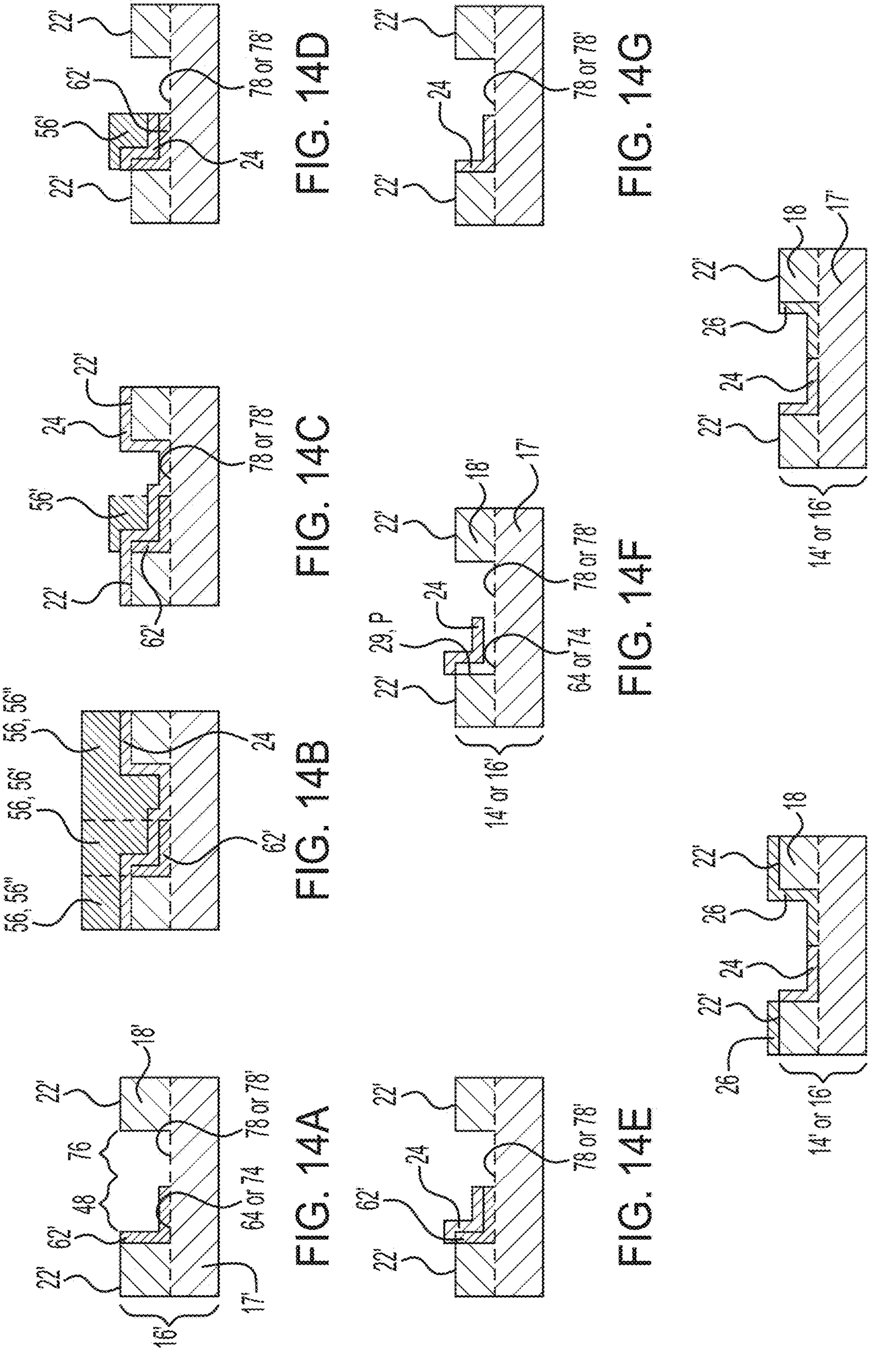
FIG. 14A through FIG. 14I are schematic views that together with FIG. 10A through FIG. 10D depict an example of a method to generate a flow cell surface.

In addition to the processes described in reference to either FIG. 10A through FIG. 10C or FIG. 10A, FIG. 10D, FIG. 10B, and FIG. 10C (which generates the metal film 62'), the method shown in FIG. 14A through FIG. 14I generally includes: removing portions of the resin layer i) at the shallow portion 50 of the multi-depth depression 20' to form a depression region 76 having a surface 78, 78' that is directly adjacent to a surface 64, 74 at the deep portion 48 and ii) at the interstitial regions 22 to form new interstitial regions 22' surrounding the deep portion 48 and the depression region 76 (FIG. 14A); depositing a first functionalized layer 24 over the metal film 62', the depression region 76, and the new interstitial regions 22' (FIG. 14B); depositing a positive photoresist 56 over the first functionalized layer 24 (FIG. 14B); directing, through the resin layer 14' or, alternatively, through the base support 17' and the resin layer 18', an ultraviolet light dosage, thereby forming an insoluble positive photoresist 56' over the first functionalized layer 24 over the metal film 62' and a soluble positive photoresist 56" over the surface 78, 78' of the depression region 76 and the new interstitial regions 22'; removing the soluble positive photoresist 56" (FIG. 14C); ashing the first functionalized layer 24 from the surface 78, 78' of the depression region 76 and the new interstitial regions 22' (FIG. 14D); removing the insoluble positive photoresist 56' (FIG. 14E); wet etching the metal film 62' from the deep portion 48, whereby the first functionalized layer 24 over the metal film 62' remains intact (FIG. 14F); increasing adhesion between the first functionalized layer 24 and the surface 64, 74 at the deep portion 48 (FIG. 14G); depositing a second functionalized layer 26 over the surface 78, 78' of the depression region 76 and the new interstitial regions 22' (FIG. 14H); and polishing the new interstitial regions 22' (FIG. 14I).

The removal of the portions of the resin layer 14', 18' to form the depression region 76 and the new interstitial regions 22' is shown in FIG. 14A. The resin layer 14', 18' may be dry etched using any of the examples set forth herein, e.g., an anisotropic oxygen plasma, a $CF_4$ plasma, or a mixture of 90% $CF_4$ and 10% $O_2$ plasma. In this example, dry etching removes exposed portions of the resin layer 14', 18', e.g., at the interstitial regions 22 and at the step feature 80 that defines the surface 66 and the shallow portion 50 (see FIG. 10C). When the resin layer 14' is used, this dry etching process may be a timed dry etch that is performed for a measured amount of time to create the surface 78 which is substantially co-planar with the surface 64 that had been at the deep portion 48 (see FIG. 14A). In this particular example, the surface is the surface 78 of the depression region 76. Alternatively, when the resin layer 18' is used, this dry etching process may be performed until the surface 78' of the base support 17' is reached, which acts as an etch stop. The surface 78' is co-planar with the surface 74 (see FIG. 14A). In this example, the removal of portions (e.g., step feature 80) of the resin layer 18' at the shallow portion 50 of the multi-depth depression 20' exposes a second region of the surface of the base support 17', wherein the second region of the surface of the base support 17' is the surface 78' of the depression region 76. As shown in FIG. 14A, this dry etching process removes the step feature 80 of the resin layer 14', 18' (which had defined the shallow portion 50) in order to create the depression region 76. This dry etching process also removes a portion of the perimeter sidewall 29, P. The resulting structure is the single depth depression 20 shown in FIG. 14A.

As shown in FIG. 14A, the metal film 62' remains intact after the resin layer 14', 18' is dry etched.

Referring now to FIG. 14B, the method then includes depositing the functionalized layer 24. When the resin layer 14' is used, the applied functionalized layer 24 is positioned over the metal film 62' and over exposed surfaces of the resin layer 14' (including over surface 78 and new interstitial regions 22'). When the multi-layer structure 16' is used, the applied functionalized layer 24 is positioned over the metal film 62', over exposed surfaces of the resin layer 18', and over the exposed surface 78' of the base support 17'. The functionalized layer 24 may be any of the gel materials described herein and may be applied using any suitable deposition technique. A curing process may be performed after deposition. The functionalized layer 24 covalently attaches to the exposed surfaces of the resin layer 14' or to the exposed surfaces of the resin layer 18' and the base support 17' (including surface 78').

FIG. 14B also depicts depositing a positive photoresist 56 over the first functionalized layer 24. The positive photoresist 56 may be any of the positive photoresists described herein. The positive photoresist 56 is then exposed to an ultraviolet light dosage through the resin layer 14' or the base support 17' and the resin layer 18', which forms an insoluble positive photoresist 56' over the metal film 62' and the first functionalized layer 24 at (what had been) the deep portion 48, and a soluble positive photoresist 56" over the surface 78, 78' of the depression region 76 and the new interstitial regions 22'. The metal film 62' blocks the light from reaching the positive photoresist 56 overlying the metal film 62', and thus this portion becomes insoluble. The insoluble positive photoresist 56' is shown in FIG. 14C. The remainder of the positive photoresist 56 is exposed to the light and thus becomes soluble. FIG. 14C also depicts when the soluble positive photoresist 56" is removed from the surface 78, 78' of the depression region 76 and the new interstitial regions 22'. The soluble positive photoresist 56" is removed using any suitable developer described herein for positive photoresists 56.

After developer exposure, the insoluble positive photoresist 56' remains over the metal film 62' positioned over the first functionalized layer 24 at what had been, prior to resin layer 14', 18' etching, the deep portion 48.

FIG. 14D depicts ashing the first functionalized layer 24 from the surface 78, 78' of the depression region 76 and the new interstitial regions 22'. The ashing may be performed as described herein, and removes the first functionalized layer 24 to expose the surface 78, 78' of the depression region 76 and the new interstitial regions 22'. The insoluble positive photoresist 56' is not susceptible to the ashing process, and thus the insoluble positive photoresist 56', the first functionalized layer 24, and the metal film 62' remain in what had been the deep portion 48 after the ashing process.

Referring now to FIG. 14E, the insoluble positive photoresist 56' is removed, e.g., with a lift-off process. The lift-off process may be performed with any suitable remover, which depends, in part, on the type of positive photoresist 56 used. The first functionalized layer 24 and the metal film 62' remain intact, and are not removed with the insoluble positive photoresist 56' as the layer and film 24, 62' are inert to the remover.

FIG. 14F depicts when the metal film 62' is removed from what had been, prior to resin layer 14', 18' etching, the deep portion 48. The metal film 62' may be removed by a wet etching process, which depends upon the material of the metal film 62'. In an example, the metal film 62' (e.g., aluminum having about 30 nm thickness) can be etched by exposure to a 1-2% KOH solution or a sodium carbonate buffer (pH~10) for about 3 to 5 minutes, without mechanical stress including agitation or sonication. The etching process can be slowed by diluting the etchant and increasing the duration of the process, which may improve the retention of the functionalized layer 24. The removal of the metal film 62' does not remove the first functionalized layer 24 deposited over the metal film 62' at what had been the deep portion 48, but does expose the surface 64, 74. The underlying surface 64, 74 may be inert to the wet etching process.

As depicted in FIG. 14F, the metal film 62' removal creates a gap between the surface 64, 74 and the first functionalized layer 24. A variety of methods may be performed for increasing adhesion between the first functionalized layer 24 and either the surface 64 of the resin layer 14' at the deep portion 48 or the first region 74 of the surface of the base support 17'. These methods may also improve the adhesion between the first functionalized layer 24 and the remaining portion of the perimeter 29, P. Any of the methods for increasing adhesion described in reference to the FIG. 13 series of figures may be used.

In any of the examples of the method of increasing the adhesion between the first functionalized layer 24 and the surface 64 or the first region 74 of the surface of the base support 17', the first functionalized layer 24 is brought into direct contact with the surface 64 or the first region 74. The method may also covalently attach the functionalized layer 24 to the surface 64 or the first region 74. The resulting structure is shown schematically in FIG. 14G. FIG. 14G depicts the depression 20 with the first functionalized layer 24 in direct contact with the surface 64 or the first region 74 of the base support 17'.

Referring now to FIG. 14H, the second functionalized layer 26 may then be applied over the surface 78, 78' and the new interstitial regions 22'. The second functionalized layer 26 (e.g., the gel material that forms the second functionalized layer 26) may be applied using any suitable deposition technique. In this example, the second functionalized layer 26 is applied under high ionic strength as described herein, and thus does not contaminate the first functionalized layer 24.

In FIG. 14I, the functionalized layer 26 that is positioned over the new interstitial regions 22' is removed, e.g., using a polishing process as described, for example, in reference to FIG. 9H.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

While not shown, the methods of FIG. 10A through FIG. 10C or FIG. 10A, FIG. 10D, FIG. 10B, and FIG. 10C in combination with FIG. 14A through FIG. 14I and also include attaching respective primer sets 30, 32 to the functionalized layers 24, 26. In some examples, the primers 34, 36 or 34', 36' (not shown in FIG. 10A through FIG. 10D or in FIG. 14A through FIG. 14I) may be pre-grafted to the functionalized layer 24. Similarly, the primers 38, 40 or 38', 40' (not shown in FIG. 10A through FIG. 10D or in FIG. 14A through FIG. 14I) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 14B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 14H or FIG. 14I) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 14I, it is to be understood that the method described in reference to FIG. 10A through FIG. 10C or FIG. 10A, FIG. 10D, FIG. 10B, and FIG. 10C in combination with FIG. 14A through FIG. 14I may be performed to generate an array of depressions 20 (each having functionalized layers 24, 26 therein) across the resin layer 14', 18'.

Figure 15A:
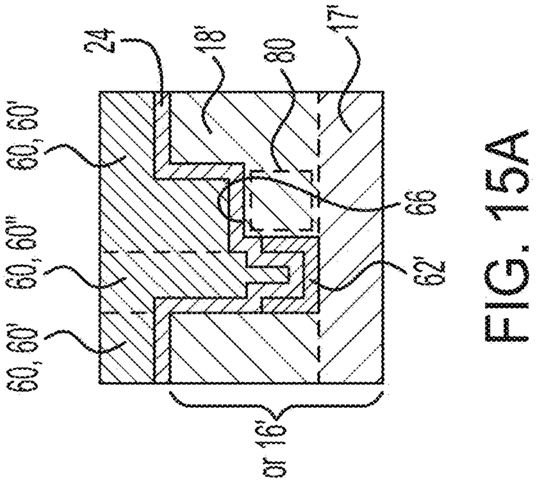
FIG. 15A through FIG. 15F are schematic views that together with FIG. 10A through FIG. 10D depict an example of a method to generate a flow cell surface.
Figure 15B:
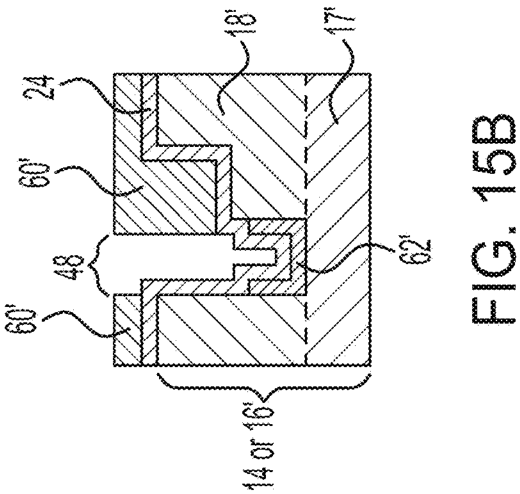
Figure 15C:
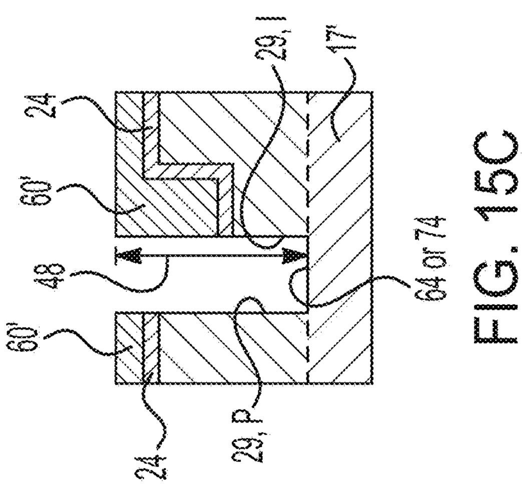
Figure 15D:
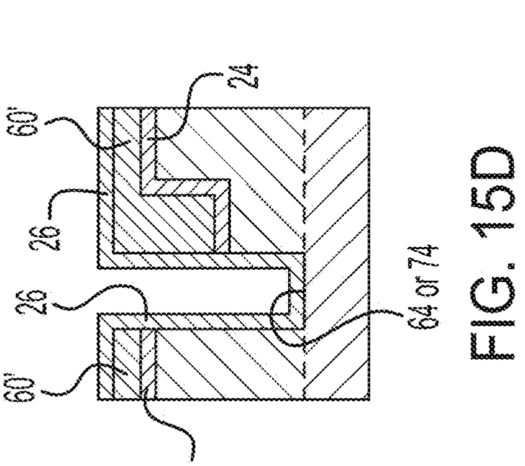
Figure 15E:
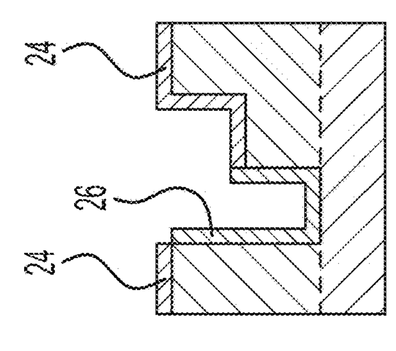
Figure 15F:
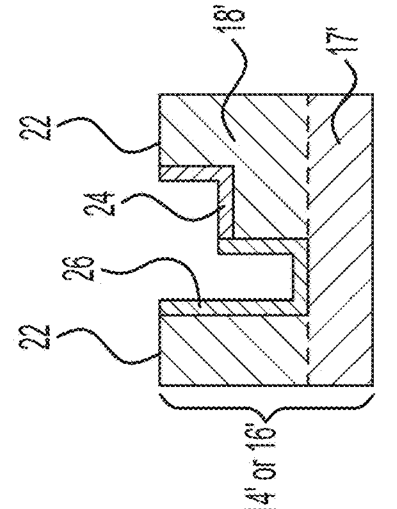
Figure 15F:
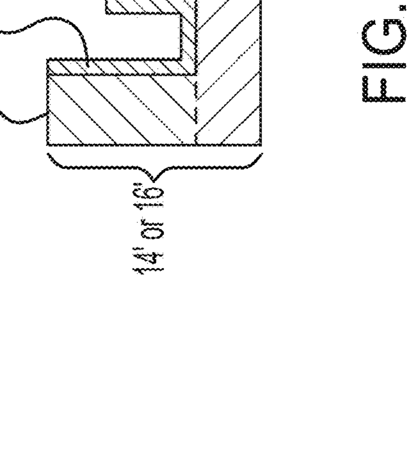

The method described in either FIG. 10A through FIG. 10C or FIG. 10A, FIG. 10D, FIG. 10B, and FIG. 10C, in conjunction with FIG. 15A through FIG. 15F generally includes: forming a metal film 62 over a resin layer 14', 18' including a plurality of multi-depth depressions 20' separated by interstitial regions 22, each multi-depth depression 20' including a deep portion 48 and a shallow portion 50 adjacent to the deep portion 48 defined by the resin layer 14', 18' (shown in FIG. 10B); forming a sacrificial layer 52 over the metal film 62 (FIG. 10B); sequentially dry etching the sacrificial layer 52 and the metal film 62 to expose the shallow portion 50 and the interstitial regions 22 (which forms metal film 62', FIG. 10C); lifting off the sacrificial layer 52 to expose the metal film 62' (FIG. 15A); depositing a first functionalized layer 24 over the metal film 62' and the interstitial regions 22 and in the shallow portion 50 (FIG. 15A); depositing a negative photoresist 60 over the first functionalized layer 24 (FIG. 15A); directing, through the resin layer 14', 18', an ultraviolet light dosage, thereby forming an insoluble negative photoresist 60' over interstitial regions 22 and in the shallow portion 50 and a soluble negative photoresist 60" over the first functionalized layer 24 over the metal film 62' (FIG. 15B); ashing the first functionalized layer 24 from over the metal film 62' (FIG. 15C); etching the metal film 62' from the deep portion 48 (FIG. 15C); depositing a second functionalized layer 26 over the insoluble negative photoresist 60' and in the deep portion 48 (FIG. 15D); lifting off the insoluble negative photoresist 60' (FIG. 15E); and polishing the first functionalized layer 24 from the interstitial regions 22 (FIG. 15F).

The metal film 62' (shown in FIG. 10C) may be formed over the resin layer 14', or alternatively over the base support 17' and resin layer 18' as described herein in reference to, respectively, FIG. 10A through FIG. 10C or FIG. 10A, FIG. 10D, FIG. 10B, and FIG. 10C. Any of the materials and methods described in reference to these figures may be used.

The method then continues at FIG. 15A, which depicts several of the processes, including the removal of the sacrificial layer 52 to expose the metal film 62' in the deep portion 48, the application of the first functionalized layer 24, and the application of the negative photoresist 60.

The sacrificial layer 52 (shown in FIG. 10C) may be removed via a lift-off process. The lift-off process may be performed with any suitable remover, which depends, in part, on the type of sacrificial layer 52 used. Upon removal of the sacrificial layer 52, the underling metal film 62' is exposed.

FIG. 15A depicts the first functionalized layer 24 deposited over the metal film 62', over the interstitial regions 22, and over the shallow portion 50. When the resin layer 14' is used, the applied functionalized layer 24 is positioned over the metal film 62' and over exposed surfaces of the resin layer 14' (including over surface 66 and the interstitial regions 22). When the multi-layer structure 16' is used, the applied functionalized layer 24 is also positioned over the metal film 62', and over exposed surfaces of the resin layer 18' (including over surface 66 and the interstitial regions 22). The functionalized layer 24 may be any of the gel materials described herein and may be applied using any suitable deposition technique. A curing process may be performed after deposition. The functionalized layer 24 covalently attaches to the exposed surfaces of the resin layer 14', 18'.

FIG. 15A also depicts the negative photoresist 60 deposited over the first functionalized layer 24. The negative photoresist 60 may be any of the negative photoresists described herein. The deposited negative photoresist 60 is then exposed to an ultraviolet light dosage through the resin layer 14', or alternatively, the base support 17' and resin layer 18', thereby forming an insoluble negative photoresist 60' over the interstitial regions 22 and in the shallow portion 50, and a soluble negative photoresist 60" over the first functionalized layer 24 over the metal film 62'. The metal film 62' blocks the light from reaching the negative photoresist 60 overlying the metal film 62', and thus this portion becomes soluble. The soluble negative photoresist 60" is then removed, using any suitable developer described herein for negative photoresists 60.

After developer exposure, the insoluble negative photoresist 60' remains over the first functionalized layer 24 at the shallow portion 50, and the interstitial regions 22. The insoluble negative photoresist 60' is shown in FIG. 15B.

The method then continues at FIG. 15C, which depicts several of the processes, including the sequential removal of the first functionalized layer 24 and the metal film 62' to expose the surface 64 of the resin layer 14' or the surface 74 of the base support 17'.

FIG. 15C depicts when the first functionalized layer 24 is removed from the metal film 62' positioned over the surface 64, 74 of the deep portion 48. As depicted, the first functionalized layer 24 is also removed from a portion of the perimeter 29, P that defines the deep portion 48. The first functionalized layer 24 may be removed via an ashing process. The ashing process may be performed as described herein, and removes the first functionalized layer 24 to expose the metal film 62'. The insoluble negative photoresist 60' is not susceptible to the ashing process, and thus the insoluble negative photoresist 60' and the underlying first functionalized layer 24 remain in the shallow portion 50 and over the interstitial regions 22 after the ashing process.

FIG. 15C also depicts when the metal film 62' is removed from the deep portion 48. The metal film 62' may be removed by a wet etching or lift-off process, which depends upon the material of the metal film 62'. As examples, an aluminum metal film 62' can be removed in acidic or basic conditions, a copper metal film 62' can be removed using $FeCl_3$, a copper, gold or silver sacrificial layer can be removed in an iodine and iodide solution, and a silicon metal film 62' can be removed in basic (pH) conditions. The removal of the metal film 62' exposes the surface 64 of the resin layer 14' at the deep portion 48 when the resin layer 14' is used. The removal of the metal film 62' exposes the surface 74 of the base support 17' at the deep portion 48 when the resin layer 18' is used. The removal of the metal film 62' also exposes the remainder of the perimeter 29, P that defines the deep portion 48 as well as the interior wall 29, I.

FIG. 15D depicts the deposition of the second functionalized layer 26, which is applied over the exposed surface 64, 74 and the insoluble negative photoresist 60'. The second functionalized layer 26 (e.g., the gel material that forms the second functionalized layer 26) may be applied using any suitable deposition technique. The second functionalized layer 26 does not contaminate the first functionalized layer 24, which is covered by the insoluble negative photoresist 60'.

Referring now to FIG. 15E, the insoluble negative photoresist 60' is removed through a lift-off process. The lift-off process may be any suitable lift-off process described herein. The lift-off process involves exposing the insoluble negative photoresist 60' to a suitable remover for the type of negative photoresist 60 used. As shown in FIG. 15E, the removal process removes i) at least 99% of the insoluble negative photoresist 60' and ii) the second functionalized layer 26 thereon. This removal process leaves the second functionalized layer 26 that is positioned on the surface 64 or 74, and also leaves the first functionalized layer 24 intact. These portions of the functionalized layers 24, 26 remain intact, in part because they are covalently attached to the resin layer 14' or 18' and/or base support 17'.

In FIG. 15F, the functionalized layer 24 that is positioned over the interstitial regions 22 is removed, e.g., using a polishing process as described, for example, in reference to FIG. 9H.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

As depicted in FIG. 15F, the functionalized layer 24 is positioned on one half of the multi-depth depression 20' (at the shallow portion 50 and the adjacent portion of the perimeter 29, P) and the functionalized layer 26 is positioned on the other half of the multi-depth depression 20' (at the deep portion 48 and the adjacent portion of the perimeter 29, P). As such, the padlock like conformation 33 is eliminated.

While not shown, the methods of FIG. 10A through FIG. 10C or FIG. 10A, FIG. 10D, FIG. 10B, and FIG. 10C in combination with FIG. 15A through FIG. 15F also include attaching respective primer sets 30, 32 to the functionalized layers 24, 26. In some examples, the primers 34, 36 or 34', 36' (not shown in FIG. 10A through FIG. 10D or in FIG. 15A through FIG. 15F) may be pre-grafted to the functionalized layer 24. Similarly, the primers 38, 40 or 38', 40' (not shown in FIG. 10A through FIG. 10D or in FIG. 15A through FIG. 15F) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 15A). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 15D); or after insoluble negative photoresist 60' removal (e.g., at FIG. 15E or FIG. 15F) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 15F, it is to be understood that the method described in reference to FIG. 10A through FIG. 10C or FIG. 10A, FIG. 10D, FIG. 10B, and FIG. 10C in combination with FIG. 15A through FIG. 15F may be performed to generate an array of depressions 20' (each having functionalized layers 24, 26 therein) across the resin layer 14', 18'.

Methods with Varying Thickness

Other examples of the methods disclosed herein use a resin layer with varying thickness and UV transmission characteristics to create a mask that is used to pattern a photoresist 51, which, in turn, is used to pattern the functionalized layer(s) 24, 26.

Two examples of these methods are shown in FIG. 16A through FIG. 16M, with one example including FIG. 16A through FIG. 16H and the other example including FIG. 16A through FIG. 16C and FIG. 16I through FIG. 16M.

Figures 16A, 16B, 16C, 16D, 16E, 16F, 16G, 16H:
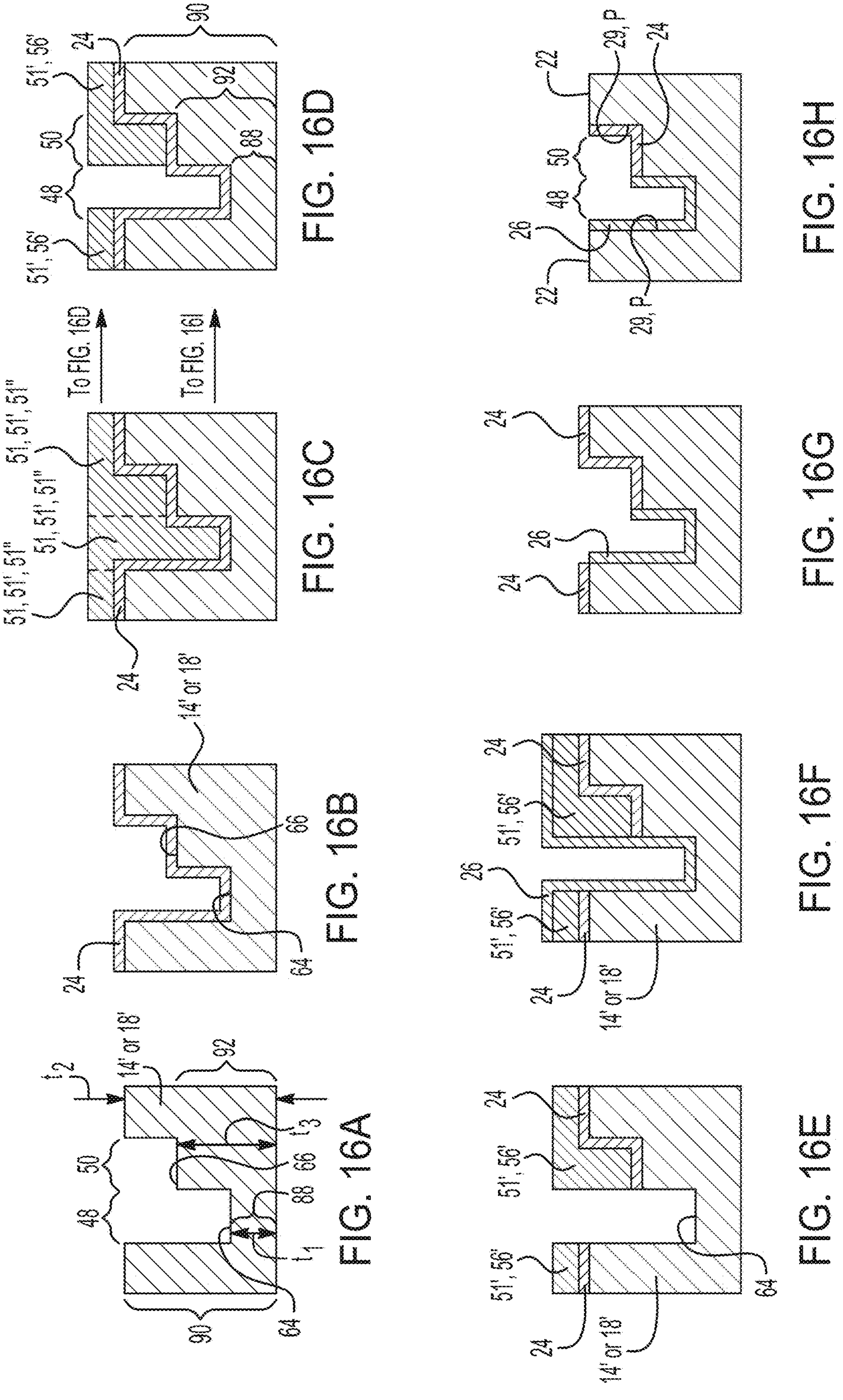
FIG. 16A through FIG. 16M are schematic views that together depict an example of a method to generate a flow cell surface.

In the series of figures from FIG. 16A through FIG. 16C, the method shown generally includes: depositing a first functionalized layer 24 over a resin layer 14', 18' including a plurality of multi-depth depressions 20' separated by interstitial regions 22, each multi-depth depression 20' including a deep portion 48 and a shallow portion 50 adjacent to the deep portion 48 (FIG. 16B); depositing a photoresist 51 over the first functionalized layer 24 (FIG. 16C); and directing, through the resin layer 14', 18', an ultraviolet light dosage, whereby a first portion of the photoresist 51 generates an insoluble photoresist 51' and a second portion becomes a soluble photoresist 51" (FIG. 16C).

One example of the method continues at FIG. 16D through FIG. 16H, which includes: removing the soluble photoresist 51", thereby exposing a portion of the first functionalized layer 24 (FIG. 16D); removing the portion of the first functionalized layer 24, thereby exposing a portion of resin layer 14', 18' (FIG. 16E); depositing a second functionalized layer 26 over the insoluble photoresist 51', and over the exposed portion of the resin layer 14', 18' (FIG. 16F); removing the insoluble photoresist 51', thereby exposing the first functionalized layer 24 (FIG. 16G); and polishing the first functionalized layer 24 or the second functionalized layer 26 from the interstitial regions 22 (FIG. 16H).

In this specific series, the method shown at FIG. 16A through FIG. 16H depicts when the photoresist 51 is a positive photoresist 56; and as a result of the ultraviolet light dosage, the positive photoresist 56 in the shallow portion 50 and the interstitial regions 22 becomes the insoluble photoresist 51', 56' and the positive photoresist 56 in the deep portion 48 becomes the soluble photoresist 51"; the deep portion 48 is exposed upon removal of the soluble photoresist 51"; the second functionalized layer 26 is deposited in the deep portion 48 and over the insoluble photoresist 51', 56'; the removal of the insoluble photoresist 51', 56' exposes the first functionalized layer 24 in the shallow portion 50 and over the interstitial regions 22; and the polishing removes the first functionalized layer 24 from the interstitial regions 22.

FIG. 16A depicts the multi-depth depression 20', with a deep portion 48 and a shallow portion 50 adjacent to the deep portion 48. The multi-depth depression 20' is defined in either the single layer base support 14' or the resin layer 18' of the multi-layered structure 16' as described herein. As such, the term "resin layer" may be referred to as "resin layer 14', 18'" throughout the description of this method. The underlying base support 17' of the multi-layered structure 16' is not shown in FIG. 16A through FIG. 16M.

As mentioned, the resin layer 14', 18' has varying thicknesses and UV transmission characteristics to create a mask that is used to pattern the photoresist 51. In this example, the deep portion 48 overlies a first resin portion 88 having a first thickness $t_1$ and the interstitial regions 22 overlie a second resin portion 90 having a second thickness $t_2$ that is greater than the first thickness $t_1$. The first thickness $t_1$ is selected to allow UV light to transmit through the resin layer 14', 18' at the first resin portion 88 and the second thickness $t_2$ is selected to block UV light from transmitting through the resin layer 14', 18' at the second resin portion 90. The shallow portion 50 overlies a third resin portion 92 having a third thickness $t_3$. The third thickness $t_3$ is selected to block UV light from transmitting through the resin layer 14', 18' at the third resin portion 92. The varying thicknesses $t_1$, $t_2$, $t_3$ are obtained when the multi-depth depression 20' is etched, imprinted, etc.

FIG. 16B depicts the deposition of a first functionalized layer 24 over the multi-depth depression 20' and the interstitial regions 22. The first functionalized layer 24 is deposited over the resin layer 14', or alternatively, the resin layer 18'. The functionalized layer 24 may be any of the gel materials described herein and may be applied using any suitable deposition technique. A curing process may be performed after deposition. The functionalized layer 24 covalently attaches to the exposed surfaces of the resin layer 14', 18', such as the surface 64 of the deep portion 48, the surface 66 of the shallow portion 50, and the interstitial regions 22.

FIG. 16C depicts the deposition of a photoresist 51. The photoresist 51 may be any of the photoresists described herein, i.e., a positive photoresist 56 or a negative photoresist 60. Ultraviolet light is then directed through the backside of the resin layer 14' or the base support 17' (not shown) and the resin layer 18' to pattern the photoresist 51 and generate an insoluble photoresist 51' or a soluble photoresist 51". As described herein, the base support 17', when used, is able to transmit of the UV light used for the backside exposure.

In this specific example of the method, the photoresist 51 is a positive photoresist 56. As described, the first thickness $t_1$ is selected to allow UV light to transmit through the resin layer 14', 18' and the second and third thicknesses $t_2$, $t_3$ are selected to block UV light from transmitting through the resin layer 14', 18'. As such, the portion of the photoresist 51, 56 overlying the first resin portion 88 becomes soluble due to the exposure to the UV light, and the portions of the photoresist 51, 56 overlying the second and third resin portions 90, 92 become insoluble due to the lack of exposure to the UV light. In other words, when exposed to the ultraviolet light dosage, the insoluble photoresist 51', 56' forms over the shallow portion 50 and the interstitial regions 22 and the soluble photoresist 51" forms over the deep portion 48 and is removed (see FIG. 16D).

As noted, FIG. 16D also depicts the removal of the soluble photoresist 51". The soluble photoresist 51" is removed using any suitable developer described herein for positive photoresists 56. The removal of the soluble photoresist 51" exposes the first functionalized layer 24 in the deep portion 48.

FIG. 16E depicts removing the portion of the first functionalized layer 24, thereby exposing a portion of resin layer 14', 18'. The functionalized layer 24 may be removed by ashing, as described in FIG. 14D. The ashing process removes the first functionalized layer 24 to expose the surface 64 of the deep portion 48. The insoluble photoresist 51', 56' is not susceptible to the ashing process, and thus the insoluble photoresist 51', 56' and the first functionalized layer 24 underneath remain in the shallow portion 50 and over the interstitial regions 22 after the ashing process.

FIG. 16F depicts the second functionalized layer 26 deposited over the insoluble photoresist 51' and the exposed surface 64 of the deep portion 48. The second functionalized layer 26 may be any of the gel materials described herein, and may be deposited using any suitable technique. The second functionalized layer 26 does not contaminate the first functionalized layer 24, which is covered by the insoluble photoresist 51', 56'.

FIG. 16G depicts the removal of the insoluble photoresist 51', 56'. The insoluble photoresist 51', 56' may be removed via a lift-off process. The lift-off process may be any suitable lift-off process described herein, and may involve exposing the insoluble photoresist 51', 56' to a suitable remover for the type of positive photoresist 56 used. As shown in FIG. 16G, the removal process removes i) at least 99% of the insoluble photoresist 51', 56' and ii) the second functionalized layer 26 thereon. This removal process leaves the second functionalized layer 26 that is positioned on the surface 64, and also leaves the first functionalized layer 24 intact. These portions of the functionalized layers 24, 26 remain intact, in part because they are covalently attached to the resin layer 14' or 18'.

FIG. 16H depicts the removal of the functionalized layer 24 that is positioned over the interstitial regions 22, e.g., using a polishing process as described, for example, in reference to FIG. 9H.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

As depicted in FIG. 16H, the functionalized layer 24 is positioned on one half of the multi-depth depression 20' (at the shallow portion 50 and the adjacent portion of the perimeter sidewall 29, P), and the functionalized layer 26 is positioned on the other half of the multi-depth depression 20' (at the deep portion 48 and the adjacent portion of the perimeter sidewall 29, P). As such, the padlock like conformation 33 is eliminated.

While not shown, the method of FIG. 16A through FIG. 16H also includes attaching respective primer sets 30, 32 to the functionalized layers 24, 26. In some examples, the primers 34, 36 or 34', 36' (not shown in FIG. 16A through FIG. 16H) may be pre-grafted to the functionalized layer 24. Similarly, the primers 38, 40 or 38', 40' (not shown in FIG. 16A through FIG. 16H) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 16B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 16F); or after insoluble photoresist 51' removal (e.g., at FIG. 16G or FIG. 16H) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 16H, it is to be understood that the method described in reference to FIG. 16A through FIG. 16H may be performed to generate an array of depressions 20' (each having functionalized layers 24, 26 therein) across the resin layer 14', 18'.

Figures 16I, 16J, 16K, 16L, 16M:
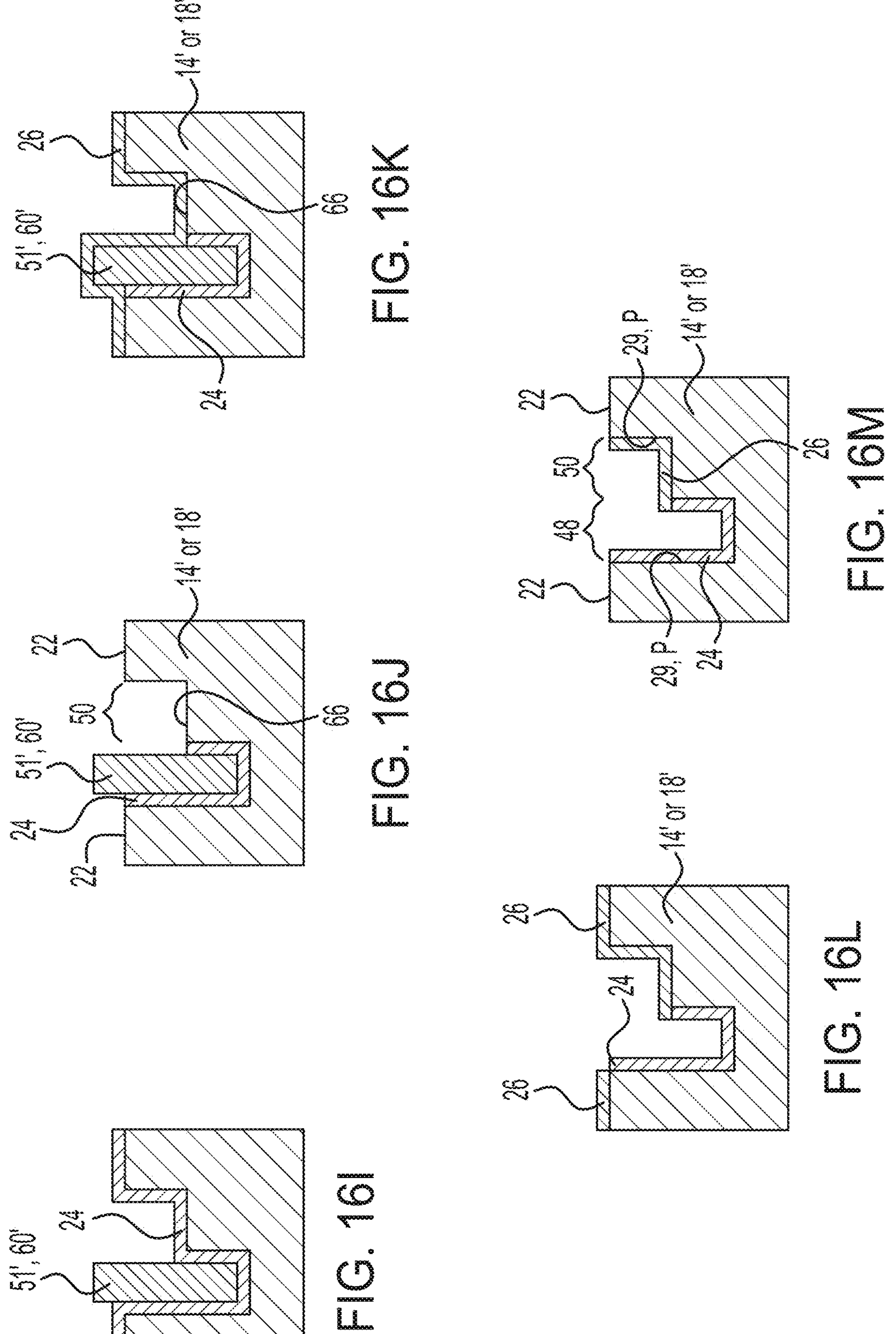

In addition to the processes described in reference to FIG. 16A through FIG. 16C, another example of the method continues at FIG. 16I through FIG. 16M. In this method, the soluble photoresist 51" is removed, thereby exposing a portion of the first functionalized layer 24 (FIG. 16I); removing the portion of the first functionalized layer 24, thereby exposing a portion of resin layer 14', 18' (FIG. 16J); depositing a second functionalized layer 26 over the insoluble photoresist 51', and over the exposed portion of the resin layer 14', 18' (FIG. 16K); removing the insoluble photoresist 51', thereby exposing the first functionalized layer 24 (FIG. 16L); and polishing the first functionalized layer 24 or the second functionalized layer 26 from the interstitial regions 22 (FIG. 16M).

In this specific series, the method shown at FIG. 16A through FIG. 16C and continuing at FIG. 16I through 16M depicts when the photoresist 51 is a negative photoresist 60; and as a result of the ultraviolet light dosage, the negative photoresist 60 in the deep portion 48 becomes the insoluble photoresist 51', 60', and the negative photoresist 60 in the shallow portion 50 and over the interstitial regions 22 becomes the soluble photoresist 51", 60"; the shallow portion 50 and the interstitial regions 22 are exposed upon removal of the soluble photoresist 51", 60"; the second functionalized layer 26 is deposited over the shallow portion 50, the interstitial regions 22, and the insoluble photoresist 51', 60'; the removal of the insoluble photoresist 51', 60' exposes the first functionalized layer 24 in the deep portion 48; and the polishing removes the second functionalized layer 26 from the interstitial regions 22.

The steps of the method depicted in the series of FIG. 16A through FIG. 16B may be performed as described herein.

FIG. 16C depicts the deposition of a photoresist 51. The photoresist 51 may be any of the photoresists described herein, i.e., a positive photoresist 56 or a negative photoresist 60. Ultraviolet light is then directed through the backside of the resin layer 14' or the base support 17' (not shown) and the resin layer 18' to pattern the photoresist 51 and generate an insoluble photoresist 51' or a soluble photoresist 51". As described herein, the base support 17', when used, is able to transmit of the UV light used for the backside exposure.

In the specific example of the method from FIG. 16I through FIG. 16M, the photoresist 51 is a negative photoresist 60. As described, the first thickness $t_1$ is selected to allow UV light to transmit through the resin layer 14', 18' and the second and third thicknesses $t_2$, $t_3$ are selected to block UV light from transmitting through the resin layer 14', 18'. As such, the portion of the photoresist 51, 60 overlying the first resin portion 88 becomes insoluble due to the exposure to the UV light, and the portions of the photoresist 51, 60 overlying the second and third resin portions 90, 92 become soluble due to the lack of exposure to the UV light. In other words, when exposed to the ultraviolet light dosage, the insoluble photoresist 60' forms over the deep portion 48 and the soluble photoresist 60" forms over the over the shallow portion 50 and the interstitial regions 22 and is removed (see FIG. 16I).

As mentioned, FIG. 16I also depicts the removal of the soluble photoresist 51", 60". The soluble photoresist 51", 60" is removed using any suitable developer described herein for negative photoresists 60. The removal of the soluble photoresist 51", 60" exposes the first functionalized layer 24 in the shallow portion 50 and on the interstitial regions 22.

FIG. 16J depicts removing the portion of the first functionalized layer 24, thereby exposing a portion of resin layer 14', 18'. The functionalized layer 24 may be removed by ashing, as described in FIG. 14D. The ashing process removes the first functionalized layer 24 to expose the surface 66 of the shallow portion 50 and the interstitial regions 22. The insoluble photoresist 51', 60' is not susceptible to the ashing process, and thus the insoluble photoresist 51', 60' and the first functionalized layer 24 underneath remain in the deep portion 48 after the ashing process.

FIG. 16K depicts the second functionalized layer 26 deposited over the insoluble photoresist 51', 60' and the exposed surface 66 of the shallow portion 50. The second functionalized layer 26 may be any of the gel materials described herein, and may be deposited using any suitable technique. The second functionalized layer 26 does not contaminate the first functionalized layer 24, which is covered by the insoluble photoresist 51', 60'.

FIG. 16L depicts the removal of the insoluble photoresist 51', 60'. The insoluble photoresist 51', 60' may be removed via a lift-off process. The lift-off process may be any suitable lift-off process described herein, and may involve a suitable remover for the type of negative photoresist 60 used. As shown in FIG. 16L, the removal process removes i) at least 99% of the insoluble photoresist 51', 60' and ii) the second functionalized layer 26 thereon. This removal process leaves the second functionalized layer 26 that is positioned on the surface 66 and the interstitial regions 22, and also leaves the first functionalized layer 24 intact. These portions of the functionalized layers 24, 26 remain intact, in part because they are covalently attached to the resin layer 14' or 18'.

FIG. 16M depicts the removal of the functionalized layer 26 that is positioned over the interstitial regions 22, e.g., using a polishing process as described, for example, in reference to FIG. 9H.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

As depicted in FIG. 16M, the functionalized layer 24 is positioned on one half of the multi-depth depression 20' (at the deep portion 48 and the adjacent portion of the perimeter 29, P) and the functionalized layer 26 is positioned on the other half of the multi-depth depression 20' (at the shallow portion 50 and the adjacent portion of the perimeter 29, P). As such, the padlock like conformation 33 is eliminated.

While not shown, the method of FIG. 16A through FIG. 16C and continuing at FIG. 16I through FIG. 16M also includes attaching respective primer sets 30, 32 to the functionalized layers 24, 26. In some examples, the primers 34, 36 or 34', 36' (not shown in FIG. 16A through 16C and continuing at FIG. 16I through FIG. 16M) may be pre-grafted to the functionalized layer 24. Similarly, the primers 38, 40 or 38', 40' (not shown in FIG. 16A through FIG. 16C and continuing at FIG. 16I through FIG. 16M) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 16B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 16K); or after insoluble negative photoresist 51', 60' removal (e.g., at FIG. 16L or FIG. 16M) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 16M, it is to be understood that the method described in reference to FIG. 16A through FIG. 16C and continuing at FIG. 16I through FIG. 16M may be performed to generate an array of depressions 20' (each having functionalized layers 24, 26 therein) across the resin layer 14', 18'.

Methods with Varying Metal Layer Thickness

Figures 17A, 17B, 17C, 17D, 17E, 17F, 17G, 17H:
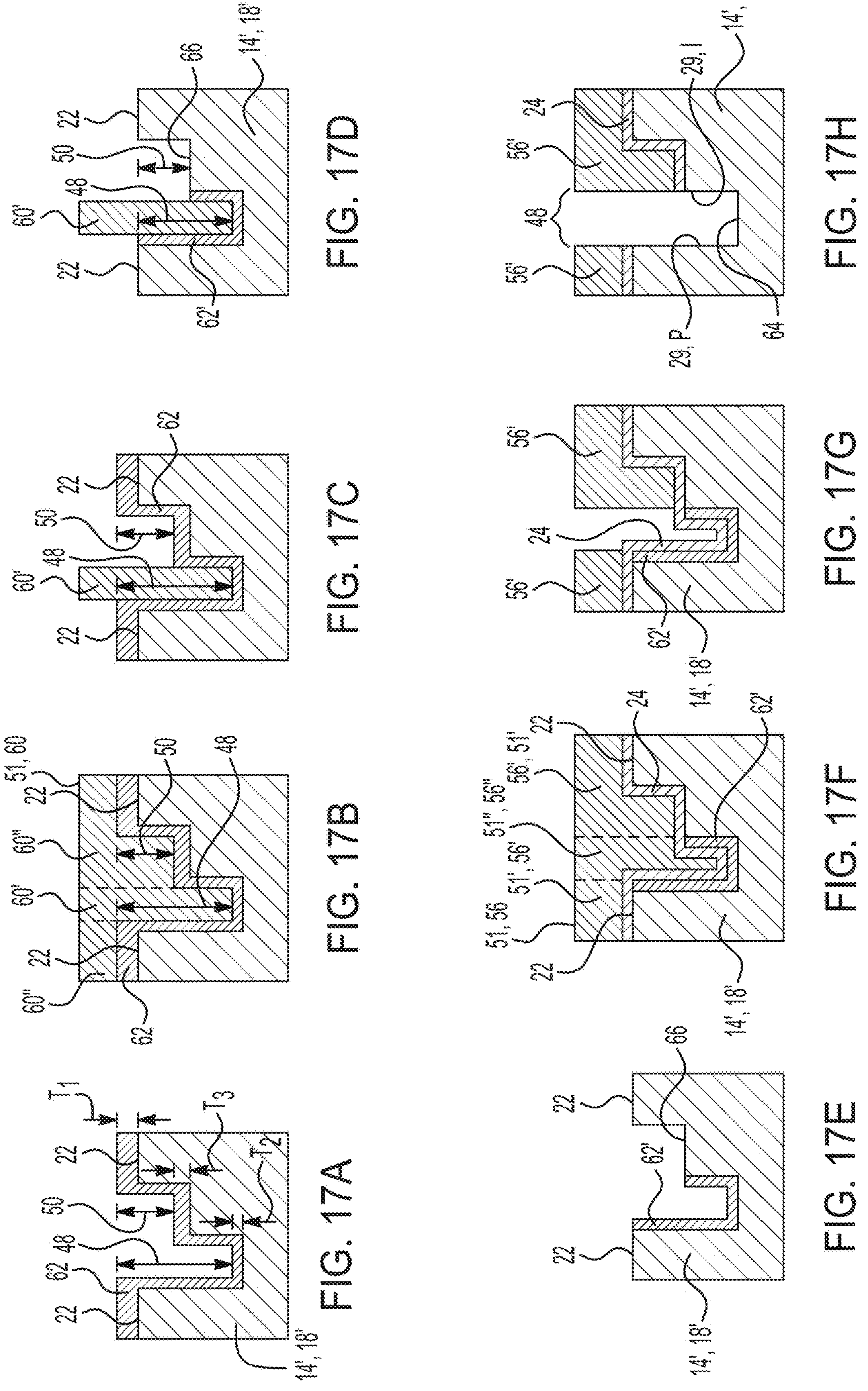
FIG. 17A through FIG. 17K are schematic views that together depict an example of a method to generate a flow cell surface.
Figures 17I, 17J, 17K, 18A, 18B, 18C, 18D:
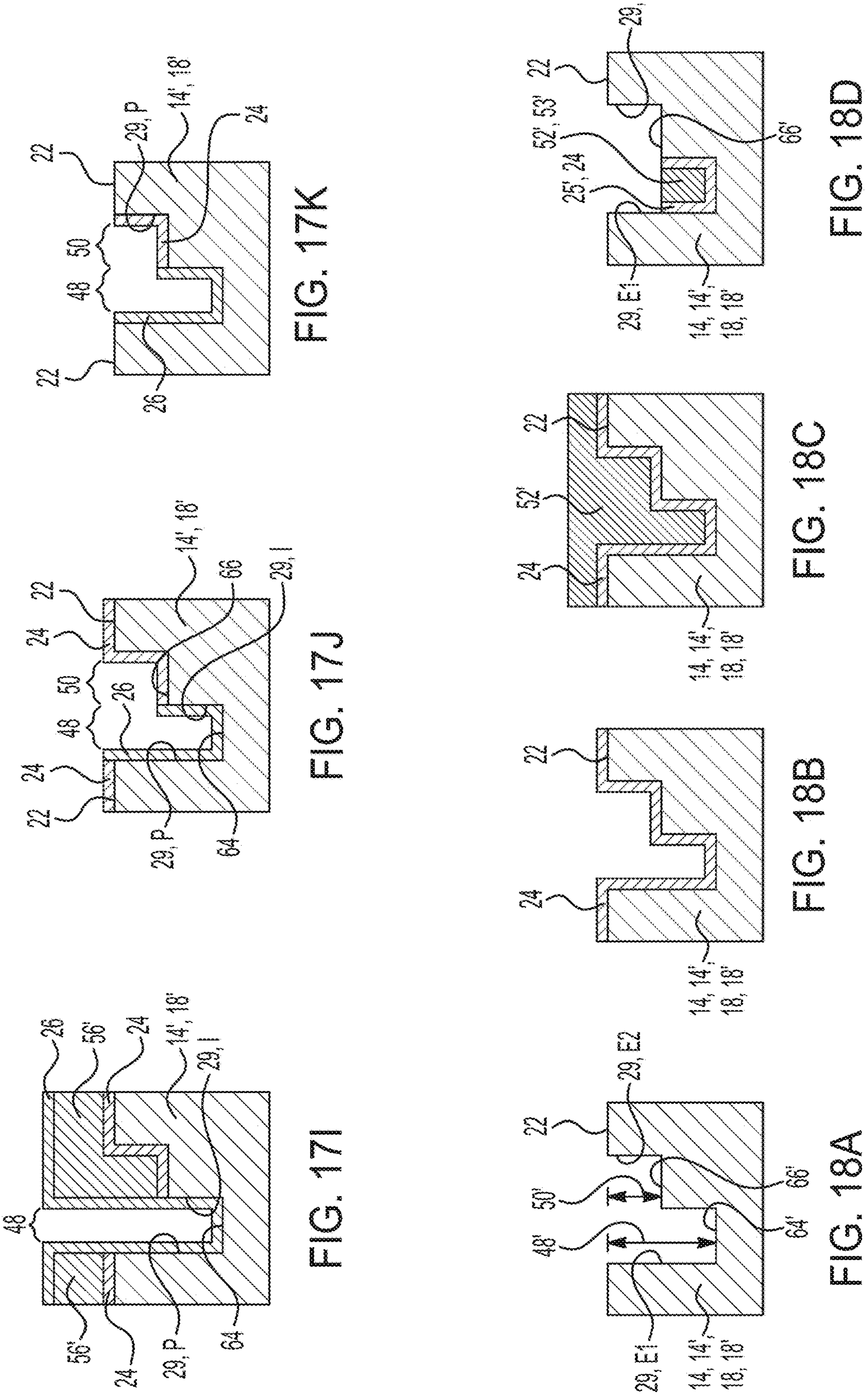
FIG. 18A through FIG. 18I are schematic views that together depict an example of a method to generate a flow cell surface.

In the series of figures from FIG. 17A through FIG. 17K, the method generally includes: depositing a first functionalized layer 24 over a resin layer 14', 18' including a plurality of multi-depth depressions 20' separated by interstitial regions 22, each multi-depth depression 20' including a deep portion 48 and a shallow portion 50 adjacent to the deep portion 48 (FIG. 17F); depositing a photoresist 51 over the first functionalized layer 24 (FIG. 17F); directing, through the resin layer 14', 18', an ultraviolet light dosage, whereby a first portion of the photoresist 51 generates an insoluble photoresist 51' and a second portion becomes a soluble photoresist 51" (FIG. 17F, FIG. 17G); removing the soluble photoresist 51", thereby exposing a portion of the first functionalized layer 24 (FIG. 17G); removing the portion of the first functionalized layer 24, thereby exposing a portion of resin layer 14', 18' (FIG. 17H); depositing a second functionalized layer 26 over the insoluble photoresist 51', and over the exposed portion of the resin layer 14', 18' (FIG. 17I); removing the insoluble photoresist 51', thereby exposing the first functionalized layer 24 (FIG. 17J); and polishing the first functionalized layer 24 or the second functionalized layer 26 from the interstitial regions 22 (FIG. 17K).

In this specific example of the method, prior to the depositing of the first functionalized layer 24, the method further includes: forming a metal film 62 by sputtering or thermally evaporating a metal material over the resin layer 14', 18', the metal film 62 having a first thickness $T_1$ over the interstitial regions 22, a second thickness $T_2$ over the deep portion 48, and a third thickness $T_3$ over the shallow portion 50, wherein the second thickness $T_2$ is about 30 nm or less and is at least 10 nm thinner than the first thickness $T_1$ and the third thickness $T_3$ is less than the first thickness $T_1$ and greater than the second thickness $T_2$ (FIG. 17A); depositing a negative photoresist 60 over the metal film 62 (FIG. 17B); directing, through the resin layer 14', 18', a second ultraviolet light dosage to form an insoluble negative photoresist 60' overlying the deep portion 48, and a soluble negative photoresist 60" in the shallow portion 50 and over the interstitial regions 22 (also shown in FIG. 17B); removing the soluble negative photoresist 60", thereby exposing the metal film 62 in the shallow portion 50 and over the interstitial regions 22 (FIG. 17C); removing the metal film 62 (leaving a portion of the metal film 62') to expose the resin layer 14', 18' in the shallow portion 50 and at the interstitial regions 22 (FIG. 17D); and removing the insoluble negative photoresist 60', thereby exposing the metal film 62' in the deep portion 48 (FIG. 17E); and wherein the first functionalized layer 24 is deposited over the metal film 62' and the resin layer 14', 18' exposed in the shallow portion 50 and at the interstitial regions 22 (FIG. 17F).

Further still, the example of the method shown in FIG. 17A through FIG. 17K depicts: wherein the photoresist 51 is a positive photoresist 56; as a result of the ultraviolet light dosage, the positive photoresist 56 in the shallow portion 50 and the interstitial regions 22 become the insoluble photoresist 51', 56', and the positive photoresist 56 in the deep portion 48 becomes the soluble photoresist 51", 56"; the deep portion 48 is exposed upon removal of the soluble photoresist 51", 56"; the second functionalized layer 26 is deposited in the deep portion 48 and over the insoluble photoresist 51', 56'; the removal of the insoluble photoresist 51', 56' exposes the first functionalized layer 24 in the shallow portion 50 and over the interstitial regions 22; and the polishing removes the first functionalized layer 24 from the interstitial regions 22.

The method of the series of FIG. 17A through FIG. 17K includes a metal material that is sputter coated or thermally evaporated on the surface of the resin layer 14', 18' of the multi-depth depression 20'. During sputtering, the metal material is deposited at an angle (e.g., 45° or 60°) relative to the surface(s) of the multi-depth depression 20'. This creates a shadow effect in the multi-depth depression 20' where less or no metal material is deposited in an area of the multi-depth depression 20' that is transverse to the incoming metal material. Thus, the substrate is rotated throughout sputtering to introduce the metal material to these area(s) of the multi-depth depression 20'. As the metal material continues to be applied to the interstitial regions 22 as the substrate is rotated, this process deposits more of the metal material on the interstitial regions 22 and less of the metal material in the depressions 20' due, at least in part, to the shadow effect. The pressure may also be adjusted during sputtering. Low pressure (about 5 mTorr or less) renders sputtering more directional, which maximizes the shadow effect. A similar effect may be achieved with thermal evaporation (e.g., using low pressure), and thus this technique may be used instead of sputtering to create the metal film 62. Thus, as a result of sputtering or thermal evaporation, a metal film 62 (see FIG. 17A) is generated having a first thickness $T_1$ over the interstitial regions 22, a second thickness $T_2$ over the surface 64 of the deep portion 48 of the multi-depth depression 20', and a third thickness $T_3$ over the surface 66 of the shallow portion 50 of the multi-depth depression 20'. Sputtering or thermal evaporation is controlled so that the second thickness $T_2$ (which is at least ⅓ times smaller than the first thickness $T_1$) and the third thickness $T_3$ is less than the first thickness $T_1$ and greater than the second thickness $T_2$ (e.g., $T_1>T_3>T_2$). The second thickness $T_2$ may be coupled with a UV light dosage that is able to transmit through the metal film 62 at its thinner portion, i.e. at the deep portion 48, while the first thickness $T_1$ and the third thickness $T_3$ are sufficient to block the same UV light dosage from transmitting through the metal film 62 at its thicker portions, i.e., the shallow portion 50 and the interstitial regions 22 (FIG. 17A). In other examples, the second thickness $T_2$ may be coupled with a UV light dosage that is blocked by the metal film 62' at its thinner portion, i.e., at the deep portion 48 (see, e.g., FIG. 17G).

The second thickness $T_2$ is about 30 nm or less and is at least 10 nm thinner than the first thickness $T_1$. In some examples, the second $T_2$ is 20 nm or less (which provides desirable UV transmittance). As such, in some instances, $T_2 \leq 20 \leq T_1-10$ nm. In one example, the first thickness $T_1$ is about 30 nm and the second thickness $T_2$ is at least 10 nm thinner (e.g., 20 nm or less (e.g., 8.5 nm, 15 nm, etc.). As other examples, $T_1$=40 nm and $T_2$=30 nm; =15 nm and $T_2$=5 nm; =20 nm and $T_2$=10 nm; and $T_1$=25 nm and $T_2$=15 nm.

The metal material used to form the metal film 62 in this example of the method may be titanium, chromium, aluminum, gold, or copper. In some examples, the metal material may be at least substantially pure (<99% pure). In other examples, molecules or compounds of the listed elements may be used as long as the metal film 62 is i) opaque (non-transparent or having transmittance less than 0.25) to the light energy used for light sensitive material alteration in the thick regions and ii) transparent (having transmittance greater than 0.25) to the light energy used for light sensitive material alteration in the thin regions. For example, oxides of any of the listed metals (e.g., aluminum oxide, zinc oxide, titanium dioxide, etc.) may be used, alone or in combination with the listed metal. As a result of sputtering or thermal evaporation, the metal film 62 having varying thicknesses $T_1$, $T_2$, and $T_3$ is positioned over the resin layer 14', 18', as shown in each of the series of FIG. 17A through FIG. 17G.

FIG. 17A also depicts the multi-depth depression 20', with a deep portion 48 and a shallow portion 50 adjacent to the deep portion 48. Whether the resin layer 14' or 18' is used, the surface at the deep portion 48 is the surface 64, and the surface at the shallow portion 50 is the surface 66. In this example method, the resin layer 14', 18' is to be transmissive to the ultraviolet light dosage and thus the material and/or thickness of the resin layer 14, 18' may be appropriately selected.

FIG. 17B depicts the deposition of a photoresist 51. The photoresist 51 in this specific example of the method is a negative photoresist 60, and may be any of the negative photoresists 60 disclosed herein. As described, the first and third thicknesses $T_1$, $T_3$ are selected to block the UV light dosage from transmitting through the metal film 62, and the second thickness $T_2$ is selected to transmit the UV light dosage through the metal film 62. As such, the portion of the photoresist 51, 60 overlying the metal film 62 with the second thickness $T_2$ becomes insoluble due to the exposure to the UV light, and the portions of the photoresist 51, 60 overlying the metal film 62 with the first and third thicknesses $T_1$, $T_3$ become soluble due to the lack of exposure to the UV light. In other words, when exposed to the ultraviolet light dosage, the insoluble photoresist 60' forms over the deep portion 48 and the soluble photoresist 60" forms over the shallow portion 50 and the interstitial regions 22 (see FIG. 17B and FIG. 17C).

FIG. 17C depicts the removal of the soluble negative photoresist 60". The soluble photoresist 60" is removed using any suitable developer described herein for negative photoresists 60. The removal of the soluble negative photoresist 60" exposes the metal film 62 in the shallow portion 50 and at the interstitial regions 22 (see FIG. 17C).

FIG. 17D depicts the removal of a portion of the metal film 62 in the shallow portion 50 and at the interstitial regions 22. A portion of the metal film 62 may be removed with a wet etching process, as described herein, e.g. at FIG. 8G and FIG. 9G. As shown in FIG. 17D, the metal film 62 removal exposes the surface 66 at the shallow portion 50. The insoluble negative photoresist 60' is not susceptible to the wet etching process, and thus the insoluble negative photoresist 60' and the portion of the metal film 62' underneath it in the deep portion 48 remain intact after the wet etching process.

FIG. 17E depicts the removal of the insoluble negative photoresist 60', which exposes the metal film 62' in the deep portion 48. The insoluble negative photoresist 60' may be removed via a lift-off process. The lift-off process may be any suitable lift-off process described herein. The lift-off process involves exposing the insoluble negative photoresist 60' to a suitable remover for the type of negative photoresist 60 used. As shown in FIG. 17E, the removal process removes at least 99% of the insoluble negative photoresist 60'. This removal process leaves the portion of the metal film 62' in the deep portion 48.

FIG. 17F depicts the deposition of a first functionalized layer 24 over the metal film 62' and the exposed resin layer 14', 18' at the shallow portion 50 and the interstitial regions 22. The first functionalized layer 24 is deposited over the metal film 62' and the resin layer 14', or alternatively, the metal film 62' and the resin layer 18'. The functionalized layer 24 may be any of the gel materials described herein and may be applied using any suitable deposition technique. A curing process may be performed after deposition. The functionalized layer 24 covalently attaches to the exposed surfaces of the resin layer 14' or to the exposed surfaces of the resin layer 18'. Whether the resin layer 14' or 18' is used, the applied functionalized layer 24 is positioned over exposed surfaces of the resin layer 14' or 18', including the surface 66 of the shallow portion 50, and the interstitial regions 22.

FIG. 17F also depicts the application of another photoresist, which is a positive photoresist 56. Any of the positive photoresists 56 described herein may be used. The positive photoresist 56 is then exposed to an ultraviolet light dosage to form an insoluble positive photoresist 56' and a soluble positive photoresist 56". When the ultraviolet light dosage is applied, the portion of the metal film 62' in the deep portion 48 is thin enough to enable the ultraviolet light dosage to transmit therethrough, forming a soluble positive photoresist 56" over the deep portion 48. It is to be understood that the ultraviolet light dosage used in this step of the method is lower than the ultraviolet light dosage used in reference to FIG. 17B, and thus the thickness of the resin layer 14', 18' (underlying the interstitial regions 22 and the surface 66) is sufficient to block the ultraviolet light dosage. As such, the positive photoresist 56 overlying the interstitial regions 22 and the surface 66 are not exposed to the ultraviolet light and become insoluble. The insoluble positive photoresist 56' forms over shallow portion 50 and the interstitial regions 22 (see FIG. 17G).

FIG. 17G also depicts the removal of the soluble positive photoresist 56". The soluble positive photoresist 56" is removed using any suitable developer described herein for positive photoresists 56.

FIG. 17H depicts several of the processes, including the sequential removal of the first functionalized layer 24 and the metal film 62' to expose the resin layer 14', 18' in the deep portion 48. FIG. 17H depicts when the first functionalized layer 24 is removed from the metal film 62' positioned over the surface 64 of the deep portion 48. As depicted, the first functionalized layer 24 is also removed from a portion of the perimeter sidewall 29, P that defines the deep portion 48. The first functionalized layer 24 may be removed via an ashing process. The ashing process may be performed as described herein, and removes the first functionalized layer 24 to expose the metal film 62'. The insoluble positive photoresist 56' is not susceptible to the ashing process, and thus the insoluble positive photoresist 56' and the underlying first functionalized layer 24 remain in the shallow portion 50 and over the interstitial regions 22 after the ashing process.

FIG. 17H also depicts when the metal film 62' is removed from the deep portion 48. The metal film 62' may be removed by a wet etching or lift-off process, which depends upon the material of the metal film 62'. As examples, an aluminum metal film 62' can be removed in acidic or basic conditions, a copper metal film 62' can be removed using $FeCl_3$, a copper, gold or silver sacrificial layer can be removed in an iodine and iodide solution, and a silicon metal film 62' can be removed in basic (pH) conditions. The removal of the metal film 62' exposes the surface 64 of the resin layer 14', 18' at the deep portion 48. The removal of the metal film 62' also exposes the remainder of the perimeter sidewall 29, P that defines the deep portion 48 as well as the interior wall 29, I.

FIG. 17I depicts the deposition of the second functionalized layer 26, which is applied over the exposed surface 64 in the deep portion 48 and the insoluble positive photoresist 56'. The second functionalized layer 26 (e.g., the gel material that forms the second functionalized layer 26) may be applied using any suitable deposition technique. The second functionalized layer 26 does not contaminate the first functionalized layer 24, which is covered by the insoluble positive photoresist 56'.

Referring now to FIG. 17J, the insoluble positive photoresist 56' is removed through a lift-off process. The lift-off process may be any suitable lift-off process described herein. The lift-off process involves exposing the insoluble positive photoresist 56' to a suitable remover for the type of positive photoresist 56 used. As shown in FIG. 17J, the removal process removes i) at least 99% of the insoluble positive photoresist 56' and ii) the second functionalized layer 26 thereon. This removal process leaves the second functionalized layer 26 that is positioned on the surface 64 and on the sidewalls 29, P and 29, I in the deep portion 48. The removal process also leaves the first functionalized layer 24 intact over surface 66 of the shallow region 50 and at the interstitial regions 22. These portions of the functionalized layers 24, 26 remain intact, in part because they are covalently attached to the resin layer 14' or 18'.

In FIG. 17K, the functionalized layer 24 that is positioned over the interstitial regions 22 is removed, e.g., using a polishing process as described, for example, in reference to FIG. 9H.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

As depicted in FIG. 17K, the functionalized layer 24 is positioned on one half of the multi-depth depression 20' (e.g., at the shallow portion 50 and the adjacent portion of the perimeter sidewall 29, P), and the functionalized layer 26 is positioned on the other half of the multi-depth depression 20' (e.g., at the deep portion 48 and the adjacent portion of the perimeter sidewall 29, P). As such, the padlock like conformation 33 is eliminated While not shown, the method of FIG. 17A through FIG. 17K also includes attaching respective primer sets 30, 32 to the functionalized layers 24, 26. In some examples, the primers 34, 36 or 34', 36' (not shown in FIG. 17A through FIG. 17K) may be pre-grafted to the functionalized layer 24. Similarly, the primers 38, 40 or 38', 40' (not shown in FIG.

17A through FIG. 17K) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 17F). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 17I); or after insoluble positive photoresist 56' removal (e.g., at FIG. 17J or FIG. 17K) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 17K, it is to be understood that the method described in reference to FIG. 17A through FIG. 17K may be performed to generate an array of depressions 20' (each having functionalized layers 24, 26 therein) across the resin layer 14', 18'.

Method to Form Trenches

As mentioned herein, some of the architecture within the flow channels 12 includes multi-depth trenches 21. FIG. 19A through FIG. 19K depict top views of a portion of a channel 12 having a multi-depth trench 21 defined therein between two interstitial regions 22 as the trench 21 is processed to generated isolated areas 86, 86' of the functionalized layers 24, 26. Cross-sectional views of the portion of the channel 12 are shown in FIG. 18A through FIG. 18I to illustrate some of the processes. FIG. 18A through FIG. 18I and FIG. 19A through FIG. 19K together depict an example method for patterning isolated areas of the trenches 21 with the functionalized layers 24, 26 in a manner that reduces the padlock like configuration 33.

Figures 18E, 18F, 18G, 18H, 18I, 19A, 19B, 19C, 19D:
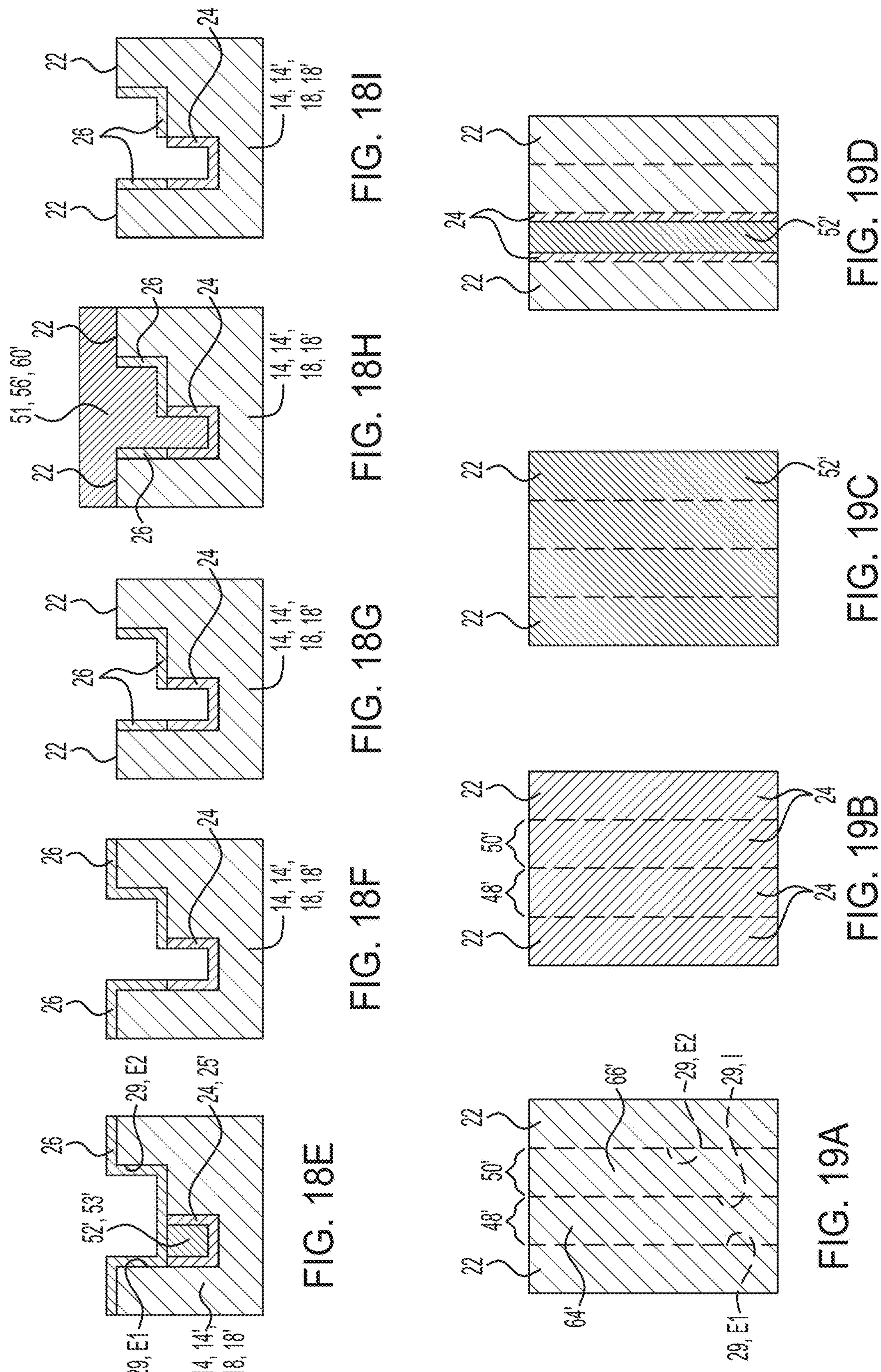
FIG. 19A through FIG. 19K are top views that also depict the method shown in FIG. 18A through FIG. 18I.
Figures 19E, 19F, 19G, 19H, 19I, 19J, 19K:
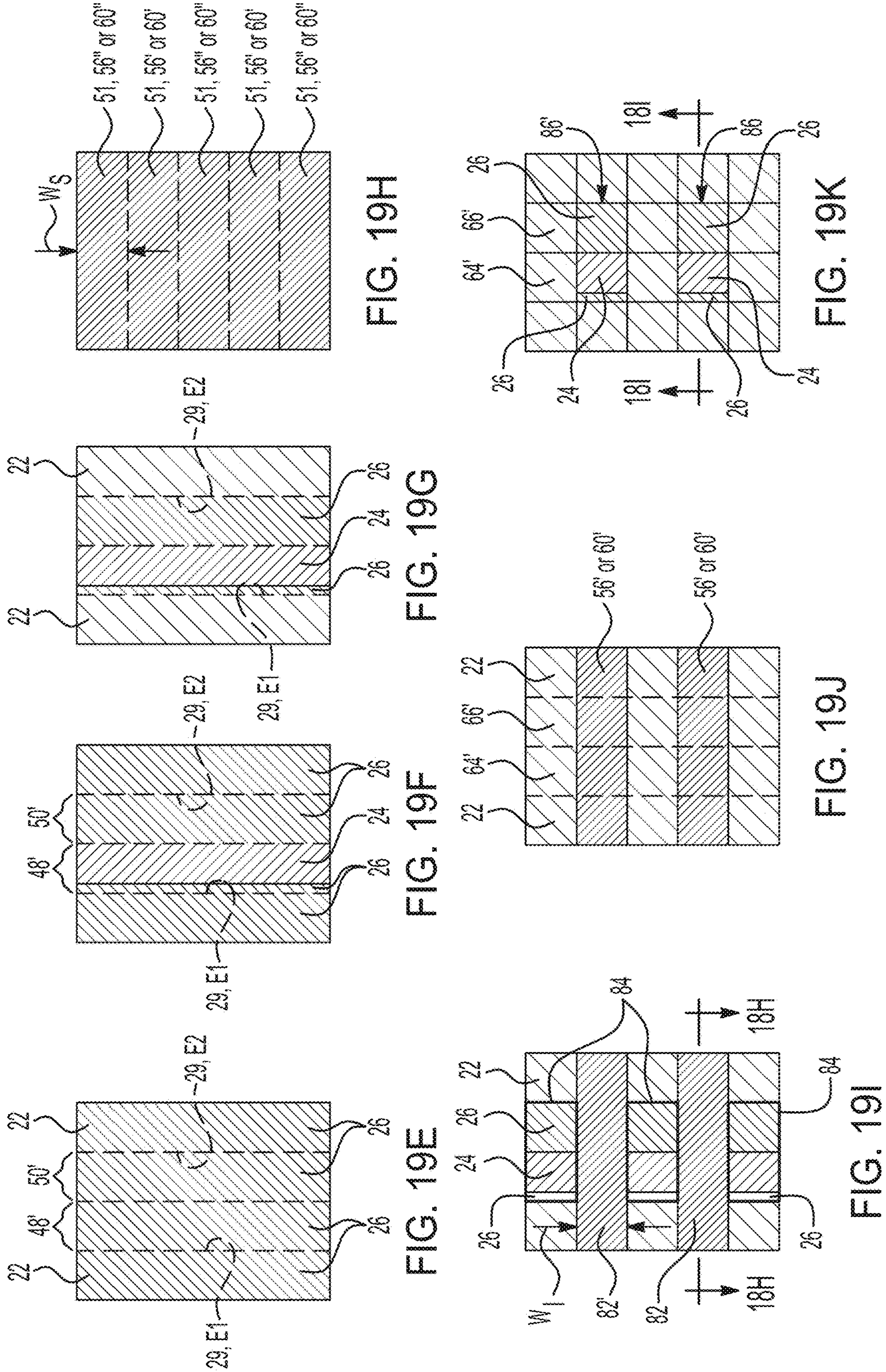

The method generally includes: depositing a first functionalized layer 24 over a resin layer 14, 14', 18, 18' including a plurality of multi-depth trenches 21 separated by interstitial regions 22, each multi-depth trench 21 including a deep portion 48' and a shallow portion 50' adjacent to the deep portion 48' (FIG. 18A and FIG. 19A); patterning the first functionalized layer 24, whereby a portion 25' of the first functionalized layer 24 in the deep portion 48' is covered by a region 53' of a sacrificial layer 52' and portions of the first functionalized layer 24 in the shallow portion 50' and over the interstitial regions 22 are removed (FIG. 18D and FIG. 19D); depositing a second functionalized layer 26 over the region 53' of the sacrificial layer 52' and the interstitial regions 22 and in the shallow portion 50' (FIG. 18E and FIG. 19E; lifting off the region 53' of the sacrificial layer 52', thereby exposing the portion 25' of the first functionalized layer 24 in the deep portion 48' (FIG. 18F and FIG. 19F); polishing the second functionalized layer 26 from the interstitial regions 22 (FIG. 18G and FIG. 19G); applying a photoresist 51 in a pattern of spatially separated stripes 82, 82' that are at least substantially perpendicular to the multi-depth trenches 21 (FIG. 19I); removing areas 84 of the first functionalized layer 24 and the second functionalized layer 26 that are exposed between the spatially separated stripes 82, 82' (FIG. 19I and FIG. 19J); and removing the photoresist 51 (FIG. 18I and FIG. 19K).

As shown in FIG. 18A, the multi-depth trench 21 is defined in either the single layer base support 14, 14' or the resin layer 18, 18' of the multi-layered structure 16, 16' as described herein. As such, the term "resin layer" may be referred to as "resin layer 14, 14', 18, or 18" throughout the description of this method. The underlying base support 17, 17' of the multi-layered structure 16, 16' is not shown in FIG. 18A through FIG. 18I.

The multi-depth trench 21 may be etched, imprinted, or defined in the resin layer 14, 14', 18, 18' using any suitable technique. In one example, nanoimprint lithography is used. In this example, a working stamp is pressed into the resin layer 14, 14', 18, 18' while the material is soft, which creates an imprint (negative replica) of the working stamp features in the resin layer 14, 14', 18, 18'. The resin layer 14, 14', 18, 18' may then be cured with the working stamp in place. Curing may be accomplished as described herein in reference to FIG. 4A. After curing, the working stamp is released. This creates topographic features in the resin layer 14, 14', 18, 18'. In this example, as shown in FIG. 18A, the topographic features of the multi-depth trench 21 include the shallow portion 50' (and its bottom surface 66'), the deep portion 48' (and its bottom surface 68'), the internal wall 29, I separating the deep portion 48' and the shallow portion 50', and the opposed sidewalls 29, E1, E2. The top view of the generated multi-depth trench 21 is shown in FIG. 19A.

While one multi-depth trench 21 is shown in FIG. 18A and FIG. 19A, it is to be understood that the method may be performed to generate an array of multi-depth trenches 21 including respective deep portions 48' and shallow portions 50', separated by interstitial regions 22, across the surface of the resin layer 14, 14', 18, 18'.

If the resin layer 14, 14', 18, 18' does not include surface groups to covalently attach to the functionalized layers 24, 26, the resin layer 14, 14', 18, 18' may first be activated, e.g., through silanization or plasma ashing. If the resin layer 14, 14', 18, 18' does include surface groups to covalently attach to the functionalized layers 24, 26, the activation process is not performed FIG. 18B and FIG. 19B depict the first functionalized layer 24 deposited over the resin layer 14, 14', 18, 18'. The functionalized layer 24 is deposited over the surface 64', 66' in the deep and shallow portions 48', 50', and over the interstitial regions 22. As depicted in FIG. 18B, the functionalized layer 24 also deposits on the opposed sidewalls 29, E1, E2 and the interior side wall 29, I. The functionalized layer 24 may be any of the gel materials described herein and may be applied using any suitable deposition technique. A curing process may be performed after deposition. The functionalized layer 24 covalently attaches to the exposed surfaces of the resin layer 14, 14', 18, 18'.

The functionalized layer 24 is then patterned. Patterning the first functionalized layer 24 involves applying a sacrificial layer 52' over the first functionalized layer 24 (FIG. 18C and FIG. 19C); and dry etching the sacrificial layer 52' and the portions of the first functionalized layer 24 in the shallow portion 50' and over the interstitial regions 22 (FIG. 18D and FIG. 19D).

Referring specifically to FIG. 18C and FIG. 19C, the sacrificial layer 52' is deposited over the first functionalized layer 24. In this example, the sacrificial layer 52' may be any example of the negative or positive photoresists disclosed herein or poly(methyl methacrylate), and may be applied and cured as described herein.

Referring now to FIG. 18D and FIG. 19D, the sacrificial layer 52' and the first functionalized layer 24 are dry etched to expose the surface 66' in the shallow portion 50 and the interstitial regions 22. This dry etching process is performed for a measured amount of time to expose the desired surfaces/regions 66', 22. As shown in FIG. 18D and FIG. 19D, the timed dry etching is stopped so that the region 53' of the sacrificial layer 52' and underlying portion 25' of the functionalized layer 24 remain in the portion of the deep portion 48' that is next to the interior wall 29, I. As such, the remaining sacrificial layer 52' is at least substantially co-planar with the surface 66' at the shallow portion 50'. In one example, the timed dry etch may involve a reactive ion etch (e.g., with 100% $O_2$ or 10% $CF_4$ and 90% $O_2$) where the sacrificial layer 52' and functionalized layer 24 are etched at a rate of about 17 nm/min. In another example, the timed dry etch may involve a 100% $O_2$ plasma etch where the sacrificial layer 52' and functionalized layer 24 are etched at a rate of about 98 nm/min.

As shown in FIG. 18E and FIG. 19E, the second functionalized layer 26 is deposited over the region 53' of the sacrificial layer 52', exposed portions of the first functionalized layer 24, and the interstitial regions 22, and in the shallow portion 50'. In this example, "in the shallow portion," means that the second functionalized layer 26 is deposited over portions of the resin layer 14, 14', 18, 18' that are exposed in the shallow portion 50', e.g., the surface 66' and the opposed sidewall 29, E2. It is to be understood that the second functionalized layer 26 may also be deposited over other exposed portions of the resin layer 14, 14', 18, 18', such as some of the opposed sidewall 29, E1 and/or some of the internal wall 29, I.

The second functionalized layer 26 may be any of the gel materials described herein and may be applied using any suitable deposition technique. A curing process, as described herein, may be performed after deposition. The second functionalized layer 26 covalently attaches to the resin layer 14, 14', 18, 18'.

Referring specifically to FIG. 18F and FIG. 19F, the sacrificial layer 52' is removed in a lift-off process. The lift-off process may involve an organic solvent suitable for the sacrificial material that is used. Any of the removers set forth herein for the insoluble positive photoresist or the insoluble negative photoresist may be used when these materials are used as the sacrificial layer 52. The lift-off process removes i) at least 99% of the region 53' of the sacrificial layer 52' and ii) the functionalized layer 26 positioned thereon. The lift-off process does not remove the portion 25' of the functionalized layer 24 that had been in contact with the region 53' of the sacrificial layer 52'. Thus, the lift-off process exposes the functionalized layer 24 at the surface 64' of the resin layer 14, 14', 18, 18' at the deep portion 48', as depicted in FIG. 18F and FIG. 19F.

In FIG. 18G and FIG. 19G, the functionalized layer 26 that is positioned over the interstitial regions 22 is removed, e.g., using a polishing process. The polishing process may be performed as described herein, e.g., in reference to FIG. 9H.

A photoresist 51 is then applied to generate a pattern of spatially separated stripes 82, 82' that are at least substantially perpendicular to the multi-depth trenches 21. The photoresist 51 may be a positive photoresist 56 or a negative photoresist 60.

In one example, applying the photoresist 51 in the pattern of the spatially separated stripes 82, 82' involves: depositing a positive photoresist 56 over the multi-depth trenches 21 and the interstitial regions 22 (FIG. 19H); selectively exposing portions of the positive photoresist 56 to an ultraviolet light dosage, whereby the exposed portions become soluble (i.e., positive soluble photoresist 56") and unexposed portions become the spatially separated stripes 82, 82' (positive insoluble photoresist 56'); and removing the exposed, soluble portions 56". In this example, a photomask is used to pattern the positive photoresist 56. The photomask blocks UV light from reaching the portions of the positive photoresist 56 that are to become insoluble (i.e., that are to become the stripes 82, 82'), and allows UV light to reach the portions of the positive photoresist 56 that are to become soluble. A suitable positive photoresist developer is used to remove the positive soluble photoresist 56".

In another example, applying the photoresist 51 in the pattern of the spatially separated stripes 82, 82' involves: depositing a negative photoresist 60 over the multi-depth trenches 21 and the interstitial regions 22 (FIG. 19H); selectively exposing portions of the negative photoresist 60 to an ultraviolet light dosage, whereby the exposed portions become the spatially separated stripes 82, 82' (negative insoluble photoresist 60') and unexposed portions become soluble (i.e., positive soluble photoresist 60"); and removing the unexposed, soluble portions 60". In this example, a photomask is used to pattern the negative photoresist 60. The photomask blocks UV light from reaching the portions of the negative photoresist 60 that are to become soluble, and allows UV light to reach the portions of the negative photoresist 60 that are to become insoluble (i.e., that are to become the stripes 82, 82'). A suitable negative photoresist developer is used to remove the soluble negative photoresist 60".

FIG. 19H depicts an example of how the photoresist 51 can be patterned with UV light to form the positive/negative insoluble photoresist 56', 60' and the positive/negative soluble photoresists 56", 60". The width $W_s$ of each portion of the positive/negative soluble photoresists 56", 60" is at least 100 nm. As the soluble portions are removed, this width $W_s$ will provide a desirable distance between the isolated functionalized layers 86, 86' that are ultimately formed.

FIG. 19I depicts the positive/negative insoluble photoresists 56', 60' after the positive/negative soluble photoresists 56", 60" are removed. Each of the remaining positive/negative insoluble photoresists 56', 60' corresponds with one of the spatially separated stripes 82, 82'. The spatially separated stripes 82, 82' cover portions of the functionalized layers 24, 26 that form the isolated areas 86, 86' (see FIG. 18H and FIG. 19I together). The width $W_l$ of each spatially separated stripe 82, 82' may be any of the widths set forth herein for the width $W_s$ or the width of the protrusions 28. This width $W_l$ will provide desirable dimensions for the isolated areas 86, 86' of the functionalized layers 24, 26 that are ultimately formed. As depicted in FIG. 19I, each spatially separated stripe 82, 82' is at least substantially perpendicular to the length of the trench 21.

Additionally, the pattern of the spatially separated stripes 82, 82' leaves areas 84 of the first functionalized layer 24 and the second functionalized layer 26 that are exposed between the spatially separated stripes 82, 82'. The areas 84 of the first functionalized layer 24 and the second functionalized layer 26 that are exposed between the spatially separated stripes 82, 82' are then removed, e.g., via ashing. Any of the plasma ashing processes set forth herein may be used. The removal of the areas 84 exposes the underlying surfaces 64', 66', as shown in FIG. 19J. The exposed surfaces 64' 66' create interstitial-like regions between the isolated areas 86, 86' of the functionalized layers 24, 26 that are ultimately formed (see FIG. 19K).

The spatially separated stripes 82, 82' are then removed, e.g., using a suitable remover for the insoluble photoresist 56', 60' that defines the stripes 82, 82'.

The functionalized layers 24, 26 underlying the spatially separated stripes 82, 82' remain intact after removal of the spatially separated stripes 82, 82', as shown in FIG. 19K. As such, the removal of the stripes 82, 82' exposes the underlying portions of the functionalized layers 24, 26, which are isolated areas 86, 86' along the trench 21. FIG. 18I depicts a cross-section of one of the areas 86 of FIG. 19K. Even though the functionalized layer 24 is sandwiched by the portions of the functionalized layer 26, the padlock like configuration 33 shown in FIG. 1A is reduced by about 70%, in part because the functionalized layer 24 is not completely surrounded by the functionalized layer 26.

While not shown, the method of FIG. 18A through FIG. 18I and FIG. 19A through FIG. 19K also includes attaching respective primer sets 30, 32 to the functionalized layers 24, 26. In some examples, the primers 34, 36 or 34', 36' (not shown in FIG. 18A through FIG. 18I and FIG. 19A through FIG. 19K) may be pre-grafted to the functionalized layer 24. Similarly, the primers 38, 40 or 38', 40' (not shown in FIG. 18A through FIG. 18I and FIG. 19A through FIG. 19K) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 18B and FIG. 19B). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied and prior to subsequent processing (e.g., at FIG. 18E and FIG. 19E), or after the second functionalized layer 26 is applied and processed (e.g., at FIG. 18F and FIG. 19F, or FIG. 18G and FIG. 19G, or at FIG. 18I and FIG. 19K) as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein. While two areas 86, 86' of the functionalized layers 24, 26 are shown in FIG. 19K, it is to be understood that the method described in reference to FIG. 18A through FIG. 18I and FIG. 19A through FIG. 19K may be performed to generate an array of depressions 21 (each having a desired number of areas 86, 86' therein) across the resin layer 14, 14', 18, 18'.

To further illustrate the present disclosure, examples are given herein. It is to be understood that these examples are provided for illustrative purposes and are not to be construed as limiting the scope of the present disclosure.

NON-LIMITING WORKING EXAMPLES

Example 1

Figure 20:
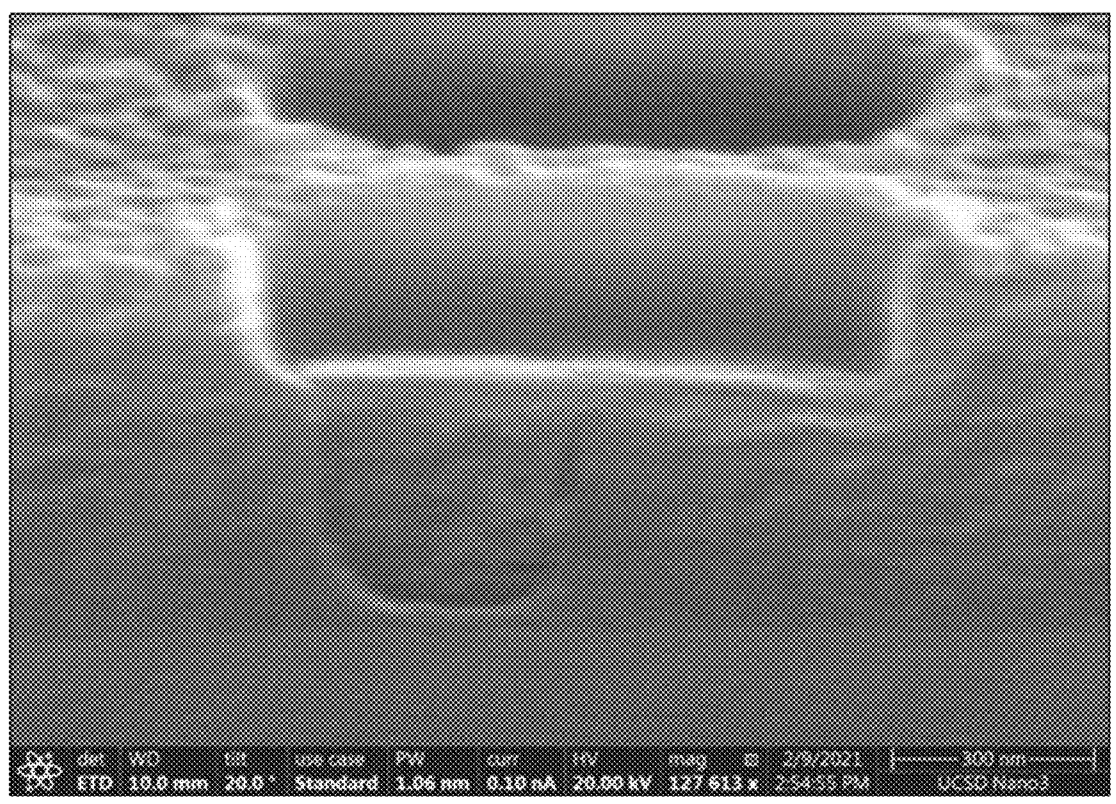
FIG. 20 is a scanning electron micrograph (SEM) image of a cross-section of a multi-depth depression having a photoresist therein.

An example method similar to that shown in FIG. 4A through FIG. 4D and FIG. 6A through FIG. 6F was performed, except that functionalized layers were not included. The method involved generating multi-depth depressions in a nanoimprint lithography resin using a working stamp and curing process. A negative photoresist (AZ1505 positive photoresist from MicroChemicals) was deposited in the multi-depth depressions and cured. A timed dry reactive ion etching process with 90% $CF_4$ and 10% $O_2$ was used to etch back the negative photoresist so that some remained in the deep portion of each multi-depth depression and a small portion remained over the surface in the shallow portion. A SEM image (magnification of about 127,000×) of one of the multi-depth depressions with the photoresist in the deep portion is shown in FIG. 20.

Figure 21:
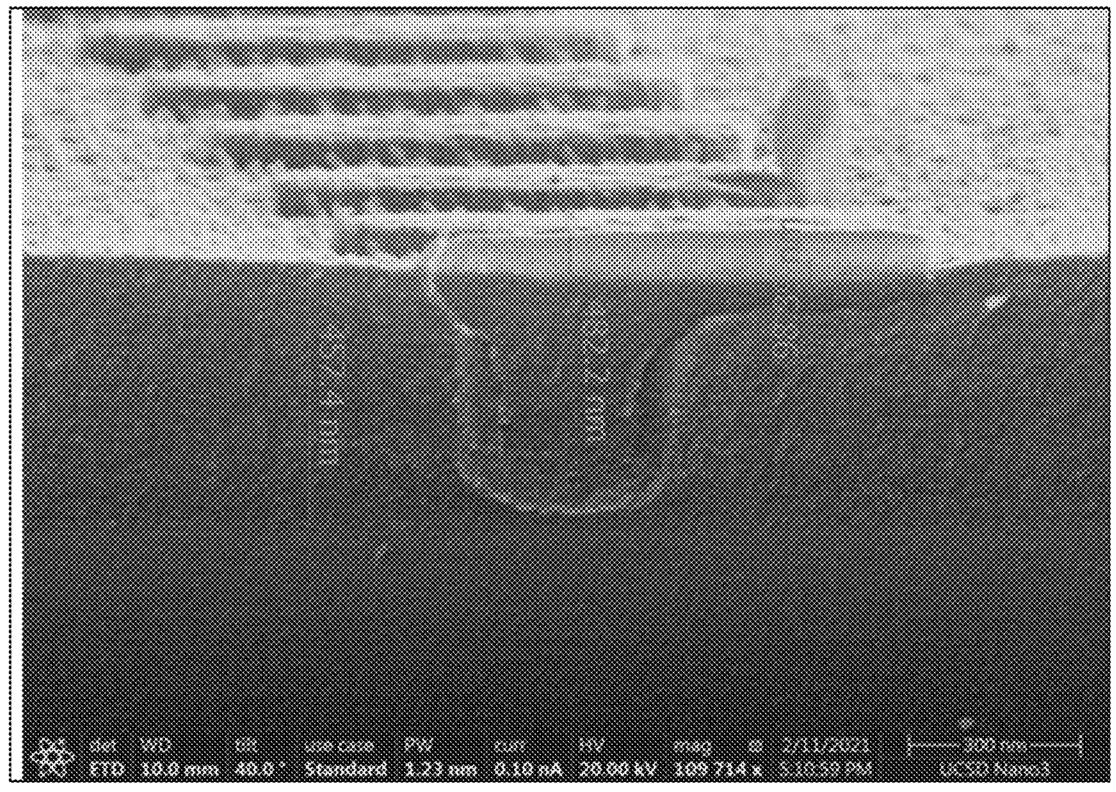
FIG. 21 is a SEM image of the multi-depth depression of FIG. 20 after the resin is etched around the photoresist.

The nanoimprint lithography resin was then time dry reactive ion etched with 10% $CF_4$ and 90% $O_2$ to remove the interstitial regions. This dry etching process was performed until the photoresist in the multi-depth depression protruded above the etched portions of the nanoimprint lithography resin. Another SEM image (magnification of about 109,000×) of the multi-depth depression was then taken after the interstitial regions had been dry etched. This is shown in FIG. 21. As depicted, the negative photoresist remained in what had been, prior to dry etching, the multi-depth depression.

These results illustrate that a series of timed dry etching processes may be used reduce the perimeter sidewall of the multi-depth depressions.

Example 2

An example method similar to that shown in FIG. 17A through FIG. 17K was performed. The method involved generating multi-depth depressions in a nanoimprint lithography resin using a working stamp and curing process. Aluminum was then sputter coated (60° angle) on the multi-depth depressions at room temperature. The aluminum formed a metal film over the multi-depth depressions and the interstitial regions. The aluminum metal film had various thicknesses, i.e. a thicker film was formed over the interstitial regions and the shallow portion of the multi-depth depression, and a thinner film was formed over the deep portion of the multi-depth depression.

Figure 22A:
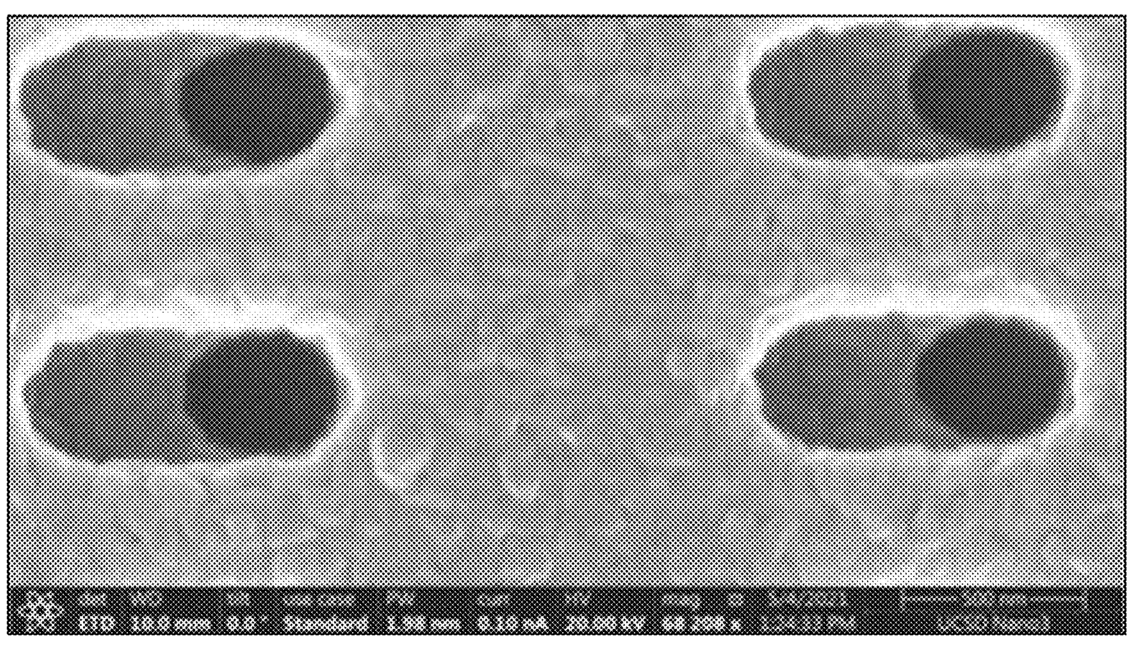
FIG. 22A is a SEM image of a top view of multi-depth depressions having a photoresist therein.
Figure 22B:
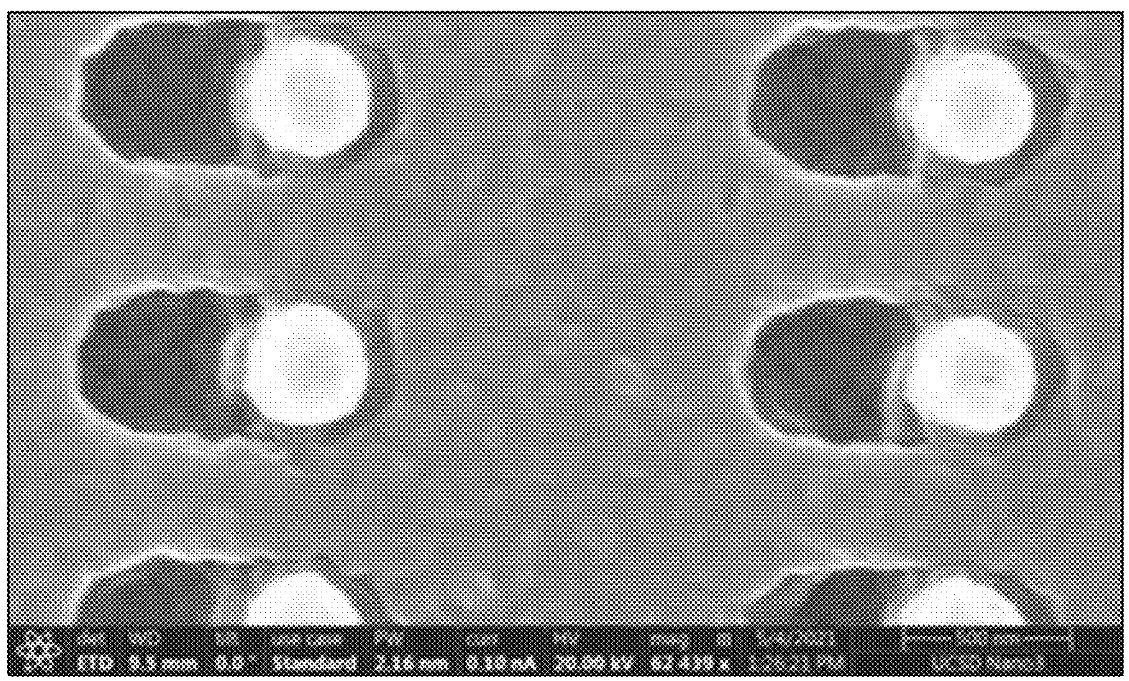
FIG. 22B is a SEM image of the multi-depth depressions of FIG. 22A after the photoresist is developed and soluble portions are removed.

Then, a negative photoresist (NR9-1500PY from Futurrex) was deposited over the metal film. Ultraviolet light (365 nm) was directed through the backside of the nanoimprint lithography resin, and then soluble portions of the negative photoresist were removed in a developer (RD6 (a tetramethylammonium hydroxide (TMAH) based developer) from Futurrex). SEM images (about 70,000× magnification) of the top view of the patterned nanoimprint lithography resin were taken before (FIG. 22A) and after (FIG. 22B) photoresist development. FIG. 22A illustrates the photoresist across the entire surface. FIG. 22B clearly illustrates that the soluble portions of the photoresist were removed from the interstitial regions and from the shallow portion of each multi-depth depression after being developed, while the insoluble portions of the photoresist remained in the deep portion of each multi-depth depression after being developed. These results illustrate that the thicker portions of the metal mask blocked the UV light (rendering the negative photoresist soluble) and that the thinner portions of the metal mask enabled UV light transmission (render the negative photoresist insoluble).

Additional Notes

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Reference throughout the specification to “one example”, “another example”, “an example”, and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

While several examples have been described in detail, it is to be understood that the disclosed examples may be modified. Therefore, the foregoing description is to be considered non-limiting.

What is claimed is:

1. A method, comprising:

forming a metal film on a portion of a sidewall of each of a plurality of multi-depth depressions defined in a resin layer and separated by interstitial regions, wherein each multi-depth depression includes a deep portion and a shallow portion adjacent to the deep portion and wherein at least some of a bottom surface of each multi-depth depression is free of the metal film;

depositing a first functionalized layer over each of the multi-depth depressions and the interstitial regions;

patterning the first functionalized layer, whereby a portion of the first functionalized layer in the deep portion is covered by a region of a sacrificial layer and portions of the first functionalized layer in the shallow portion, over the metal film, and over the interstitial regions are removed;

depositing a second functionalized layer over the interstitial regions, over the metal film, over the region of the sacrificial layer, and in the shallow portion;

lifting off the region of the sacrificial layer, thereby exposing the portion of the first functionalized layer;

wet etching the metal film, thereby removing the second functionalized layer positioned over the metal film; and polishing the interstitial regions, whereby the portion of the first functionalized layer in the deep portion and the second functionalized layer in the shallow portion remain intact.

2. The method as defined in claim 1, wherein forming the metal film on the portion of the sidewall of each multi-depth depression involves:

depositing an other sacrificial layer on the resin layer;

curing the other sacrificial layer;

etching back the other sacrificial layer to expose the portion of the sidewall of each multi-depth depression;

using a directional coating method, applying a metal material on the interstitial regions, on the portion of the sidewall of each multi-depth depression, and on the other sacrificial layer;

using anisotropic etching to remove the metal material from the interstitial regions and from the other sacrificial layer, whereby a portion of the metal material remains on the portion of the sidewall in each multi-depth depression; and removing the other sacrificial layer using an organic solvent.

3. The method as defined in claim 1, wherein forming the metal film on the portion of the sidewall of each multi-depth depression involves:

conformally coating a metal material on the resin layer using sputtering; and using anisotropic etching to remove the metal material from the interstitial regions and from the bottom surface of each multi-depth depression, whereby a portion of the metal material remains on the portion of the sidewall in each multi-depth depression.

4. The method as defined in claim 1, wherein patterning the first functionalized layer involves:

depositing a gel material;

curing the gel material to form the first functionalized layer;

applying the sacrificial layer over the first functionalized layer; and dry etching the sacrificial layer and the portions of the first functionalized layer in the shallow portion and over the interstitial regions.

5. The method as defined in claim 4 wherein the dry etching is a timed dry etch involving a reactive ion etch with 10% $CF_4$ and 90% $O_2$ or a 100% $O_2$ plasma etch.

6. The method as defined in claim 1, wherein:

the metal film is an aluminum metal film; and wet etching utilizes nitric acid or potassium hydroxide.

7. The method as defined in claim 1, wherein:

the metal film is a copper metal film; and wet etching utilizes $FeCl_3$.

8. The method as defined in claim 1, wherein:

the metal film is selected from the group consisting of a copper metal film, a gold metal film, and a silver metal film; and wet etching utilizes iodine or an iodide solution.

9. The method as defined in claim 1, wherein:

the metal film is a silicon metal film; and wet etching utilizes potassium hydroxide.

* * * * *

SEQUENCE LISTING

```
<160> NUMBER OF SEQ ID NOS: 16

<210> SEQ ID NO 1
<211> LENGTH: 28
<212> TYPE: DNA
<213> ORGANISM: Artificial Sequence
<220> FEATURE:
<223> OTHER INFORMATION: Synthesized

<400> SEQUENCE: 1

aatgatacgg cgaccaccga gactacac                                        28


<210> SEQ ID NO 2
<211> LENGTH: 23
<212> TYPE: DNA
<213> ORGANISM: Artificial Sequence
<220> FEATURE:
<223> OTHER INFORMATION: Synthesized

<400> SEQUENCE: 2

caagcagaag acggcatacg aat                                             23


<210> SEQ ID NO 3
<211> LENGTH: 23
<212> TYPE: DNA
<213> ORGANISM: Artificial Sequence
<220> FEATURE:
<223> OTHER INFORMATION: Synthesized

<400> SEQUENCE: 3

caagcagaag acggcataca gat                                             23


<210> SEQ ID NO 4
<211> LENGTH: 35
<212> TYPE: DNA
<213> ORGANISM: Artificial Sequence
<220> FEATURE:
<223> OTHER INFORMATION: Synthesized

<400> SEQUENCE: 4

gctggcacgt ccgaacgctt cgttaatccg ttgag                                35


<210> SEQ ID NO 5
<211> LENGTH: 35
<212> TYPE: DNA
<213> ORGANISM: Artificial Sequence
<220> FEATURE:
<223> OTHER INFORMATION: Synthesized

<400> SEQUENCE: 5

ctcaacggat taacgaagcg ttcggacgtg ccagc                                35


<210> SEQ ID NO 6
<211> LENGTH: 35
<212> TYPE: DNA
```

-continued

<213> ORGANISM: Artificial Sequence
<220> FEATURE:
<223> OTHER INFORMATION: Synthesized

<400> SEQUENCE: 6
cgtcgtctgc catggcgctt cggtggatat gaact 35

<210> SEQ ID NO 7
<211> LENGTH: 35
<212> TYPE: DNA
<213> ORGANISM: Artificial Sequence
<220> FEATURE:
<223> OTHER INFORMATION: Synthesized

<400> SEQUENCE: 7
agttcatatc caccgaagcg ccatggcaga cgacg 35

<210> SEQ ID NO 8
<211> LENGTH: 35
<212> TYPE: DNA
<213> ORGANISM: Artificial Sequence
<220> FEATURE:
<223> OTHER INFORMATION: Synthesized

<400> SEQUENCE: 8
acggccgcta atatcaacgc gtcgaatccg caact 35

<210> SEQ ID NO 9
<211> LENGTH: 35
<212> TYPE: DNA
<213> ORGANISM: Artificial Sequence
<220> FEATURE:
<223> OTHER INFORMATION: Synthesized

<400> SEQUENCE: 9
agttgcggat tcgacgcgtt gatattagcg gccgt 35

<210> SEQ ID NO 10
<211> LENGTH: 34
<212> TYPE: DNA
<213> ORGANISM: Artificial Sequence
<220> FEATURE:
<223> OTHER INFORMATION: Synthesized

<400> SEQUENCE: 10
gccgcgttac gttagccgga ctattcgatg cagc 34

<210> SEQ ID NO 11
<211> LENGTH: 34
<212> TYPE: DNA
<213> ORGANISM: Artificial Sequence
<220> FEATURE:
<223> OTHER INFORMATION: Synthesized

<400> SEQUENCE: 11
gctgcatcga atagtccggc taacgtaacg cggc 34

<210> SEQ ID NO 12
<211> LENGTH: 29
<212> TYPE: DNA
<213> ORGANISM: Artificial Sequence
<220> FEATURE:
<223> OTHER INFORMATION: Synthesized
<220> FEATURE:
<221> NAME/KEY: misc_feature
<222> LOCATION: (23)..(23)
<223> OTHER INFORMATION: uracil or allyl T -continued

<400> SEQUENCE: 12
aatgatacgg cgaccaccga ganctacac 29

<210> SEQ ID NO 13
<211> LENGTH: 24
<212> TYPE: DNA
<213> ORGANISM: Artificial Sequence
<220> FEATURE:
<223> OTHER INFORMATION: Synthesized
<220> FEATURE:
<221> NAME/KEY: misc_feature
<222> LOCATION: (22)..(22)
<223> OTHER INFORMATION: 8-oxoguanine

<400> SEQUENCE: 13
caagcagaag acggcatacg anat 24

<210> SEQ ID NO 14
<211> LENGTH: 24
<212> TYPE: DNA
<213> ORGANISM: Artificial Sequence
<220> FEATURE:
<223> OTHER INFORMATION: Synthesized
<220> FEATURE:
<221> NAME/KEY: misc_feature
<222> LOCATION: (20)..(20)
<223> OTHER INFORMATION: 8-oxoguanine

<400> SEQUENCE: 14
caagcagaag acggcatacn agat 24

<210> SEQ ID NO 15
<211> LENGTH: 24
<212> TYPE: DNA
<213> ORGANISM: Artificial Sequence
<220> FEATURE:
<223> OTHER INFORMATION: Synthesized

<400> SEQUENCE: 15
aggaggagga ggaggaggag gagg 24

<210> SEQ ID NO 16
<211> LENGTH: 24
<212> TYPE: DNA
<213> ORGANISM: Artificial Sequence
<220> FEATURE:
<223> OTHER INFORMATION: Synthesized

<400> SEQUENCE: 16
cctcctcctc ctcctcctcc tcct 24